(12) United States Patent  (10) Patent No.: US 9,105,622 B2
Wang et al.  (45) Date of Patent: Aug. 11, 2015

(54) BARREL-PLATING QUAD FLAT NO-LEAD (QFN) PACKAGING STRUCTURES AND METHOD FOR MANUFACTURING THE SAME

(71) Applicant: Jiangsu Changjiang Electronics Technology Co., Ltd., Wuxi (CN)

(72) Inventors: Xinchao Wang, Wuxi (CN); Zhizhong Liang, Wuxi (CN)

(73) Assignee: JIANGSU CHANGJIANG ELECTRONICS TECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 14/271,411

(22) Filed: May 6, 2014

(65) Prior Publication Data

US 2014/0332943 A1  Nov. 13, 2014

Related U.S. Application Data

(63) Continuation-in-part of application No. PCT/CN2012/000022, filed on Jan. 6, 2012.

(30) Foreign Application Priority Data

Nov. 30, 2011 (CN) .......................... 2011 1 0387783

(51) Int. Cl.
*H01L 21/00* (2006.01)
*H01L 23/495* (2006.01)
(Continued)

(52) U.S. Cl.
CPC ...... *H01L 23/49575* (2013.01); *H01L 21/4832* (2013.01); *H01L 21/561* (2013.01); *H01L 21/82* (2013.01); *H01L 23/49541* (2013.01); *H01L 23/49582* (2013.01); *H01L 23/49589* (2013.01); *H01L 24/97* (2013.01); *H01L 23/3107* (2013.01); *H01L 2224/48091* (2013.01); *H01L 2224/48137* (2013.01); *H01L 2224/48247* (2013.01); *H01L 2224/49171* (2013.01);
(Continued)

(58) Field of Classification Search
CPC .......... H01L 2224/03462; H01L 2224/73265; H01L 2224/48247; H01L 2224/97; H01L 24/11; H01L 2924/19105; H01L 21/4857
USPC ......... 438/106, 111, 112, 113, 121, 123, 124, 438/127; 257/690, 698, 666, 676, 668, 704, 257/784
See application file for complete search history.

(56) References Cited

U.S. PATENT DOCUMENTS 6,498,099 B1 * 12/2002 McLellan et al. ............. 438/689
2006/0079027 A1 * 4/2006 Yamada et al. ............... 438/121
(Continued)

*Primary Examiner* — S. V. Clark
(74) *Attorney, Agent, or Firm* — Matthias Scholl P.C.; Matthias Scholl

(57) ABSTRACT

A barrel-plating quad flat no-lead (QFN) package structure and a method for manufacturing the same. The method includes: providing a metal substrate for a plurality of QFN components; forming a first photoresist film on a top surface of the substrate; forming a plating pattern in the first photoresist film; forming a first metal layer containing a plurality of inner leads; etching the substrate from the back surface of the substrate to form a plurality of I/O pads; filling sealant in the etched areas; attaching at least one die in a predetermined region on the top surface of the substrate; connecting the die and the inner leads using metal wires; sealing the die, the inner leads, and the metal wires with a molding compound; separating the resulting joint QFN components into individual QFN components; and forming a second metal layer on the back surface of the I/O pads.

18 Claims, 68 Drawing Sheets

(51) Int. Cl.
*H01L 21/48* (2006.01)
*H01L 23/00* (2006.01)
*H01L 21/56* (2006.01)
*H01L 21/82* (2006.01)
*H01L 23/31* (2006.01)

(52) U.S. Cl.
CPC ............... *H01L2224/73265* (2013.01); *H01L 2224/92247* (2013.01); *H01L 2224/97* (2013.01); *H01L 2924/01322* (2013.01); *H01L 2924/07802* (2013.01); *H01L 2924/19105* (2013.01); *H01L 2924/30107* (2013.01)

(56) References Cited

U.S. PATENT DOCUMENTS

2011/0057298 A1* 3/2011 Ramos et al. ............... 257/667
2011/0115069 A1* 5/2011 Teh et al. .................... 257/693

\* cited by examiner

BARREL-PLATING QUAD FLAT NO-LEAD (QFN) PACKAGING STRUCTURES AND METHOD FOR MANUFACTURING THE SAME

CROSS-REFERENCES TO RELATED APPLICATIONS

This application is a continuation-in-part of International Patent Application No. PCT/CN2012/000022 with an international filing date of Jan. 6, 2012, designating the United States, now pending, and further claims priority benefits to Chinese Patent Application No. 201110387783.X filed Nov. 30, 2011. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The present invention relates to the field of semiconductor assembly or packaging and, more particularly, to quad flat no-lead (QFN) packaging technologies.

2. Description of the Related Art

There are mainly two types of conventional lead frame structures used in semiconductor packaging processes. For the first type, as shown in FIG. 77, after performing chemical etching and electrical plating (or simply plating) on the metal substrate, a layer of high-temperature resistant film is affixed on the back surface of the metal substrate to form the lead frame carrier to be used in the packaging process.

For the second type, as shown in FIG. 79, chemical half etching is first performed on the back surface of the metal substrate, and the chemically half etched areas are sealed with an encapsulation material. Further, chemical half etching for inner leads is performed on the top surface of the metal substrate and followed by plating on the surface of inner leads of the lead frame so as to complete the lead frame.

However, both of these two types of lead frames may have certain disadvantages in the packaging process. For example, for the first type, the issues may include:

1) Because an expensive high-temperature film must be affixed on the back surface of the metal substrate, the manufacturing cost is directly increased;
2) In the die attaching process of the packaging process, also because a high-temperature resistant film must be affixed on the back surface of the metal substrate, only epoxy may be used in the die attaching process, and certain techniques such as the eutectic process or soft solder technique cannot be used, which greatly limits choices of available products;
3) In the wire bonding process of the packaging process, also because a high-temperature resistant film must be affixed on the back surface of the metal substrate and the high-temperature resistant film is a kind of soft material, the wire bonding parameters may become unstable, which seriously impacts on the quality of wire bonding and the reliability and stability of the product; and
4) In the molding process, also because a high-temperature resistant film must be affixed on the back surface of the metal substrate, the molding pressure during the molding process may cause certain mold bleeding between the lead frame and the high-temperature resistant film, which may change a conductive metal lead into an insulated lead, as shown in FIG. 78 (certain metal leads on the left side of the drawing are insulated by bleeding materials).

For the second type conventional lead frame structure, the issues may include:

1) Because the etching process is carried out twice, manufacturing cost may be increased;
2) Because the composition of the lead frame is a metal material or compound, when operated in a high or low temperature environment, the lead frame may be warping due to the different expansion and shrinkage stress of the different materials;
3) The warpage of the lead frame may impact on the accuracy of die attaching process and may also affect the production yield due to the impact on the smooth transferring of the warping lead frames in the die attaching process;
4) The warpage of the lead frame may also impact the alignment accuracy of the wire bonding and may also affect the production yield due to the impact on the smooth transferring of the warping lead frames in the wire bonding process; and
5) Because the inner leads on the top surface of the lead frame are formed using etching technique, the width of the inner leads might have to be greater than 100 μm and the distance between two adjacent inner leads also must have to be greater than 100 μm. Thus, it may be difficult to achieve high density for the inner leads.

SUMMARY OF THE INVENTION

In view of the above-described problems, it is one objective of the invention to provide a method for manufacturing barrel-plating quad flat no-lead (QFN) packaging structure for solving one or more problems set forth above and other problems. The method includes providing a metal substrate for a plurality of QFN components, forming a first photoresist film on a top surface of the metal substrate, and forming a plating pattern in the first photoresist film using photolithography. The method also includes forming a first metal layer containing a plurality of inner leads for each of the plurality of QFN components by a multi-layer electrical plating process using the plating pattern in the first photoresist film as a mask such that a lead pitch of the plurality of inner leads is significantly reduced. Further, the method includes attaching at least one die in a predetermined region on the top surface of the metal substrate for each of the plurality of QFN components and connecting the die and the plurality of inner leads using metal wires by a wire bonding process in each of the plurality of QFN components. The method also includes sealing the die, the plurality of inner leads, and the metal wires in each of the plurality of QFN components with a molding compound, and etching the metal substrate from the back surface of the metal substrate to form a plurality of I/O pads in each of the plurality of QFN components corresponding to the plurality of inner leads. Further, the method includes filling sealant in etched areas at the back surface of the metal substrate, separating the plurality of QFN components into individual QFN components by a package sawing process, and forming a second metal layer on a back surface of I/O pads in the individual QFN components by a barrel plating process.

Another objective of the invention is to provide a barrel-plating quad flat no-lead (QFN) packaging structure. The barrel-plating QFN packaging structure includes a metal substrate, a first die coupled to a top surface of the metal substrate, and a plurality of I/O pads formed on the metal substrate. The barrel-plating QFN packaging structure also includes a first metal layer containing a plurality of inner leads corresponding to the plurality of I/O pads and extending to the proximity of the die. The first metal layer is formed on the metal substrate by a multi-layer electrical plating process such that a lead pitch of the plurality of inner leads is significantly reduced. Further, the barrel-plating QFN packaging structure includes metal wires connecting the die and the plurality of inner leads, and a second metal layer formed on a back surface of the plurality of I/O pads by a barrel plating process. In addition, the barrel-plating QFN packaging structure includes a sealant filled in peripheral areas of the I/O pads and areas between the I/O pads at the back surface of the metal substrate. The die, the plurality of inner leads, and the metal wires are sealed with a molding compound.

BRIEF DESCRIPTION OF THE DRAWINGS

FIG. 68A is a cross-sectional view of another exemplary barrel-plating QFN packaging structure consistent with the disclosed embodiments;

FIG. 68B is a top view of the exemplary barrel-plating QFN packaging structure of FIG. 68A;

FIG. 69A is a cross-sectional view of another exemplary barrel-plating QFN packaging structure consistent with the disclosed embodiments;

FIG. 69B is a top view of the exemplary barrel-plating QFN packaging structure of FIG. 69A;

FIG. 70A is a cross-sectional view of another exemplary barrel-plating QFN packaging structure consistent with the disclosed embodiments;

FIG. 70B is a top view of the exemplary barrel-plating QFN packaging structure of FIG. 70A;

FIG. 71A is a cross-sectional view of another exemplary barrel-plating QFN packaging structure consistent with the disclosed embodiments;

FIG. 71B is a top view of the exemplary barrel-plating QFN packaging structure of FIG. 71A;

FIG. 72A is a cross-sectional view of another exemplary barrel-plating QFN packaging structure consistent with the disclosed embodiments;

FIG. 72B is a top view of the exemplary barrel-plating QFN packaging structure of FIG. 72A;

FIG. 73A is a cross-sectional view of another exemplary barrel-plating QFN packaging structure consistent with the disclosed embodiments;

FIG. 73B is a top view of the exemplary barrel-plating QFN packaging structure of FIG. 73A;

Figure 74A:
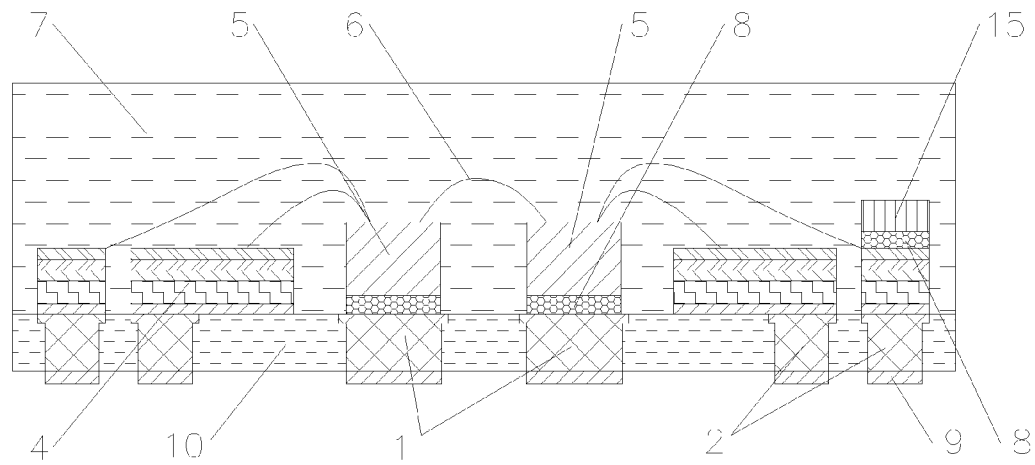
Figure 74B:
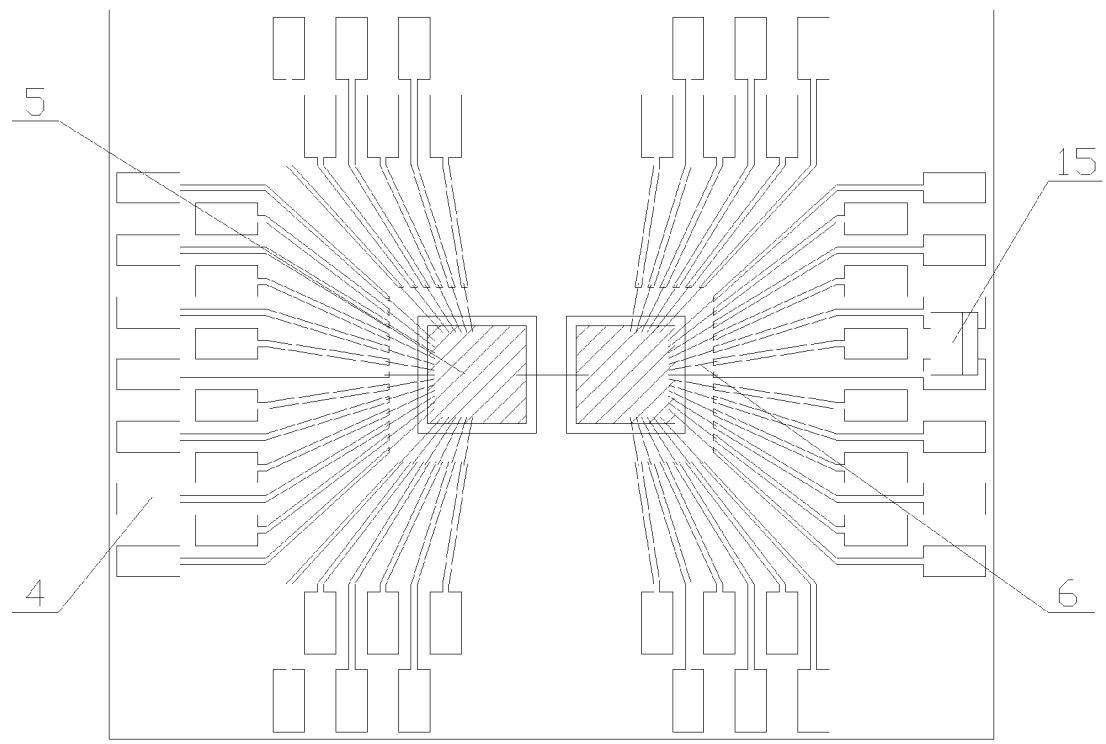
Figure 75A:
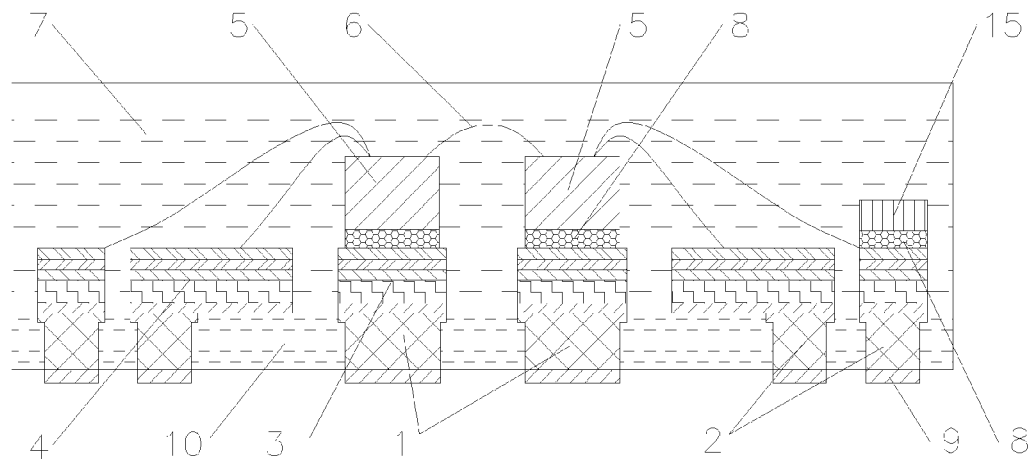
Figure 75B:
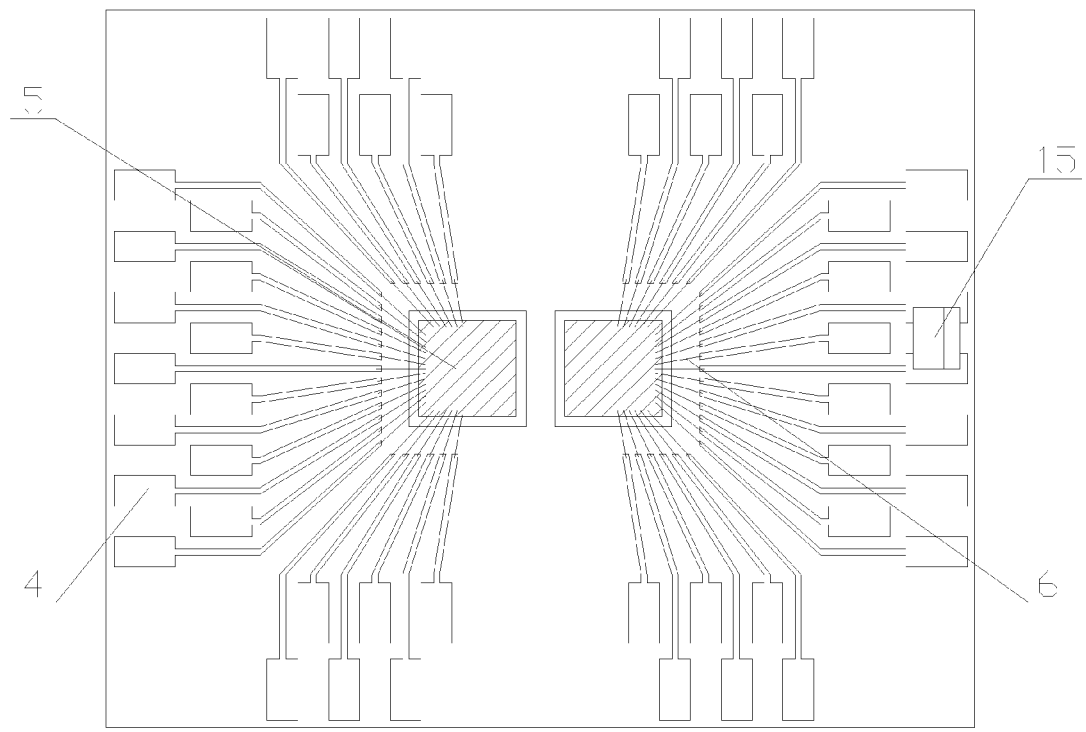
Figure 76A:
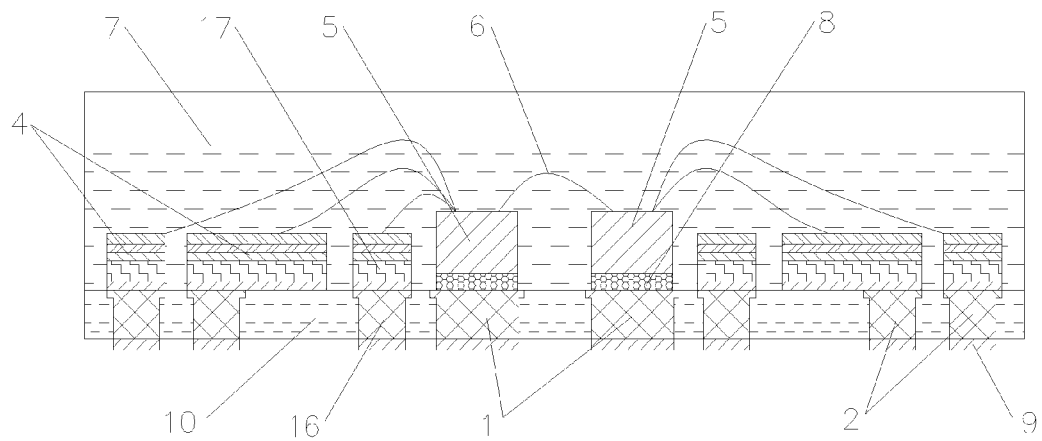
Figure 76B:
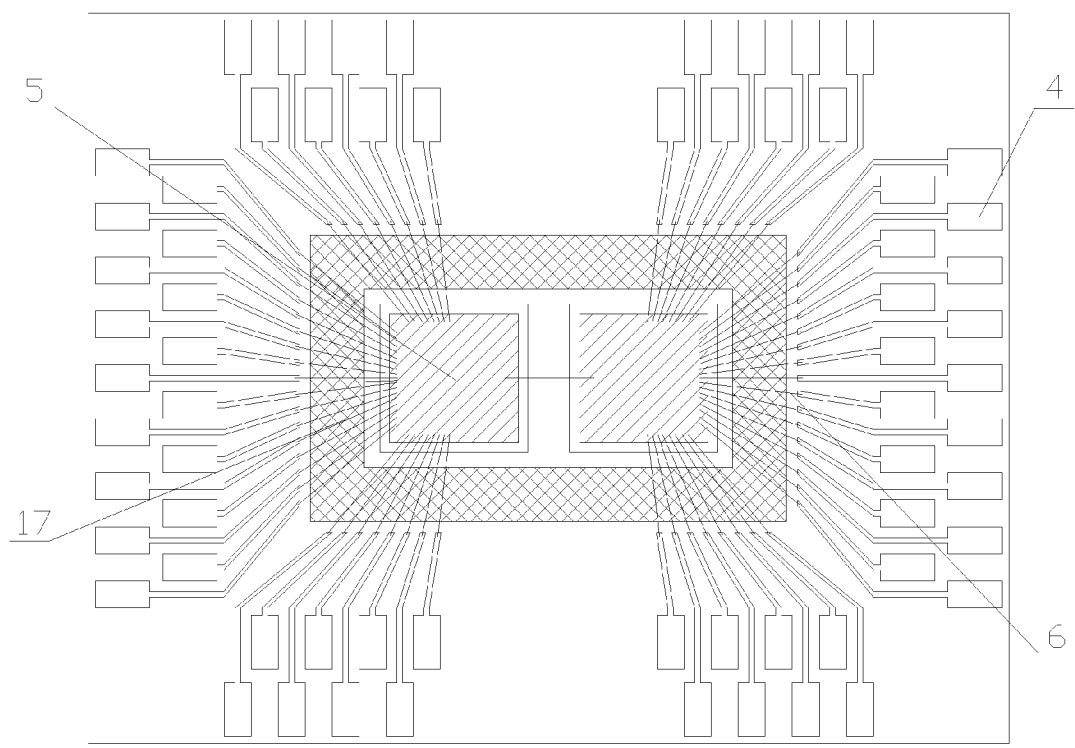
Figure 77A:
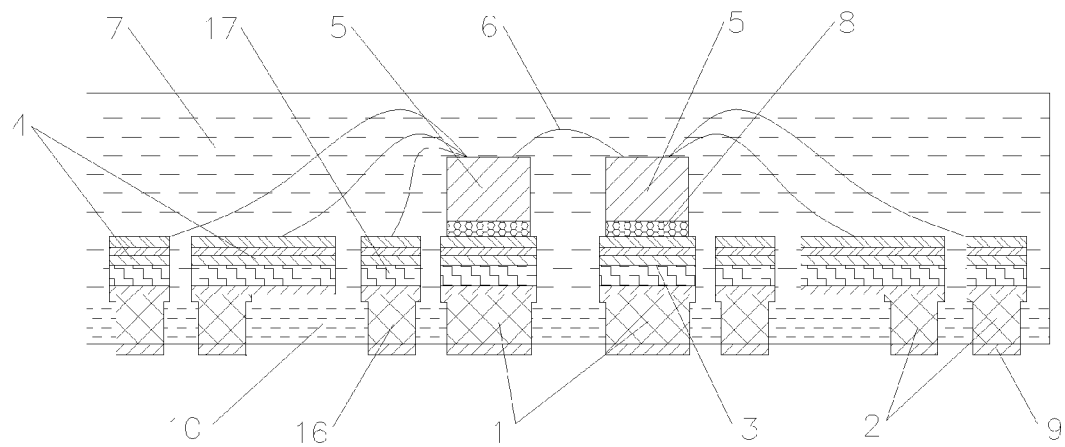
Figure 77B:
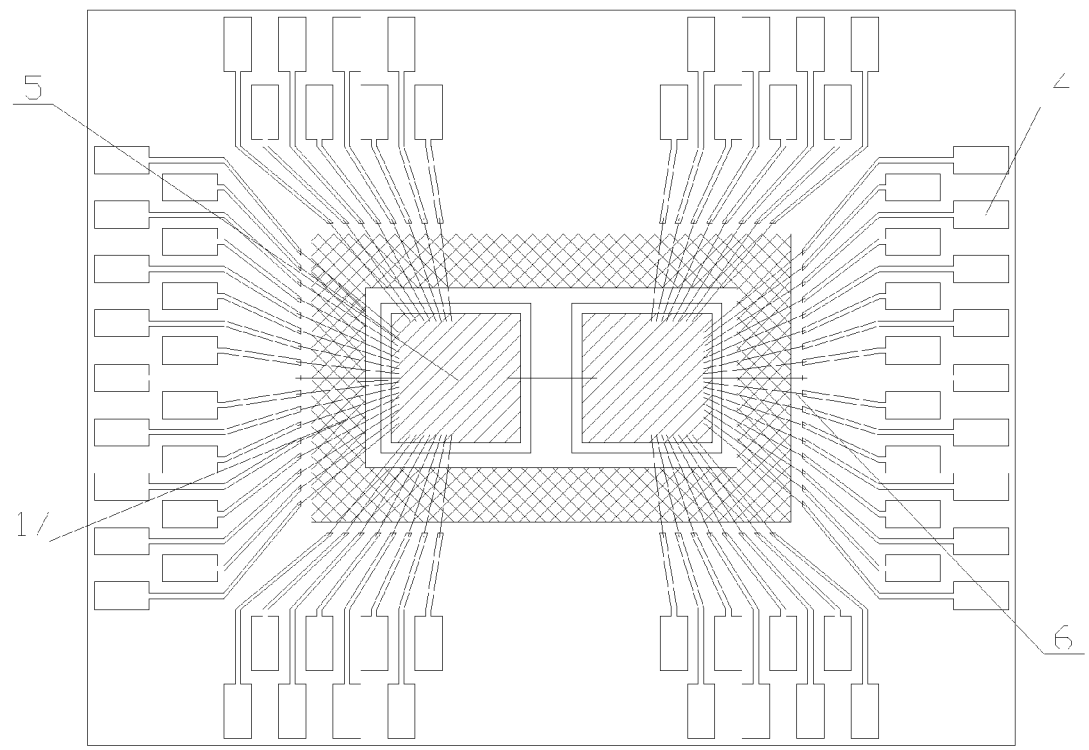
Figure 78A:
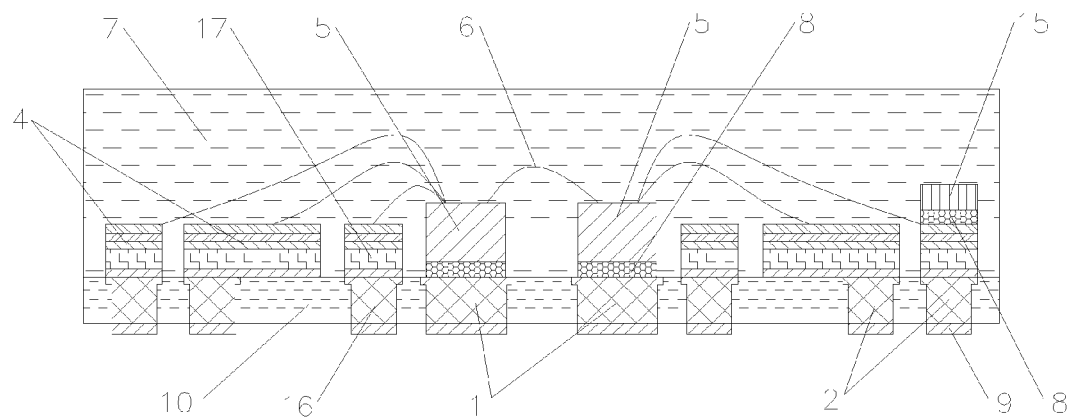
Figure 78B:
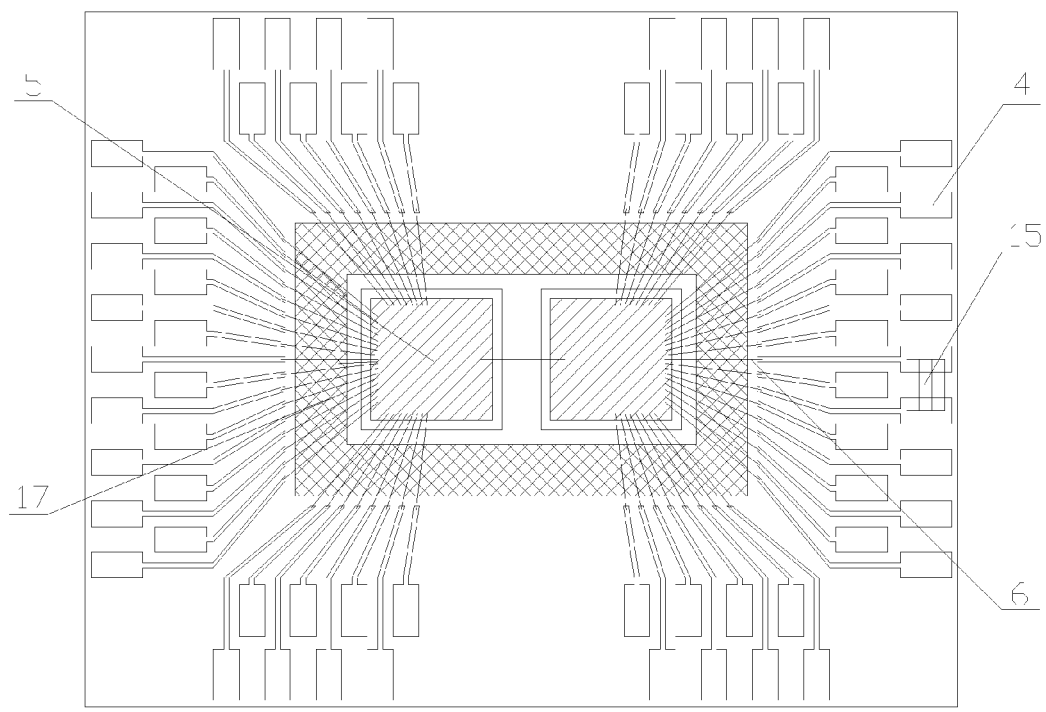
Figure 79A:
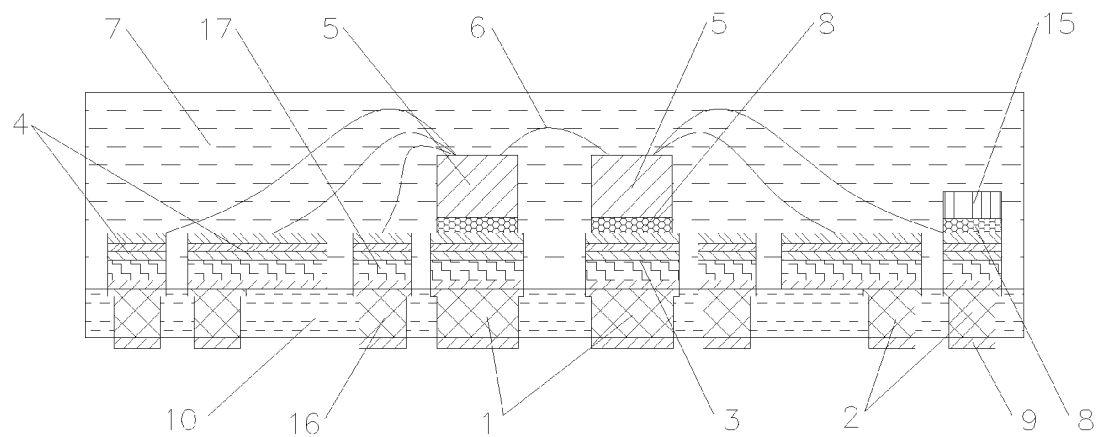
Figure 79B:
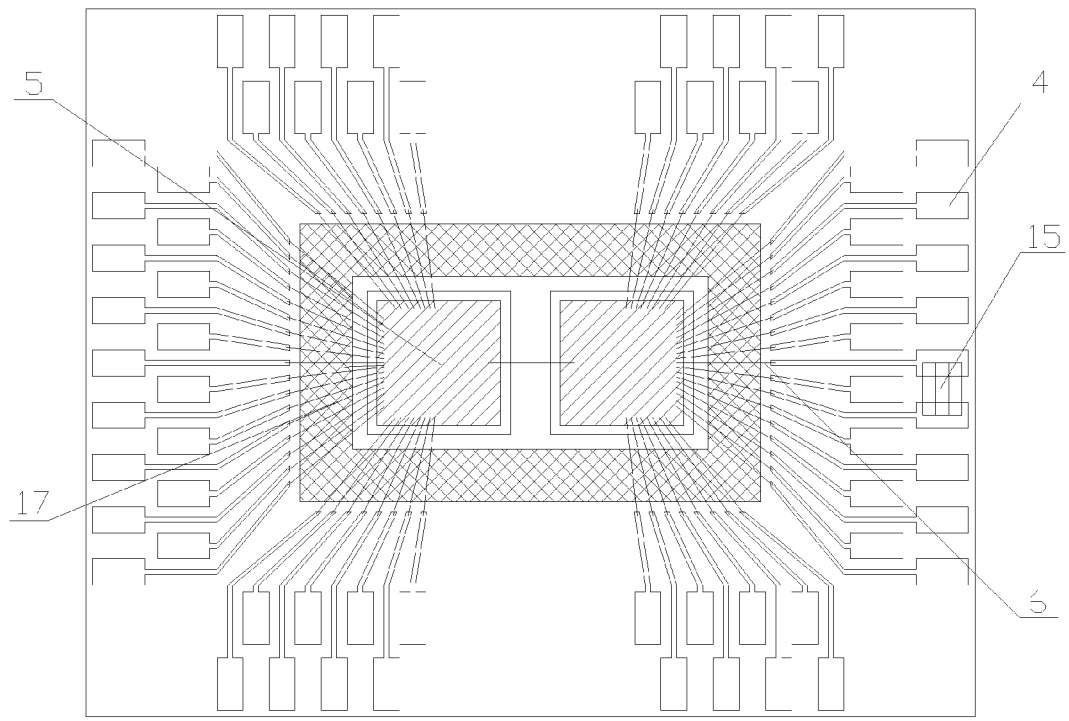
Figure 80:
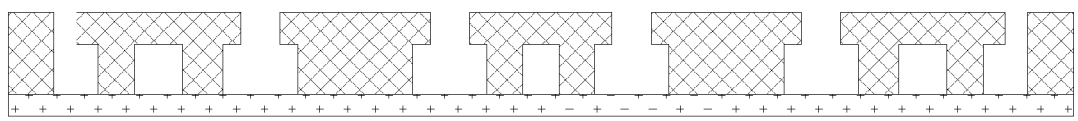
Figure 81:
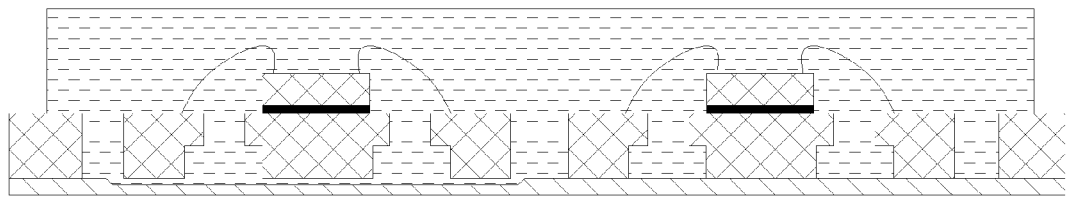
Figure 82:
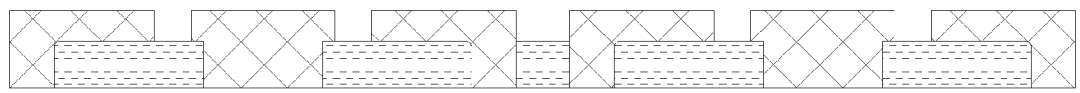

FIG. 74A is a cross-sectional view of another exemplary barrel-plating QFN packaging structure consistent with the disclosed embodiments;

FIG. 74B is a top view of the exemplary barrel-plating QFN packaging structure of FIG. 74A;

FIG. 75A is a cross-sectional view of another exemplary barrel-plating QFN packaging structure consistent with the disclosed embodiments;

FIG. 75B is a top view of the exemplary barrel-plating QFN packaging structure of FIG. 75A;

FIG. 76A is a cross-sectional view of another exemplary barrel-plating QFN packaging structure consistent with the disclosed embodiments;

FIG. 76B is a top view of the exemplary barrel-plating QFN packaging structure of FIG. 76A;

FIG. 77A is a cross-sectional view of another exemplary barrel-plating QFN packaging structure consistent with the disclosed embodiments;

FIG. 77B is a top view of the exemplary barrel-plating QFN packaging structure of FIG. 77A;

FIG. 78A is a cross-sectional view of another exemplary barrel-plating QFN packaging structure consistent with the disclosed embodiments;

FIG. 78B is a top view of the exemplary barrel-plating QFN packaging structure of FIG. 78A;

FIG. 79A is a cross-sectional view of another exemplary barrel-plating QFN packaging structure consistent with the disclosed embodiments;

FIG. 79B is a top view of the exemplary barrel-plating QFN packaging structure of FIG. 79A;

FIG. 80 shows a high-temperature resistant film affixed on a lead frame;

FIG. 81 shows mold bleeding between the lead frame and the high-temperature resistant film; and FIG. 82 shows a two-side etched lead frame.

In the drawings, the following reference numbers are used: 1. outer die pad; 2. input/output (I/O) pad; 3. inner die pad; 4. inner lead; 5. die; 6. metal wire; 7. encapsulation material; 8. conductive or non-conductive adhesive material; 9. second metal layer; 10. sealant; 11. metal substrate; 12 and 13. photoresist films; 14. first metal layer; 15. passive device; 16. outer electrostatic discharge ring; and 17. inner electrostatic discharge ring.

DETAILED DESCRIPTION OF THE EMBODIMENTS

Figure 16A:
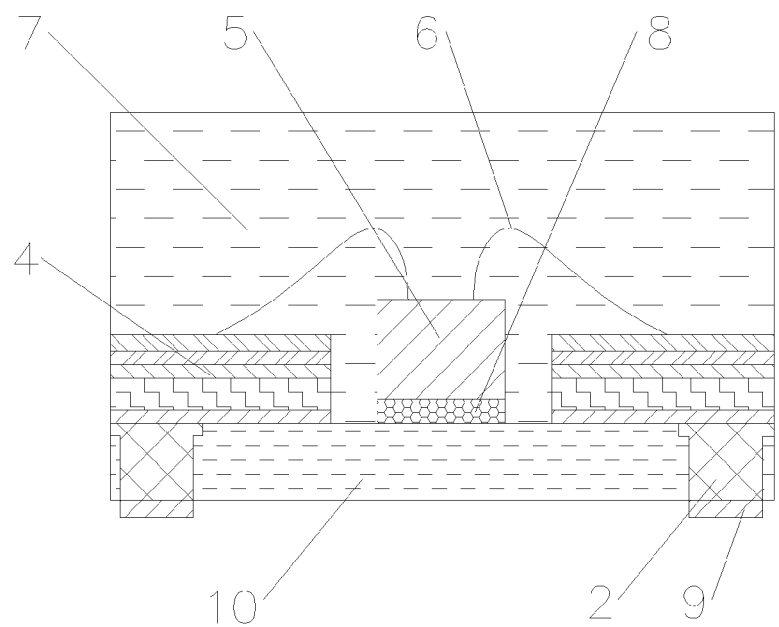
FIG. 16A is a cross-sectional view of an exemplary barrel-plating QFN packaging structure consistent with the disclosed embodiments.
Figure 16B:
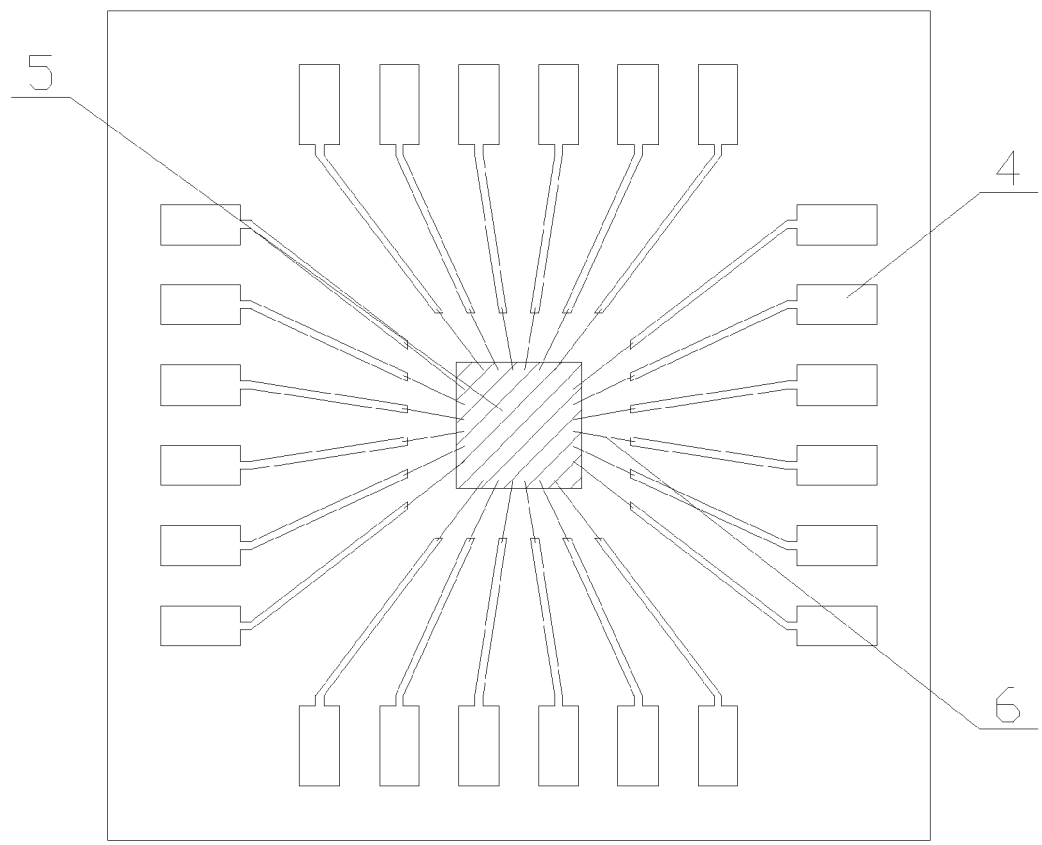
FIG. 16B is a top view of the exemplary barrel-plating QFN packaging structure of FIG. 16A.

FIG. 16A and FIG. 16B illustrate an exemplary barrel-plating quad flat no-lead (QFN) packaging structure consistent with the disclosed embodiments. FIG. 16A is a cross-sectional view of FIG. 16B.

As shown in FIG. 16A and FIG. 16B, the barrel-plating QFN packaging structure includes a plurality of input/output (I/O) pads 2, a plurality of inner leads 4, a die 5, metal wire(s) 6, and an encapsulation material 7, such as an EMC compound. Certain components may be omitted and other components may be added.

The die 5 may include any pre-made semiconductor chip to be assembled or packaged. The I/O pads 2 may include a plurality of metal pads or traces to extend close to the die 5 and may also provide external connections, through inner leads 4, to the die 5 or any other components inside the barrel-plating QFN packaging structure. The I/O pads 2 may be in any appropriate shape, such as a rectangle. The plurality of pads of the I/O pads 2 may be arranged in an array configuration or any other appropriate configuration. For example, in certain embodiments, as shown in FIG. 16B, the I/O pads 2 are arranged in a single ring configuration.

The die 5 may be mounted on the top surface of a substrate or other planar supporting structure through a conductive or non-conductive adhesive material 8, such as epoxy, soft solder, or other conductive or non-conductive materials. Further, from the top surface of the I/O pads 2, an electrical plating (or simply plating) process such as multi-plating may be used to form the inner leads 4. More specifically, multiple layers may be formed by plating such that the distance between adjacent inner leads (i.e., inner lead pitch) may be substantially reduced. The top surface of the inner leads 4 and the top surface of the die 5 may be connected by the metal wires 6. Further, the inner leads 4 may be formed significantly close to the die 5 via lead traces, such that the length of the metal wires 6 connecting the die 5 to the inner leads 4 may also be substantially reduced.

All inner leads 4 may be referred as a first metal layer. That is, the first metal layer includes all leads of the inner leads 4 or the inner leads 4 are formed as part of the first metal layer. The inner leads 4, the die 5, and the metal wires 6 are covered with an encapsulation material 7, such as an EMC compound. Further, at the backside of the substrate, a sealant 10 is filled in the peripheral areas of the I/O pads 2 and the area between adjacent I/O pads 2. The back surfaces of the I/O pads 2 are exposed from the sealant 10 and a second metal layer 9 is formed on the back surfaces of the I/O pads 2. The sealant 10 may include any appropriate type of sealant, such as a no-filler compound or a small-filler compound.

Figure 1:
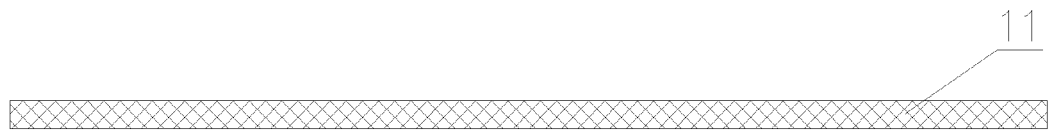
FIG. 1 illustrates a step of an exemplary process for manufacturing an exemplary barrel-plating QFN packaging structure consistent with the disclosed embodiments in which a metal substrate is provided for the lead frame manufacturing and packaging process.

The process for manufacturing the above described packaging structure may be explained below in detail with corresponding FIGS. 1-15. The process may be used to make a plurality of components (packaged ICs). As shown in FIG. 1, at the beginning, a metal substrate 11 is provided for the lead frame manufacturing and packaging process. The metal substrate 11 may be used to manufacture the plurality of components, and the plurality of components may be arranged in a predetermined configuration, such as in an array of components. The manufacturing process may be applied to the plurality of components, i.e., the plurality of components may be made in the same process. However, according to disclosed embodiments, certain process or processes may apply individual component or components instead of the plurality of components without distinction.

The metal substrate 11 may have a desired thickness and be made from various metal materials depending on particular types of the die 5. For example, metal substrate 11 may be made from one of copper, aluminum, iron, copper alloy, stainless steel, or nickel-iron alloy. Other materials may also be used.

Figure 2:
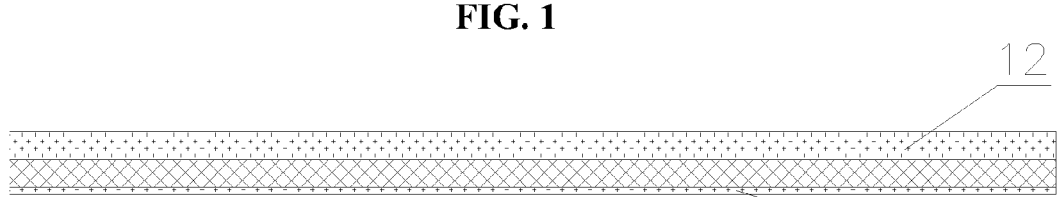
FIG. 2 illustrates another step of the exemplary process for manufacturing the exemplary barrel-plating QFN packaging structure in which a layer of photoresist film and another layer of photoresist film are formed on the top surface and the back surface of the metal substrate, respectively.

Further, as shown in FIG. 2, a layer of photoresist film 12 and a layer of photoresist film 13 may be formed (pasted or coated) on the top surface and the back surface of the metal substrate 11, respectively. The photoresist film 12 and/or photoresist film 13 may be formed using various ways. For example, the photoresist film 12 and/or photoresist film 13 may be coated on the surface or may be pasted on the surface. The photoresist films 13 and 12 may be used to protect the metal substrate 11 in subsequent plating processes, and the photoresist films 13 or 12 may include a dry photoresist film or a wet photoresist film. Other types of photoresist films may also be used.

Figure 3:
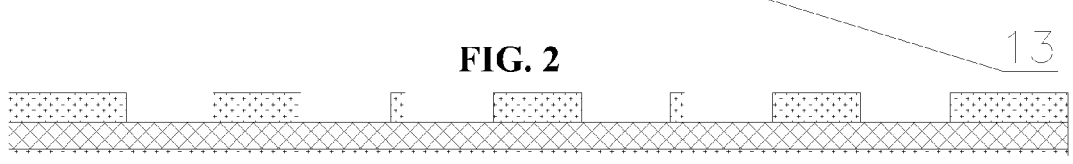
FIG. 3 illustrates another step of the exemplary process for manufacturing the exemplary barrel-plating QFN packaging structure in which portions of the photoresist film on the top surface of the metal substrate are removed to form a pattern by photolithography.

Further, as shown in FIG. 3, portions of the photoresist film 12 on the top surface of the metal substrate 11 may be removed to form a pattern by photolithography. As shown in FIG. 3, photolithography equipment may be used to perform exposure, development, and etching on the photoresist film 12 using a corresponding mask to form a plating pattern in the photoresist film 12. The plating pattern may expose the predetermined areas of the metal substrate 11 for subsequent plating process to form the first metal layer 14, i.e., a first metal layer pattern.

Figure 4:
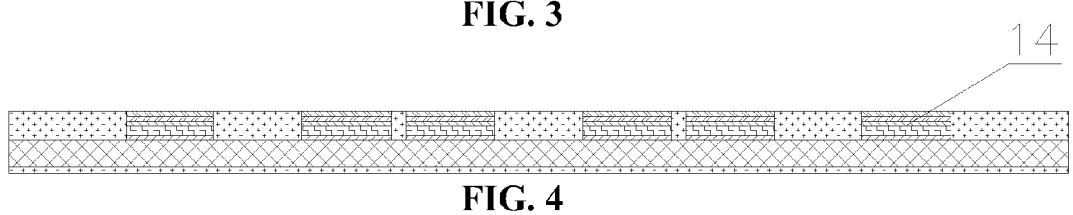
FIG. 4 illustrates another step of the exemplary process for manufacturing the exemplary barrel-plating QFN packaging structure in which a multi-layer plating process is performed to form the first metal layer in the areas of the metal substrate exposed by the plating pattern in the photoresist film.

After forming the plating pattern or the first metal layer pattern, as shown in FIG. 4, a multi-layer plating process may be performed to form the first metal layer 14 in the areas of the metal substrate 11 exposed by the plating pattern in the photoresist film 12. In other words, the multi-layer plating process is performed on the top surface of the metal substrate 11 using the pattern in the photoresist film 12 as a mask to form inner leads 4 (the first metal layer 14). The inner leads 4 may be formed corresponding to the I/O pads 2 to be formed in subsequent processes and may also be arranged in a corresponding shape (e.g., a rectangle) and configuration (e.g., a single ring configuration). Other shapes and configurations may also be used.

Because the inner leads 4 are formed by the plating process, the lead pitch of the inner leads 4 and the distance between the inner leads 4 and the die 5 may be substantially reduced. For example, the inner leads 4 may be formed by a thin-line plating method on the top surface of the metal substrate 11. The width of the inner leads 4 may be approximately 25 μm, and the lead pitch of the inner leads 4 may also be approximately 25 μm. Comparing with the lead pitch of about 100 μm in conventional lead frames, the width of the inner leads 4 and the lead pitch of the inner leads 4 may be significantly reduced, which may achieve a high density for the inner leads 4. Further, the inner leads 4 may extend to the proximity of the die 5 via lead traces. Using the plating process, the distance between the die 5 and the inner leads 4 can also be significantly reduced such that the inner leads 4 can extend substantially close to the die 5, which can substantially reduce the package size.

The first metal layer 14 (e.g., the inner leads 4) may include any appropriate number of layers of metal materials and/or metal layer structures. For example, the first metal layer 14 may include, from bottom to the top, a total of five layers of nickel, copper, nickel, palladium, and gold, respectively, or a total of three layers of nickel, copper, and silver. Other materials and numbers of layers and/or layer structures may also be used.

Different metal layers in the first metal layer 14 may provide different functionalities. For example, in a five-layer structure (nickel, copper, nickel, palladium, and gold), the bottom layer of nickel may be used as an erosion resistant and barrier layer; the middle layers of copper, nickel and palladium may be used to increase the thickness of the first metal layer 14; and the top layer of gold may be used for wire bonding. Other functionalities may also be provided and other metal layer structures may also be used.

Figure 5:
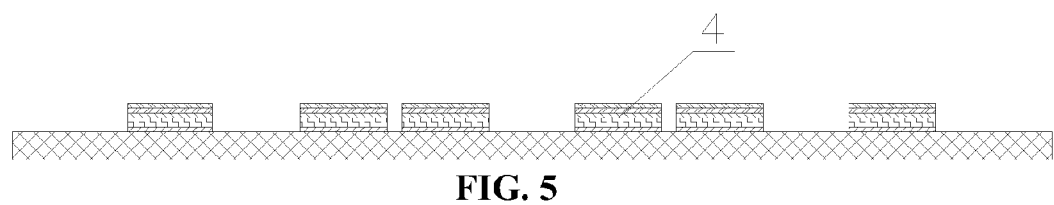
FIG. 5 illustrates another step of the exemplary process for manufacturing the exemplary barrel-plating QFN packaging structure in which the remaining top surface photoresist film is removed and the inner leads are formed on the metal substrate.

Further, as shown in FIG. 5, the remaining top surface photoresist film 12 is removed and the inner leads 4 are formed on the metal substrate 11. The back surface photoresist film 13 is also removed.

Figure 6:
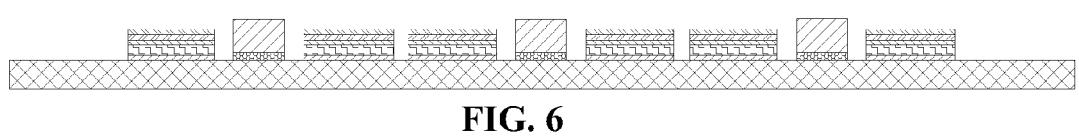
FIG. 6 illustrates another step of the exemplary process for manufacturing the exemplary barrel-plating QFN packaging structure in which the die is mounted on a predetermined die area of the metal substrate using the conductive or non-conductive adhesive material in a die attaching process.

After removing the photoresist films, the die 5 may be mounted on a predetermined die area of the metal substrate 11 using the conductive or non-conductive adhesive material 8, as shown in FIG. 6, in a die attaching process. The predetermined die area of the metal substrate 11 may correspond to the area for attaching the die 5. More particularly, the die 5 may be mounted or attached to an area among the inner leads 4 or surrounded by the inner leads 4. A plurality of dies is attached to the top surface of the metal substrate 11 corresponding to the plurality of components to be made on the metal substrate 11.

Figure 7:
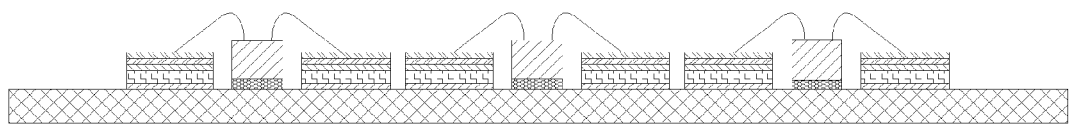
FIG. 7 illustrates another step of the exemplary process for manufacturing the exemplary barrel-plating QFN packaging structure in which the top surface of the die and the top surface of the inner leads are connected with the metal wires in a wire bonding process.
Figure 8:
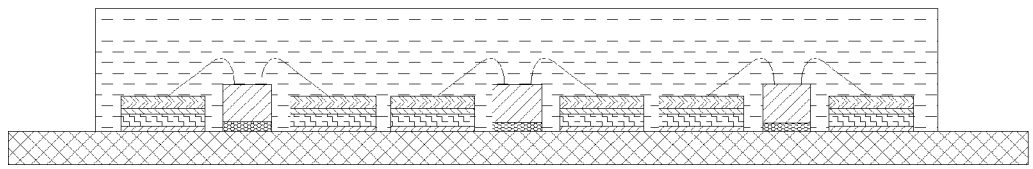
FIG. 8 illustrates another step of the exemplary process for manufacturing the exemplary barrel-plating QFN packaging structure in which the inner leads, the die, and the metal wires are encapsulated using an encapsulation material.

The top surface of the die 5 and the top surface of the inner leads 4 are connected with the metal wires 6 in a wire bonding process, as shown in FIG. 7. The inner leads 4, the die 5, and the metal wires 6 are then encapsulated using an encapsulation material 7, as shown in FIG. 8. For example, molding equipment may be used to seal or encapsulate the metal substrate 11 after completing die attaching and wire bonding by a molding compound. Post-molding curing may also be performed such that the molding compound or other encapsulation materials may also be cured before the next manufacturing process.

Figure 9:
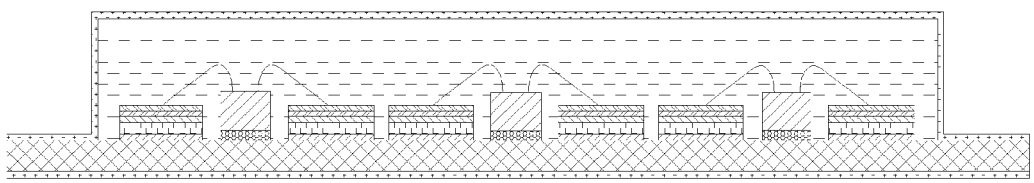
FIG. 9 illustrates another step of the exemplary process for manufacturing the exemplary barrel-plating QFN packaging structure in which a layer of photoresist film is formed on the top surface of the metal substrate and another layer of photoresist film is formed on the back surface of the metal substrate.

As shown in FIG. 9, after the encapsulation process (e.g., molding and post-molding curing), a layer of photoresist film 13 may be formed on the top surface of the metal substrate 11 and another layer of photoresist film 13 may be formed on the back surface of the metal substrate 11. The photoresist films may be used to protect the metal substrate 11 in a subsequent etching process, and the photoresist films may include a dry photoresist film or a wet photoresist film. Other types of photoresist films may also be used.

Figure 10:
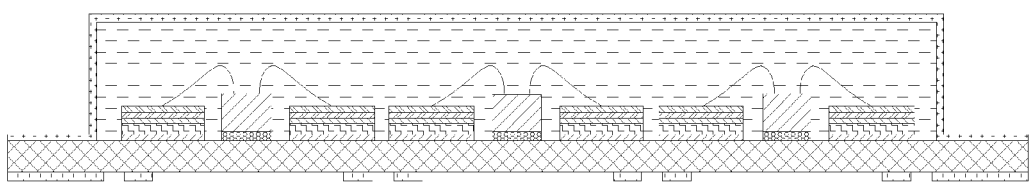
FIG. 10 illustrates another step of the exemplary process for manufacturing the exemplary barrel-plating QFN packaging structure in which photolithography is performed on the photoresist film on the back surface of the metal substrate using a mask to form an etching pattern in the photoresist film.

Further, portions of the photoresist film 13 on the back surface of the metal substrate 11 may be removed to form a pattern using photolithography. As shown in FIG. 10, photolithography equipment may be used to perform exposure, development, and etching on the photoresist film 13 on the back surface of the metal substrate 11 using a mask to form an etching pattern in the photoresist film 13. The etching pattern may expose the predetermined areas on the back surface of the metal substrate 11 for a subsequent etching process to form I/O pads 2, i.e., the I/O pad pattern.

Figure 11:
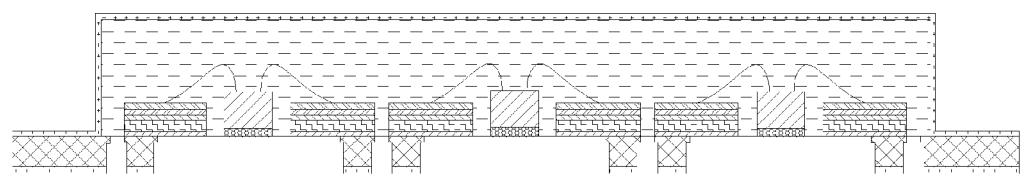
FIG. 11 illustrates another step of the exemplary process for manufacturing the exemplary barrel-plating QFN packaging structure in which an etching process is performed on the areas of the metal substrate exposed by the etching pattern in the photoresist film.

After forming the etching pattern in the photoresist film 13, as shown in FIG. 11, an etching process may be performed on the areas of the metal substrate 11 exposed by the etching pattern in the photoresist film 13. In other words, the etching process is performed on the metal substrate 11 using the etching pattern in the photoresist film 13 as a mask. The etching process may be full etching or half etching. Etched areas are thus formed on the back surface of the metal substrate 11, and the I/O pads 2 are also formed after the etching process.

Figure 12:
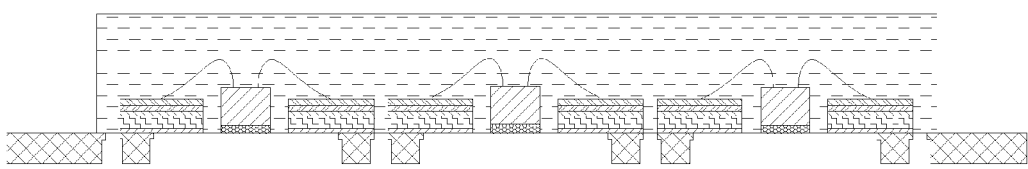
FIG. 12 illustrates another step of the exemplary process for manufacturing the exemplary barrel-plating QFN packaging structure in which the remaining photoresist film on the back surface of the metal substrate is removed to expose the etched areas on the back surface of the metal substrate including the peripheral areas of the I/O pads and the areas between leads of the I/O pads.

Further, as shown in FIG. 12, after the etching process, the remaining photoresist film 13 on the back surface of the metal substrate 11 is removed to expose the etched areas on the back surface of the metal substrate 11 including the peripheral areas of the I/O pads 2 and the areas between leads of the I/O pads 2. The photoresist film 13 on the top surface of the metal substrate 11 is also removed.

Figure 13:
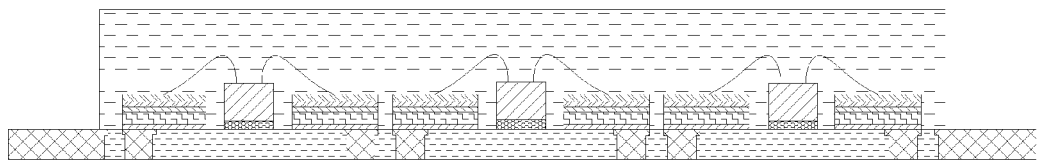
FIG. 13 illustrates another step of the exemplary process for manufacturing the exemplary barrel-plating QFN packaging structure in which the etched areas on the back surface of the metal substrate are filled with the sealant using filling equipment.

Afterwards, as shown in FIG. 13, the etched areas on the back surface of the metal substrate 11 are filled with the sealant 10 using filling equipment. Post-molding curing may be performed on the sealant 10. The sealant 10 may include any appropriate sealant, such as a no-filler compound or a small-filler compound, and may also be filled at a certain height. Thus, the I/O pads 2 may be supported by both the molding compound 7 and the sealant 10.

Figure 14:
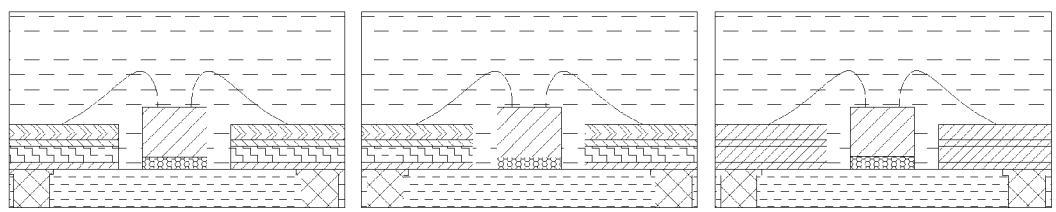
FIG. 14 illustrates another step of the exemplary process for manufacturing the exemplary barrel-plating QFN packaging structure in which the etched areas on the back surface of the metal substrate are filled with the sealant using filling equipment.

Afterwards, as shown in FIG. 14, the plurality of encapsulated components formed on the metal substrate 11 may be individually cut into individual components by a package sawing process. That is, before forming the second metal layer 9, the plurality of unfinished components are cut into individual components by a package sawing process. Other cutting methods may also be used.

Figure 15:
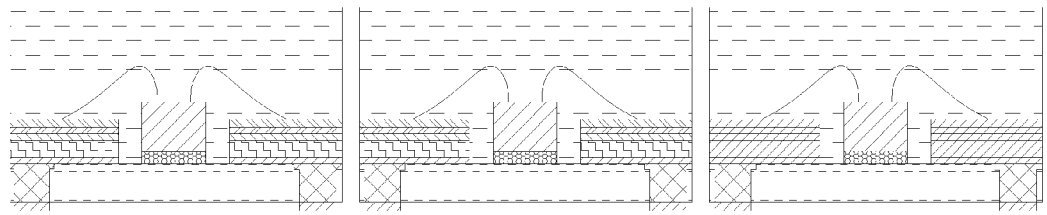
FIG. 15 illustrates another step of the exemplary process for manufacturing the exemplary barrel-plating QFN packaging structure in which a barrel plating process is applied on the individual components to form the second metal layer on the back surface of I/O pads.

Further, as shown in FIG. 15, a barrel plating process is applied on the individual components to form the second metal layer 9 on the back surface of I/O pads 2. After the barrel plating process, packaged ICs or individual barrel-plating QFN packaging structures are completed. The second metal layer 9 may be made from various materials, such as gold, nickel, copper, palladium, silver, or tin, etc.

Thus, a barrel-plating QFN packaging structure with a single lead ring may be formed. Because the second metal layer is formed on individual components in a barrel plating process and not formed on the entire metal substrate lead frame, the width and/or lead pitch of the I/O pads 2 can also be significantly reduced. For example, the I/O pads 2 may have a pad width of approximately 25 μm, and the lead pitch of the I/O pads 2 may also be approximately 25 μm.

Figure 17A:
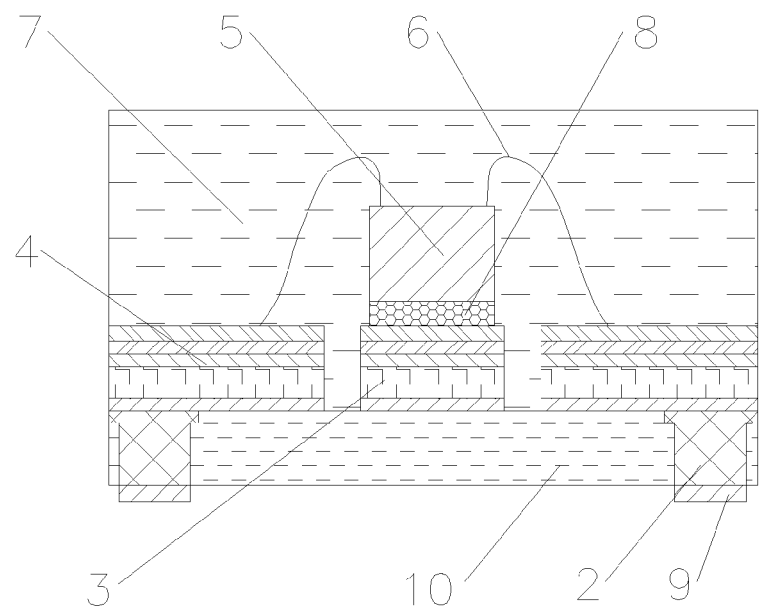
FIG. 17A is a cross-sectional view of another exemplary barrel-plating QFN packaging structure consistent with the disclosed embodiments.
Figure 17B:
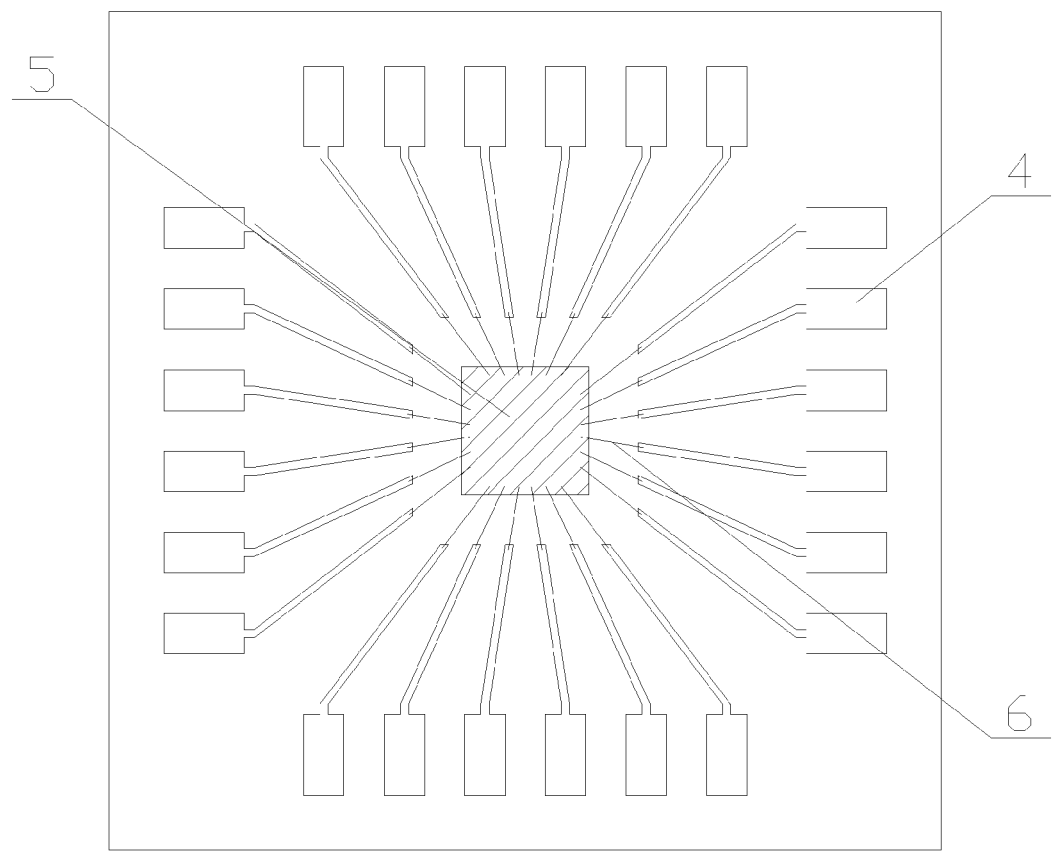
FIG. 17B is a top view of the exemplary barrel-plating QFN packaging structure of FIG. 17A.

Further, the barrel-plating QFN packaging structure may also include various different structures and configurations. For example, FIG. 17A and FIG. 17B illustrate another exemplary barrel-plating QFN packaging structure. FIG. 17A is a cross-sectional view of FIG. 17B.

As shown in FIG. 17A and FIG. 17B, the barrel-plating QFN packaging structure in FIG. 17A and FIG. 17B is similar to the barrel-plating QFN packaging structure in FIG. 16A and FIG. 16B. However, the barrel-plating QFN packaging structure in FIG. 17A also includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad and a single lead ring may be formed.

Figure 18A:
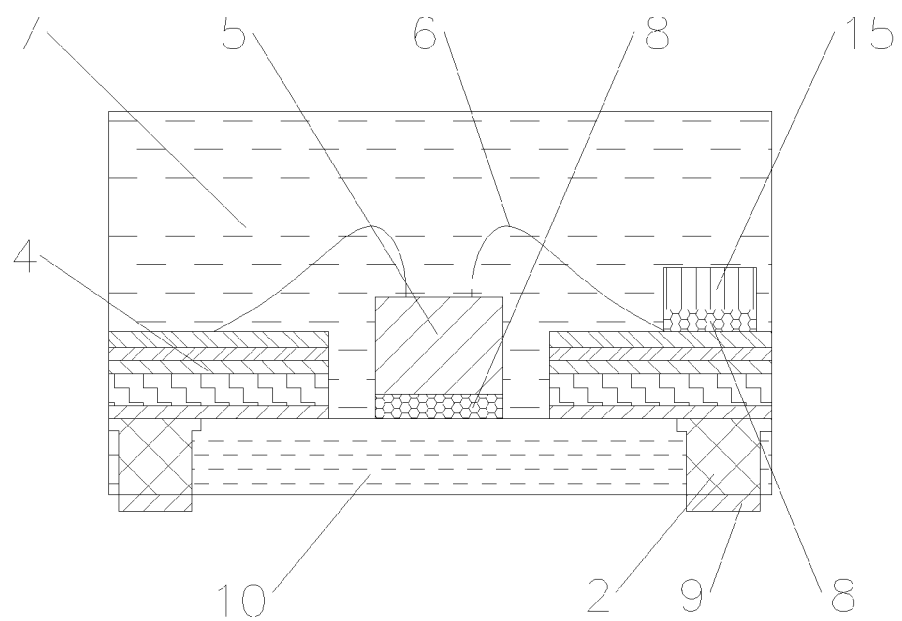
FIG. 18A is a cross-sectional view of another exemplary barrel-plating QFN packaging structure consistent with the disclosed embodiments.
Figure 18B:
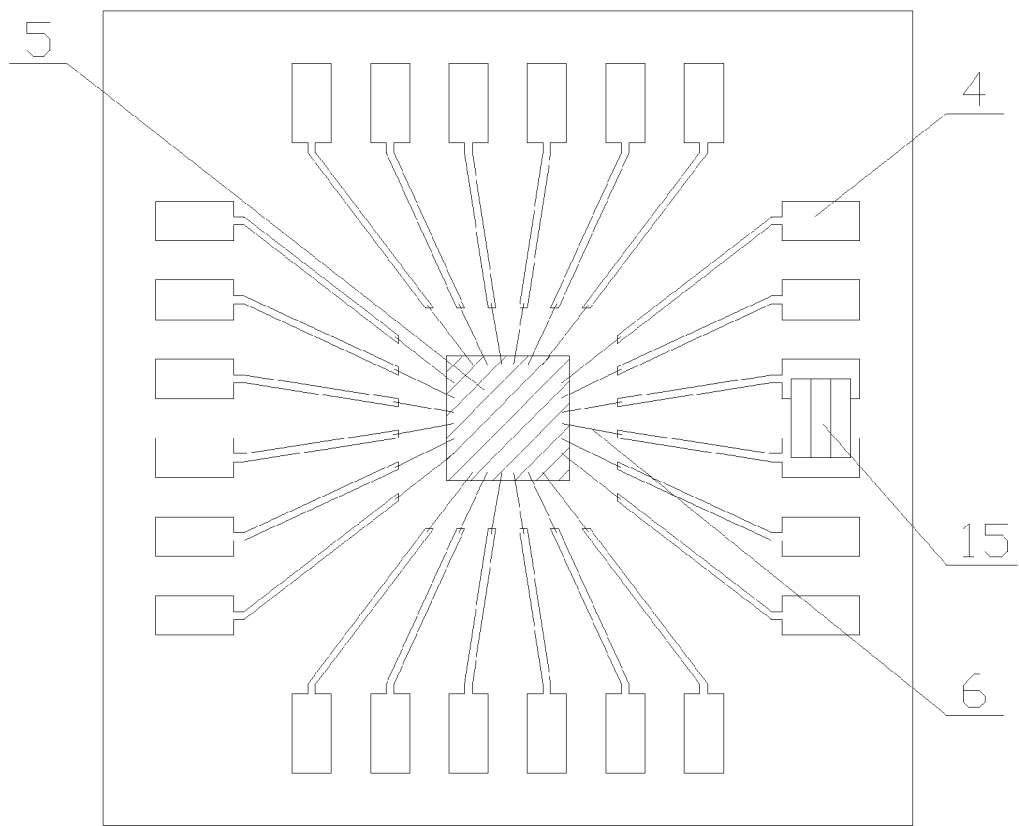
FIG. 18B is a top view of the exemplary barrel-plating QFN packaging structure of FIG. 18A.

FIG. 18A and FIG. 18B illustrate another exemplary barrel-plating QFN packaging structure. FIG. 18A is a cross-sectional view of FIG. 18B.

As shown in FIG. 18A and FIG. 18B, the barrel-plating QFN packaging structure in FIG. 18A and FIG. 18B is similar to the barrel-plating QFN packaging structure in FIG. 16A and FIG. 16B. However, the barrel-plating QFN packaging structure in FIG. 18A also includes one or more passive devices 15 coupled between the inner leads 4 using the conductive or non-conductive adhesive material 8. The passive devices 15 may be coupled between the inner leads 4 before the die 5 is attached or during the die attaching process. Thus, a barrel-plating QFN packaging structure with a single lead ring coupled with passive devices may be formed.

Figure 19A:
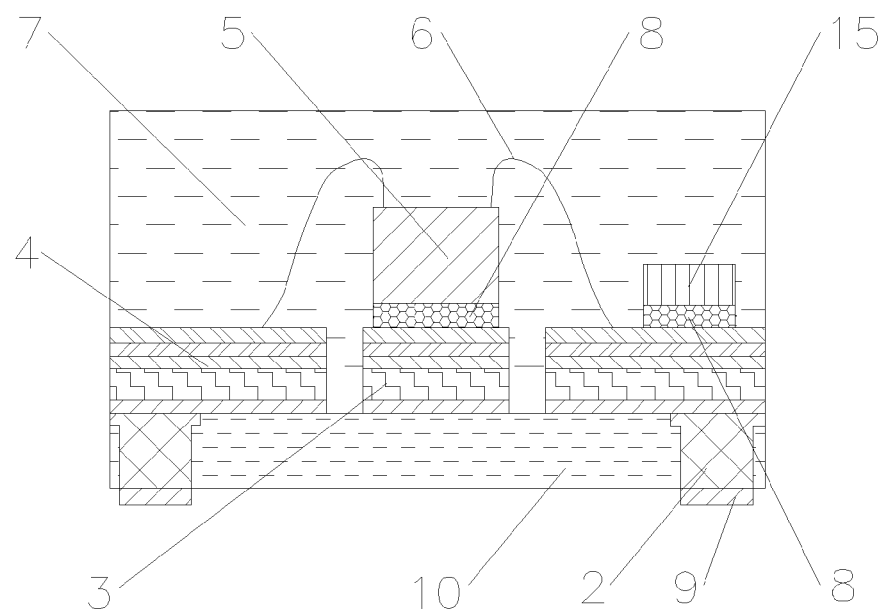
FIG. 19A is a cross-sectional view of another exemplary barrel-plating QFN packaging structure consistent with the disclosed embodiments.
Figure 19B:
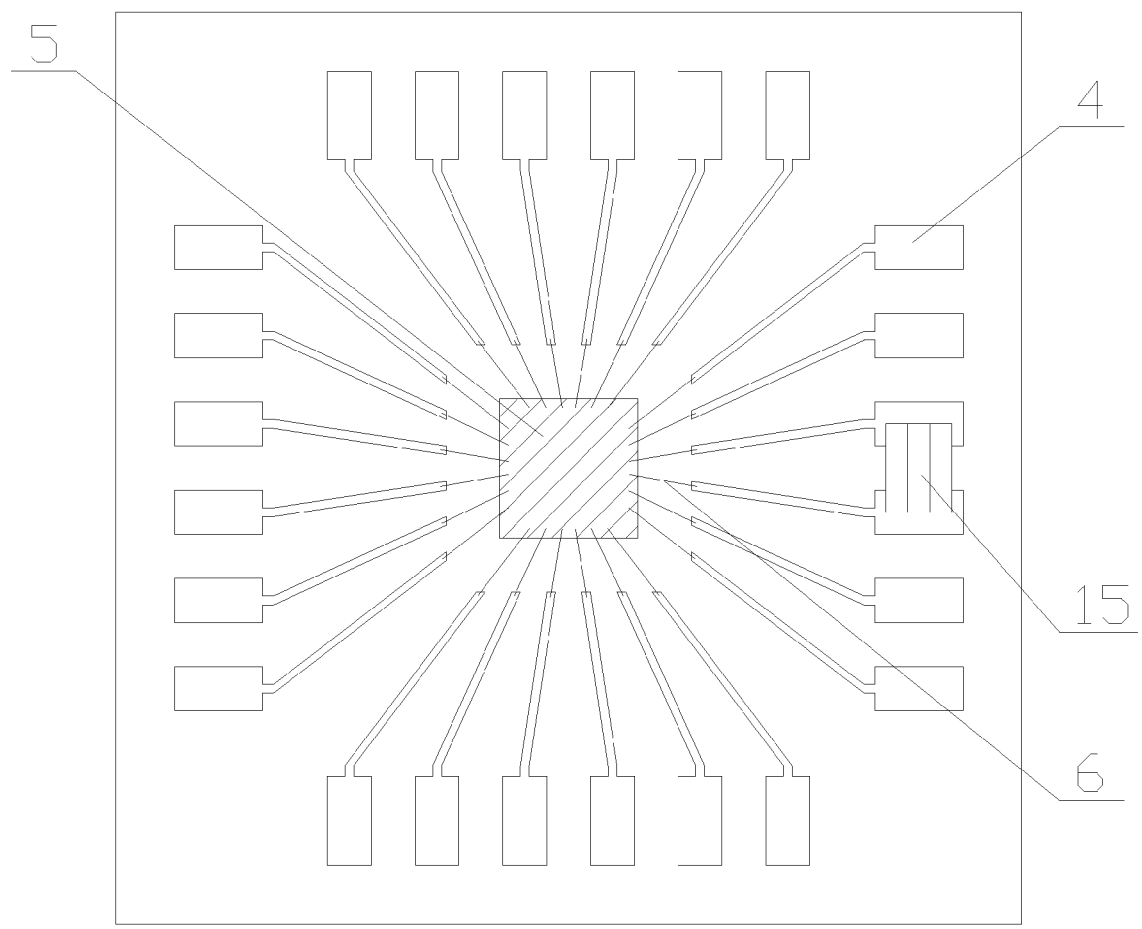
FIG. 19B is a top view of the exemplary barrel-plating QFN packaging structure of FIG. 19A.

FIG. 19A and FIG. 19B illustrate another exemplary barrel-plating QFN packaging structure. FIG. 19A is a cross-sectional view of FIG. 19B.

As shown in FIG. 19A and FIG. 19B, the barrel-plating QFN packaging structure in FIG. 19A and FIG. 19B is similar to the barrel-plating QFN packaging structure in FIG. 18A and FIG. 18B. However, the barrel-plating QFN packaging structure in FIG. 19A also includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad and a single lead ring coupled with passive devices may be formed.

Figure 20A:
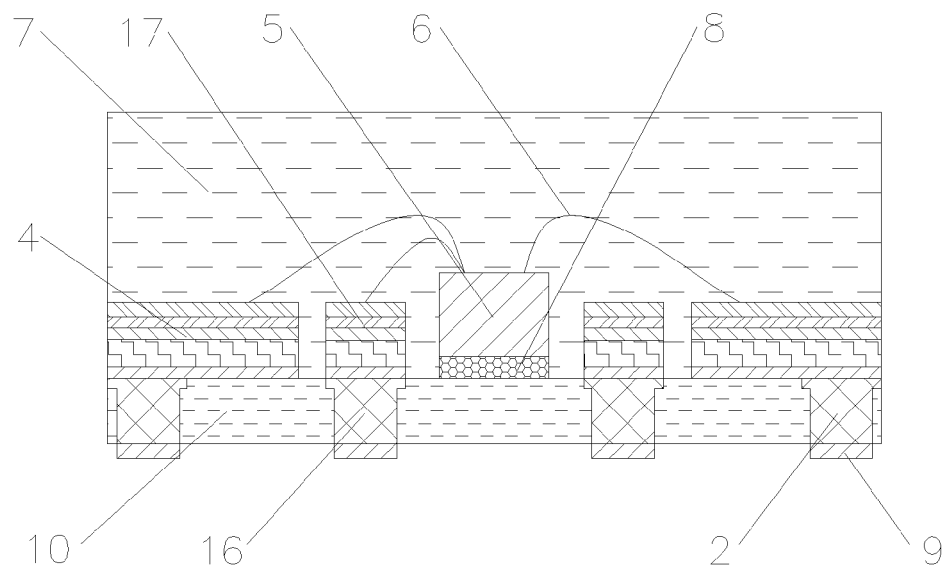
FIG. 20A is a cross-sectional view of another exemplary barrel-plating QFN packaging structure consistent with the disclosed embodiments.
Figure 20B:
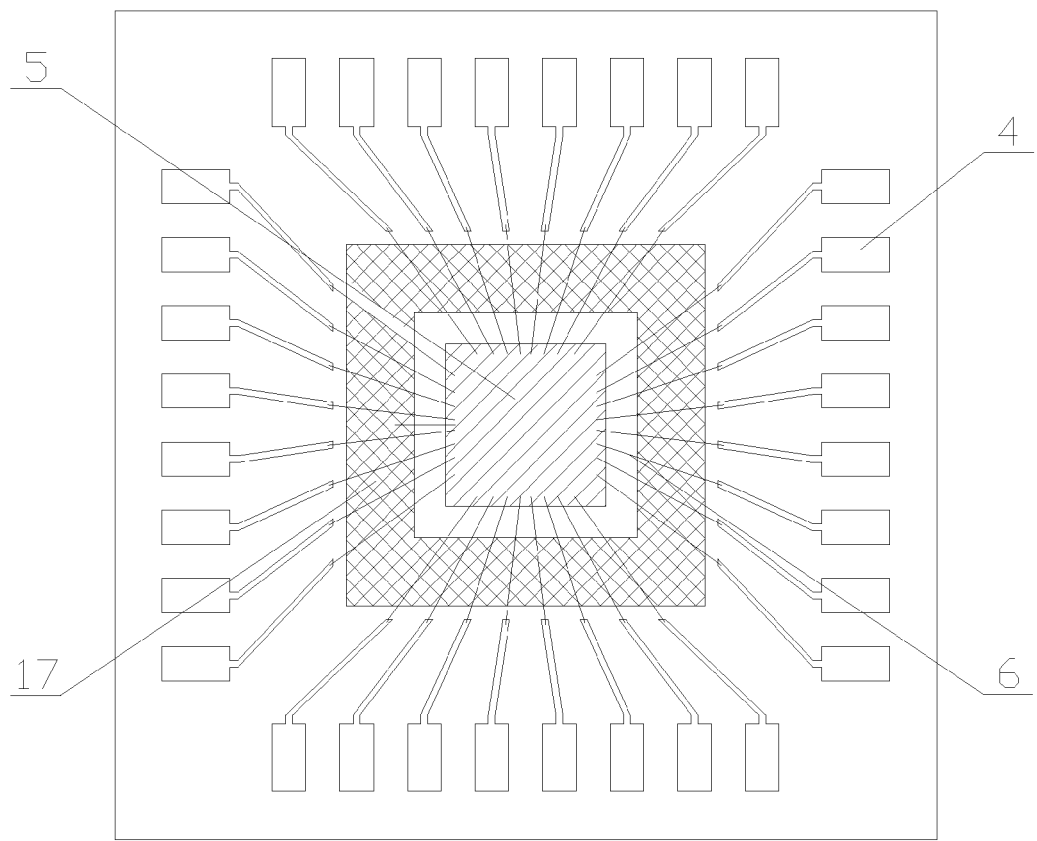
FIG. 20B is a top view of the exemplary barrel-plating QFN packaging structure of FIG. 20A.

FIG. 20A and FIG. 20B illustrate another exemplary barrel-plating QFN packaging structure. FIG. 20A is a cross-sectional view of FIG. 20B.

As shown in FIG. 20A and FIG. 20B, the barrel-plating QFN packaging structure in FIG. 20A and FIG. 20B is similar to the barrel-plating QFN packaging structure in FIG. 16A and FIG. 16B. However, the barrel-plating QFN packaging structure in FIG. 20A and FIG. 20B also includes an outer electrostatic discharge ring 16, and an inner electrostatic discharge ring 17 may be formed on the top surface of the outer electrostatic discharge ring 16 within the I/O pad ring. That is, the inner electrostatic discharge ring 17 may also be formed by the multi-layer plating process for forming the first metal layer 14. More particularly, the inner electrostatic discharge ring 17 may be arranged between the die 5 and inner leads 4 and in any appropriate shape, such as a rectangle or square. Further, the top surface of the die 5 is connected to the top surface of the inner electrostatic discharge ring 17 by the metal wire 6 such that the die 5 may be protected from stationary electric charges by the inner and outer electrostatic discharge rings 17 and 16. Both the outer electrostatic discharge ring 16 and the inner electrostatic discharge ring 17 may be in any appropriate shape, such as a rectangular ring, etc. Thus, a barrel-plating QFN packaging structure with an inner die pad, a single lead ring, and electrostatic discharge rings may be formed.

Figure 21A:
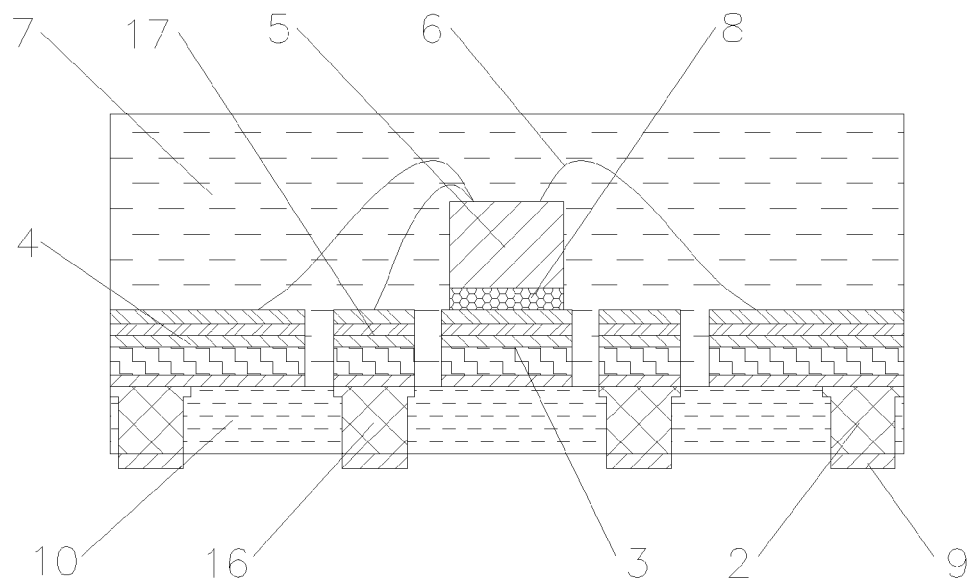
FIG. 21A is a cross-sectional view of another exemplary barrel-plating QFN packaging structure consistent with the disclosed embodiments.
Figure 21B:
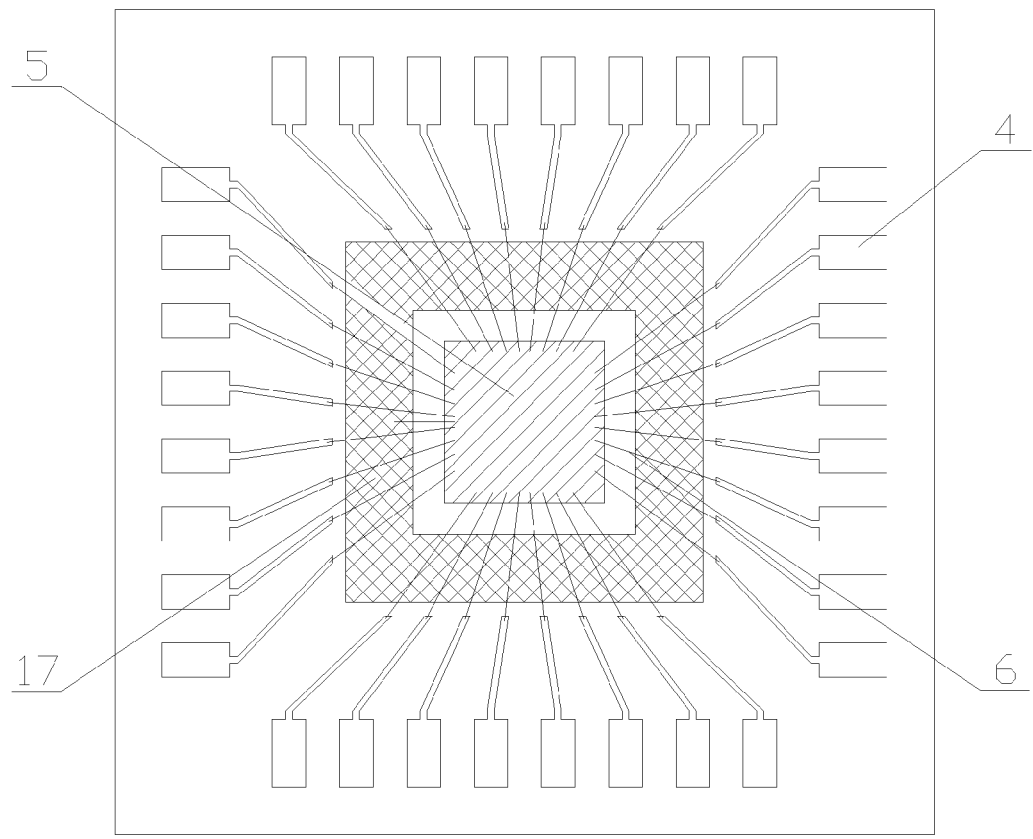
FIG. 21B is a top view of the exemplary barrel-plating QFN packaging structure of FIG. 21A.

FIG. 21A and FIG. 21B illustrate another exemplary barrel-plating QFN packaging structure. FIG. 21A is a cross-sectional view of FIG. 21B.

As shown in FIG. 21A and FIG. 21B, the barrel-plating QFN packaging structure in FIG. 21A and FIG. 21B is similar to the barrel-plating QFN packaging structure in FIG. 20A and FIG. 20B. However, the barrel-plating QFN packaging structure in FIG. 21A also includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad, a single lead ring, and electrostatic discharge rings may be formed.

Figure 22A:
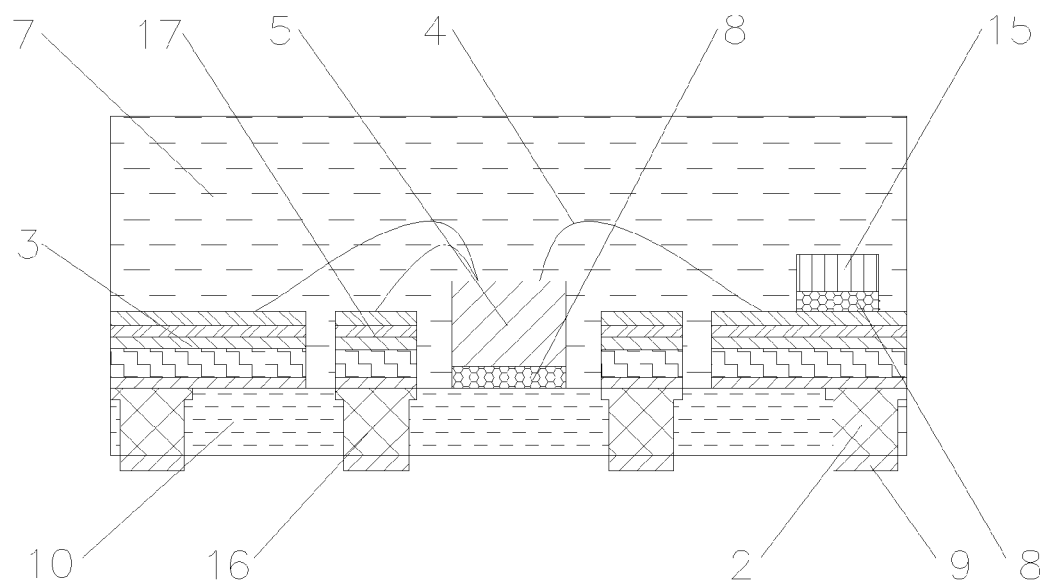
FIG. 22A is a cross-sectional view of another exemplary barrel-plating QFN packaging structure consistent with the disclosed embodiments.
Figure 22B:
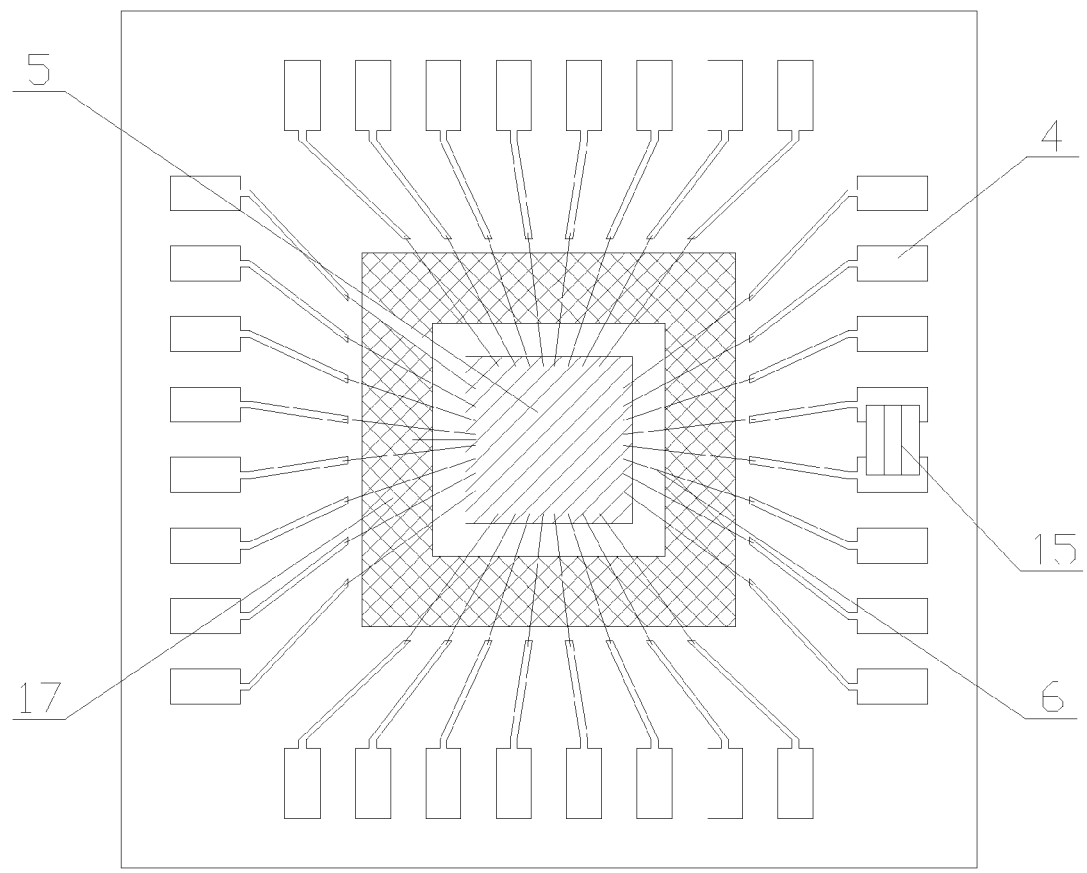
FIG. 22B is a top view of the exemplary barrel-plating QFN packaging structure of FIG. 22A.

FIG. 22A and FIG. 22B illustrate another exemplary barrel-plating QFN packaging structure. FIG. 22A is a cross-sectional view of FIG. 22B.

As shown in FIG. 22A and FIG. 22B, the barrel-plating QFN packaging structure in FIG. 22A and FIG. 22B is similar to the barrel-plating QFN packaging structure in FIG. 20A and FIG. 20B. However, the barrel-plating QFN packaging structure in FIG. 22A also includes one or more passive devices 15 coupled between inner leads 4 using the conductive or non-conductive adhesive material 8. Thus, a barrel-plating QFN packaging structure with a single lead ring coupled with passive devices and electrostatic discharge rings may be formed.

Figure 23A:
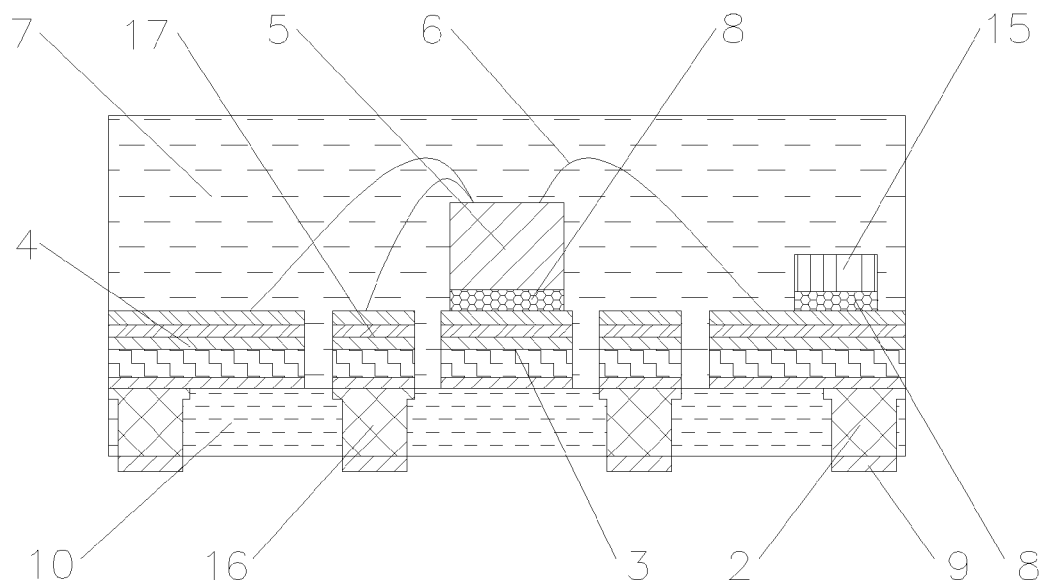
FIG. 23A is a cross-sectional view of another exemplary barrel-plating QFN packaging structure consistent with the disclosed embodiments.
Figure 23B:
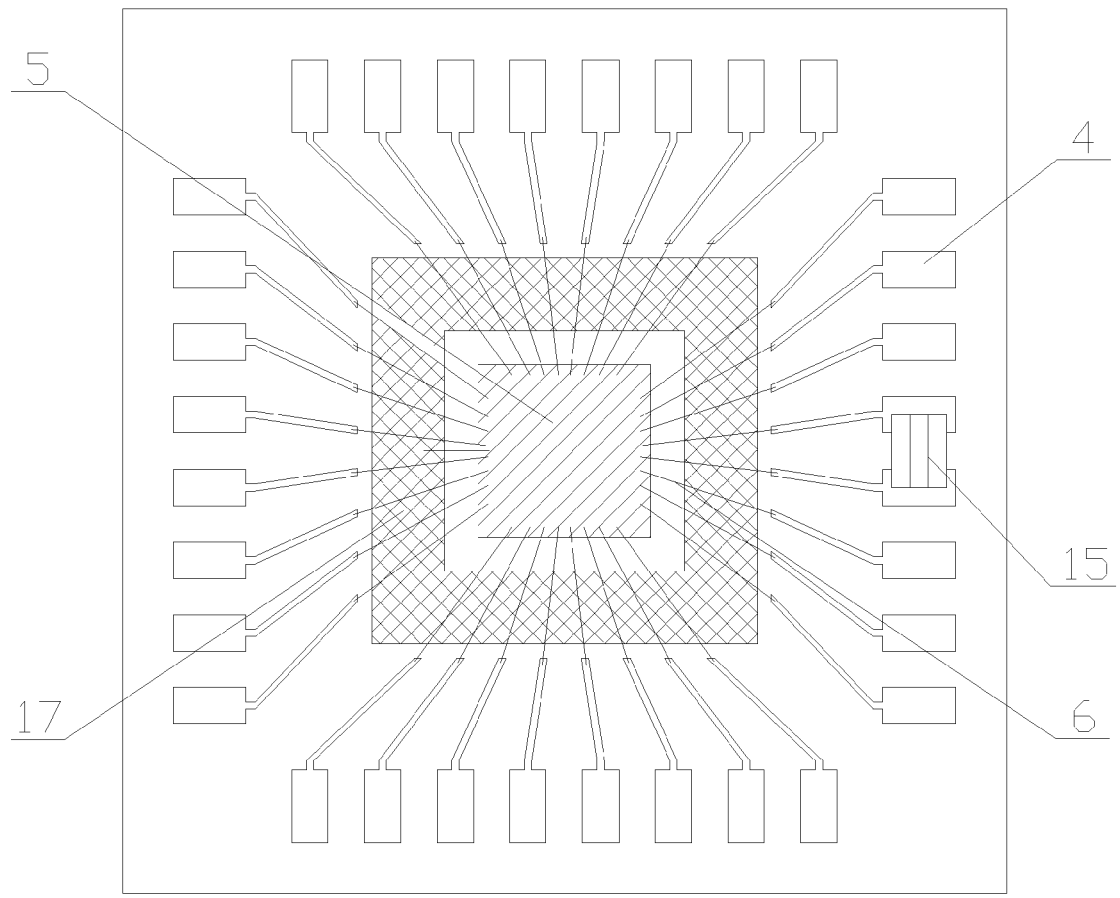
FIG. 23B is a top view of the exemplary barrel-plating QFN packaging structure of FIG. 23A.

FIG. 23A and FIG. 23B illustrate another exemplary barrel-plating QFN packaging structure. FIG. 23A is a cross-sectional view of FIG. 23B.

As shown in FIG. 23A and FIG. 23B, the barrel-plating QFN packaging structure in FIG. 23A and FIG. 23B is similar to the barrel-plating QFN packaging structure in FIG. 22A and FIG. 22B. However, the barrel-plating QFN packaging structure in FIG. 23A also includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad, a single lead ring coupled with passive devices, and electrostatic discharge rings may be formed.

Figure 24A:
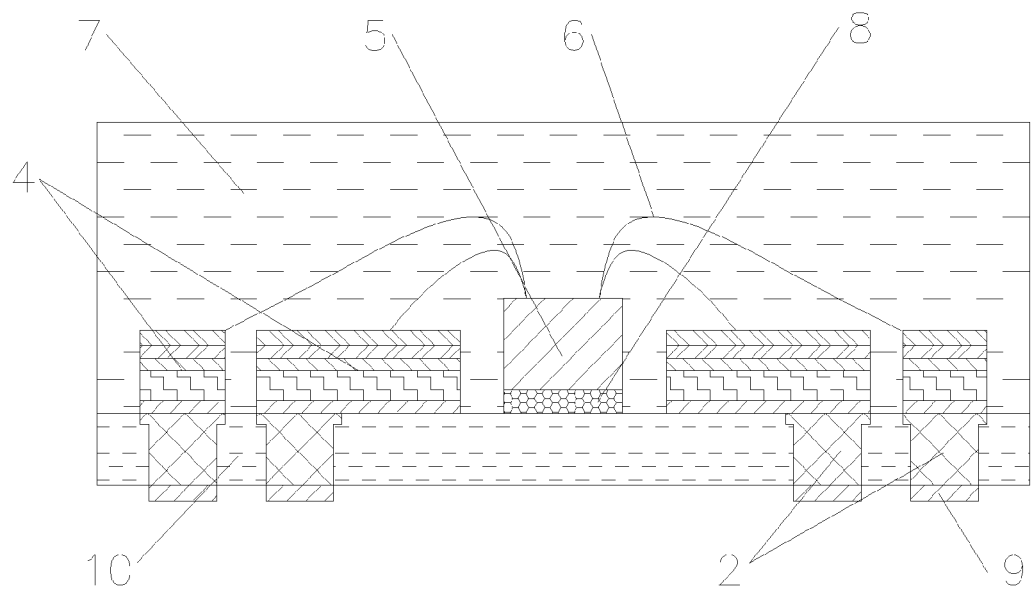
FIG. 24A is a cross-sectional view of another exemplary barrel-plating QFN packaging structure consistent with the disclosed embodiments.
Figure 24B:
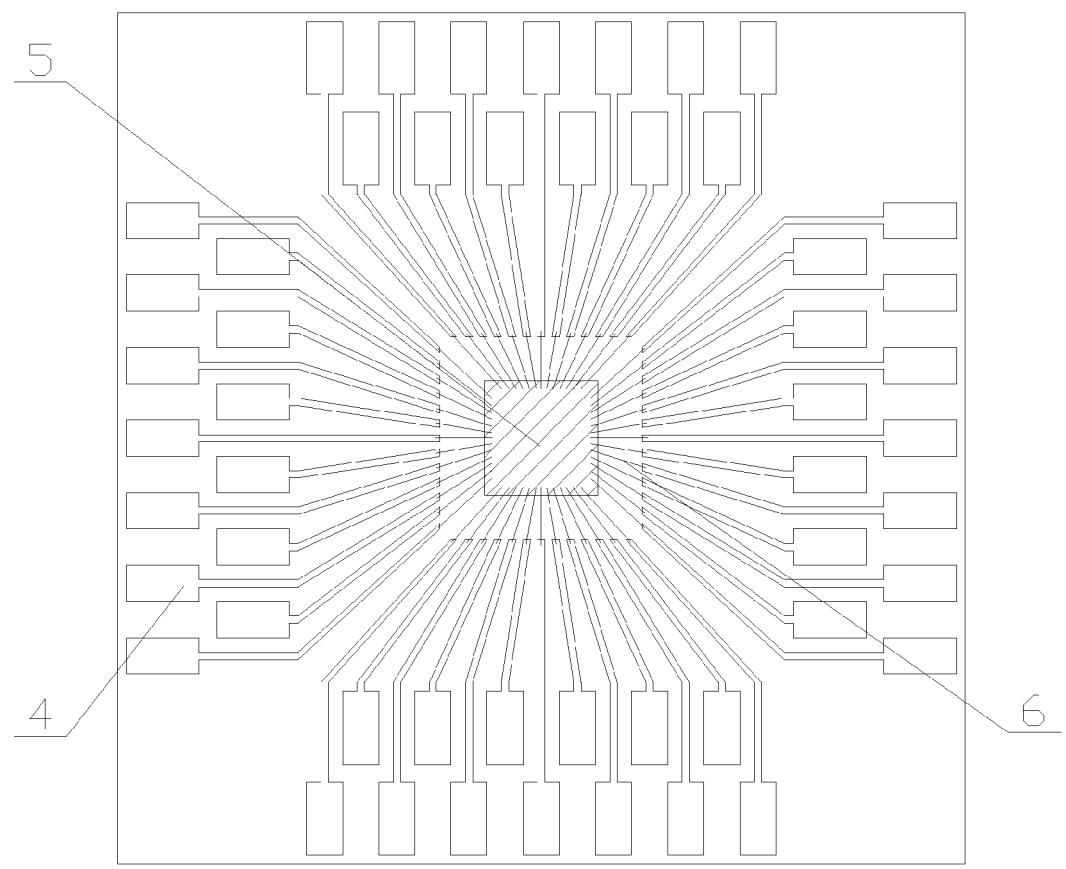
FIG. 24B is a top view of the exemplary barrel-plating QFN packaging structure of FIG. 24A.

FIG. 24A and FIG. 24B illustrate another exemplary barrel-plating QFN packaging structure. FIG. 24A is a cross-sectional view of FIG. 24B.

As shown in FIG. 24A and FIG. 24B, the barrel-plating QFN packaging structure in FIG. 24A and FIG. 24B is similar to the barrel-plating QFN packaging structure in FIG. 16A and FIG. 16B. However, the barrel-plating QFN packaging structure in FIGS. 24A and 27B includes multiple rings of I/O pads 2. In other words, I/O pads 2 are arranged in a multiple-ring configuration, and the leads in the multiple rings may be arranged in a staggered or zigzag way such that the leads and lead traces can be closely placed to the die 5. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced. Thus, a barrel-plating QFN packaging structure with multiple lead rings may be formed.

Figure 25A:
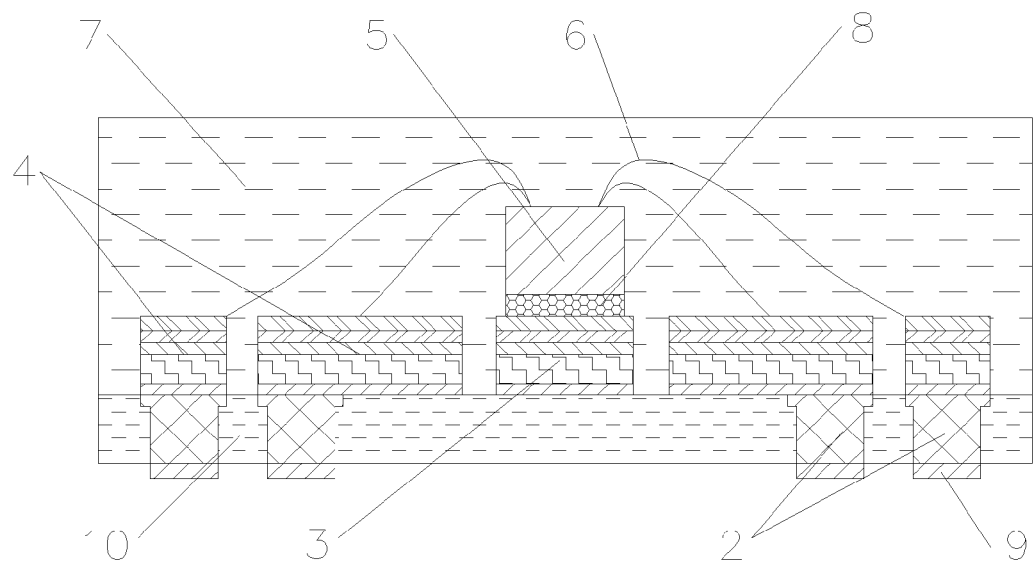
FIG. 25A is a cross-sectional view of another exemplary barrel-plating QFN packaging structure consistent with the disclosed embodiments.
Figure 25B:
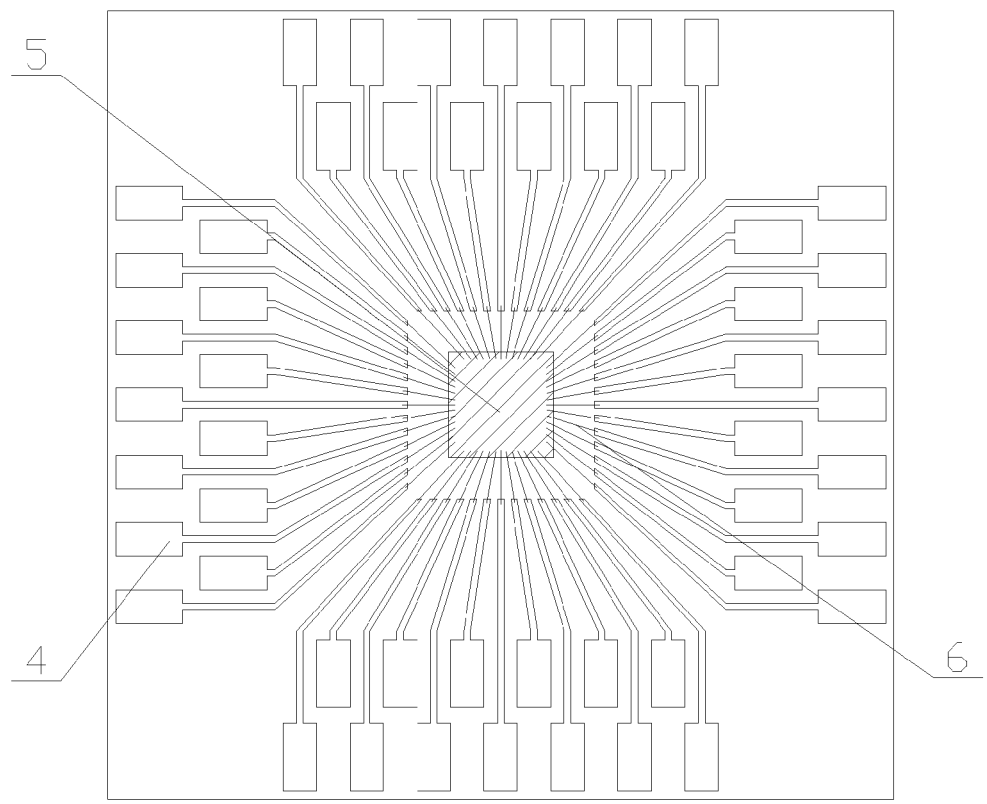
FIG. 25B is a top view of the exemplary barrel-plating QFN packaging structure of FIG. 25A.

FIG. 25A and FIG. 25B illustrate another exemplary barrel-plating QFN packaging structure. FIG. 25A is a cross-sectional view of FIG. 25B.

As shown in FIG. 25A and FIG. 25B, the barrel-plating QFN packaging structure in FIG. 25A and FIG. 25B is similar to the barrel-plating QFN packaging structure in FIG. 24A and FIG. 24B. However, the barrel-plating QFN packaging structure in FIGS. 25A and 28B includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad and multiple lead rings may be formed.

Figure 26A:
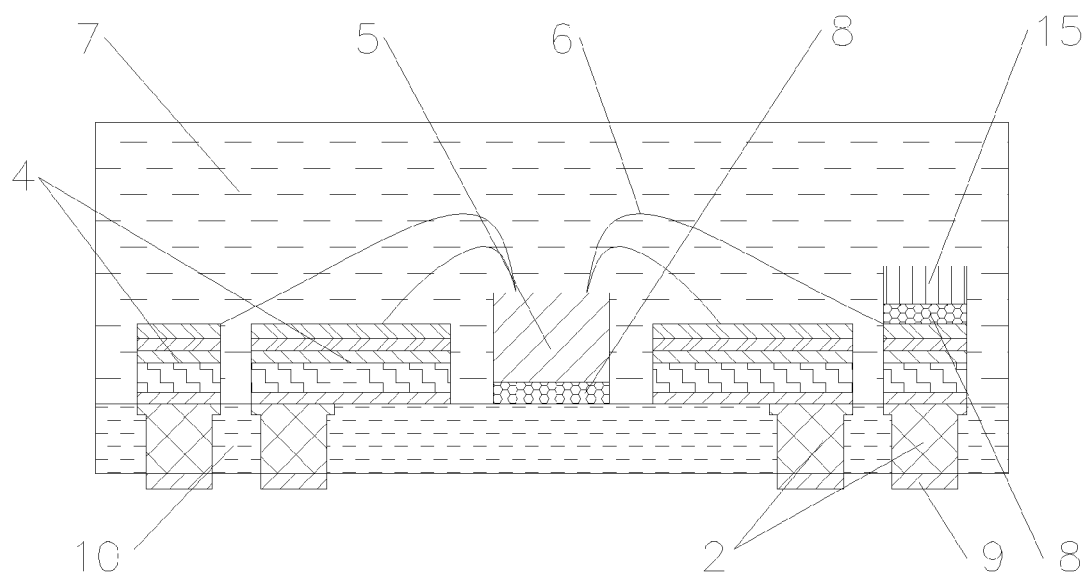
FIG. 26A is a cross-sectional view of another exemplary barrel-plating QFN packaging structure consistent with the disclosed embodiments.
Figure 26B:
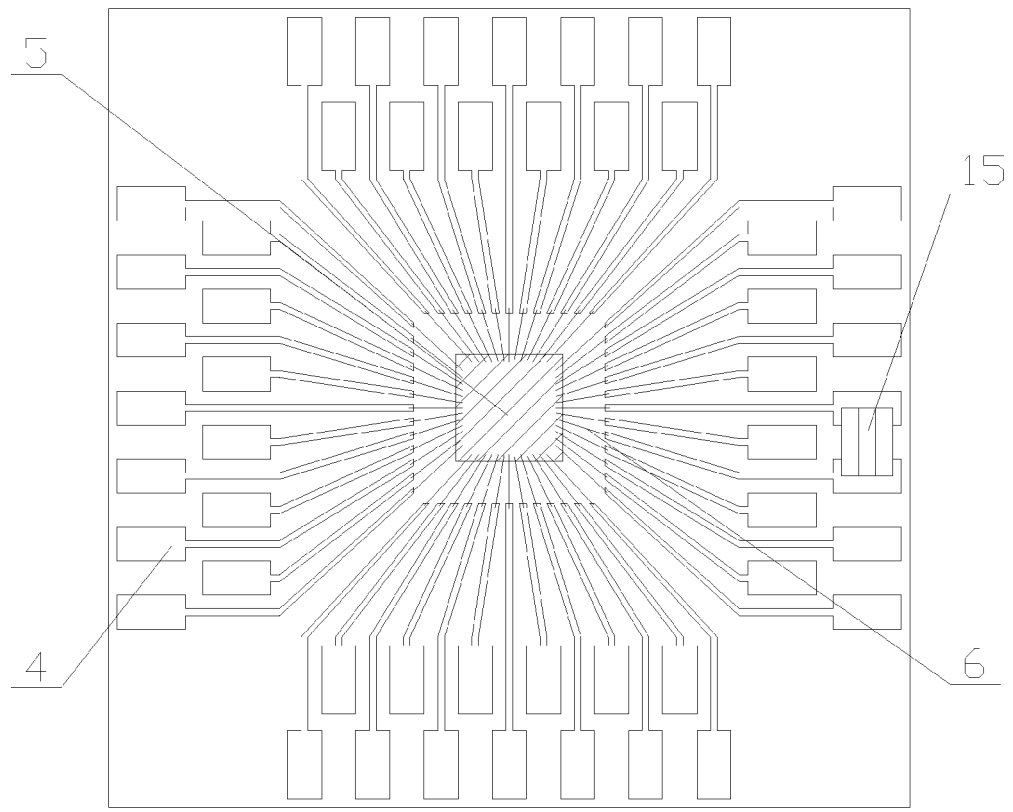
FIG. 26B is a top view of the exemplary barrel-plating QFN packaging structure of FIG. 26A.

FIG. 26A and FIG. 26B illustrate another exemplary barrel-plating QFN packaging structure. FIG. 26A is a cross-sectional view of FIG. 26B.

As shown in FIG. 26A and FIG. 26B, the barrel-plating QFN packaging structure in FIG. 26A and FIG. 26B is similar to the barrel-plating QFN packaging structure in FIG. 24A and FIG. 24B. However, the barrel-plating QFN packaging structure in FIGS. 26A and 29B includes one or more passive devices 15 coupled between the inner leads 4 using the conductive or non-conductive adhesive material 8. Thus, a barrel-plating QFN packaging structure with multiple lead rings coupled with passive devices may be formed.

Figure 27A:
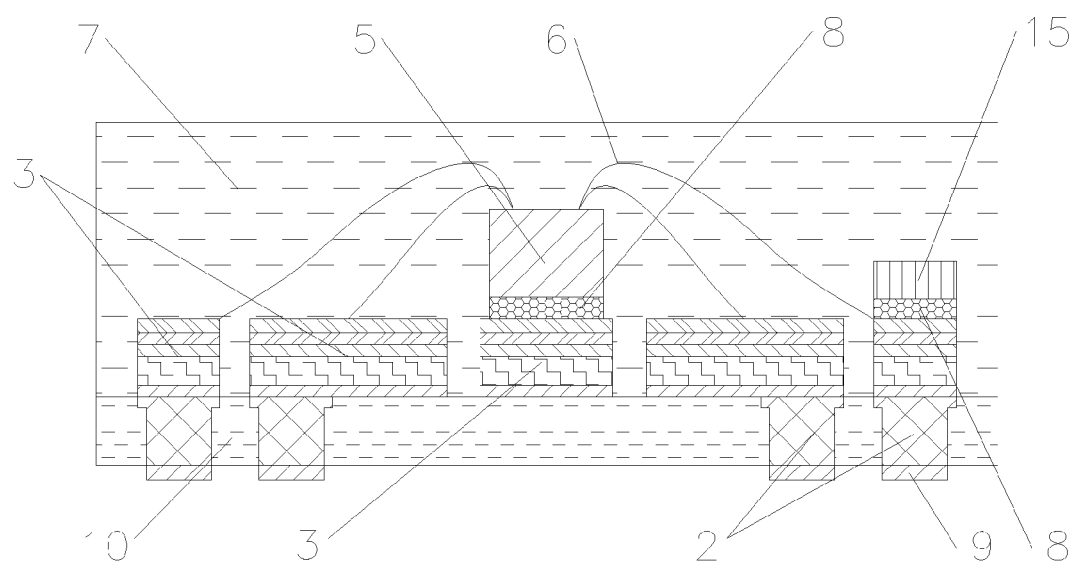
FIG. 27A is a cross-sectional view of another exemplary barrel-plating QFN packaging structure consistent with the disclosed embodiments.
Figure 27B:
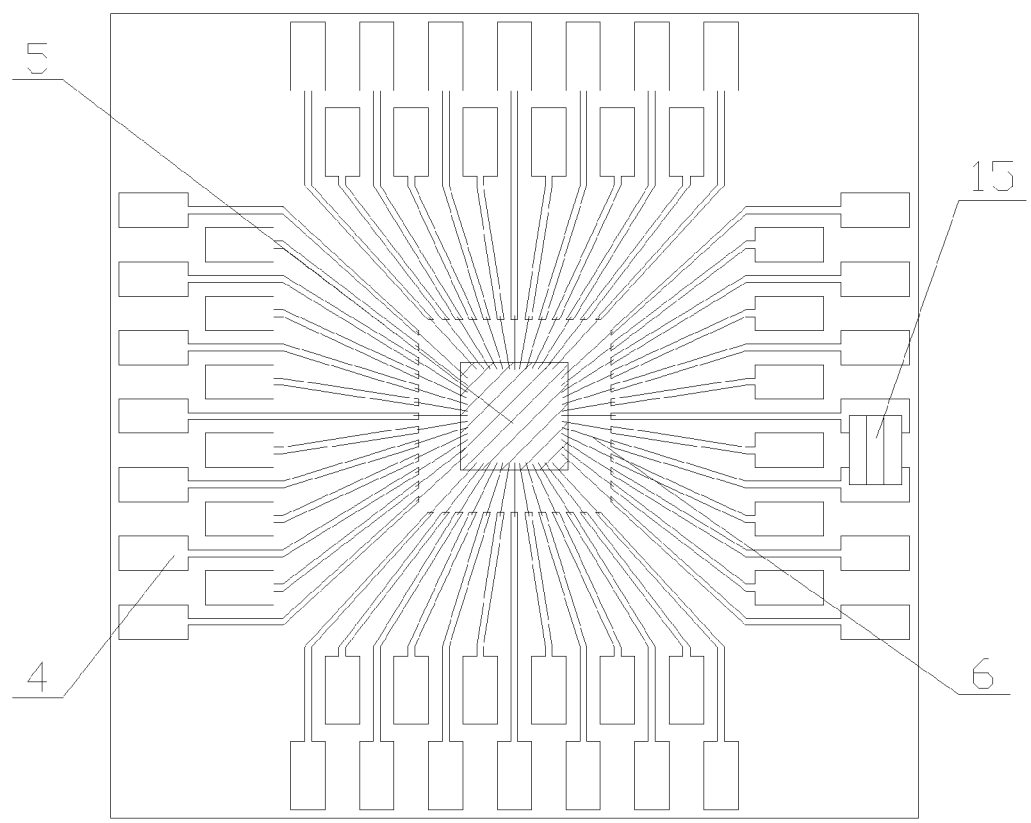
FIG. 27B is a top view of the exemplary barrel-plating QFN packaging structure of FIG. 27A.

FIG. 27A and FIG. 27B illustrate another exemplary barrel-plating QFN packaging structure. FIG. 27A is a cross-sectional view of FIG. 27B.

As shown in FIG. 27A and FIG. 27B, the barrel-plating QFN packaging structure in FIG. 27A and FIG. 27B is similar to the barrel-plating QFN packaging structure in FIG. 26A and FIG. 26B. However, the barrel-plating QFN packaging structure in FIGS. 27A and 30B includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with inner die pad and multiple lead rings coupled with passive devices may be formed.

Figure 28A:
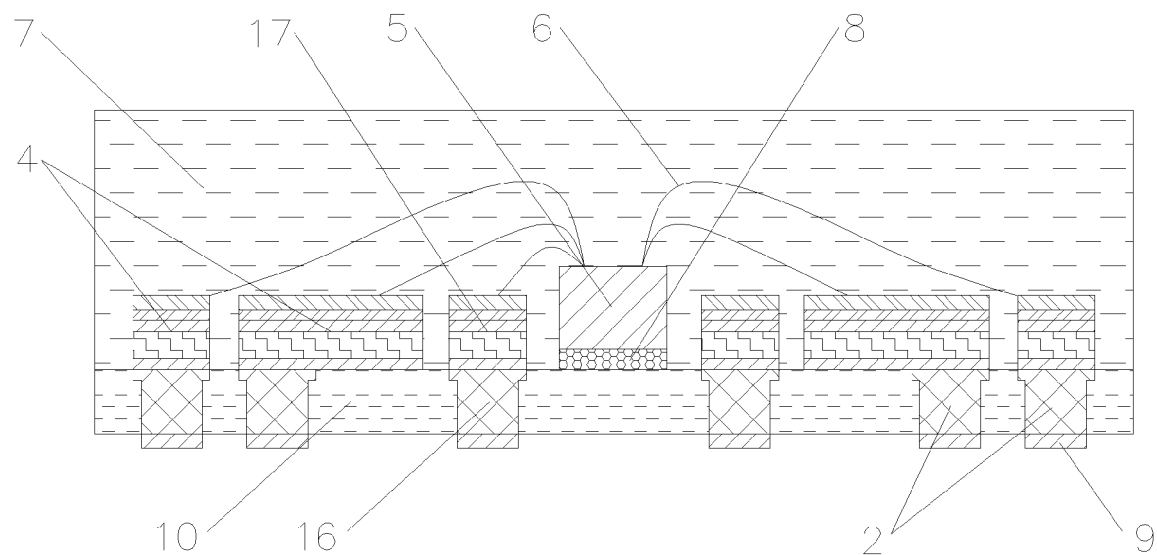
FIG. 28A is a cross-sectional view of another exemplary barrel-plating QFN packaging structure consistent with the disclosed embodiments.
Figure 28B:
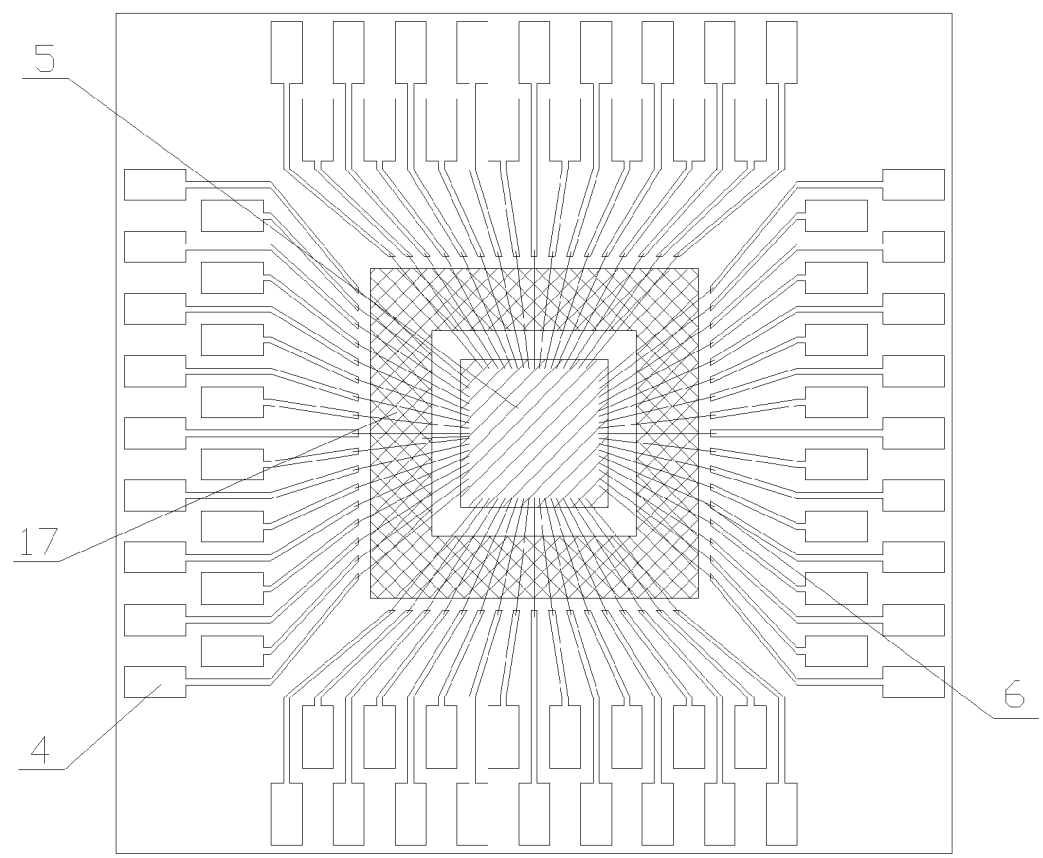
FIG. 28B is a top view of the exemplary barrel-plating QFN packaging structure of FIG. 28A.

FIG. 28A and FIG. 28B illustrate another exemplary barrel-plating QFN packaging structure. FIG. 28A is a cross-sectional view of FIG. 28B.

As shown in FIG. 28A and FIG. 28B, the barrel-plating QFN packaging structure in FIG. 28A and FIG. 28B is similar to the barrel-plating QFN packaging structure in FIG. 24A and FIG. 24B. However, the barrel-plating QFN packaging structure in FIGS. 28A and 31B includes an outer electrostatic discharge ring 16, and an inner electrostatic discharge ring 17 may be formed on the top surface of the outer electrostatic discharge ring 16 within the I/O pad ring. That is, the inner electrostatic discharge ring 17 may also be formed by the multi-layer plating process for forming the first metal layer 14. More particularly, the inner electrostatic discharge ring 17 may be arranged between the die 5 and the inner leads 4. Further, the top surface of the die 5 is connected to the top surface of the inner electrostatic discharge ring 17 by the metal wire 6 such that the die 5 may be protected from stationary electric charges by the inner and outer electrostatic discharge rings 17 and 16. Second metal layer 9 may also be formed on the back surface of the outer electrostatic discharge ring 16. Thus, a barrel-plating QFN packaging structure with multiple lead rings and electrostatic discharge rings may be formed.

Figure 29A:
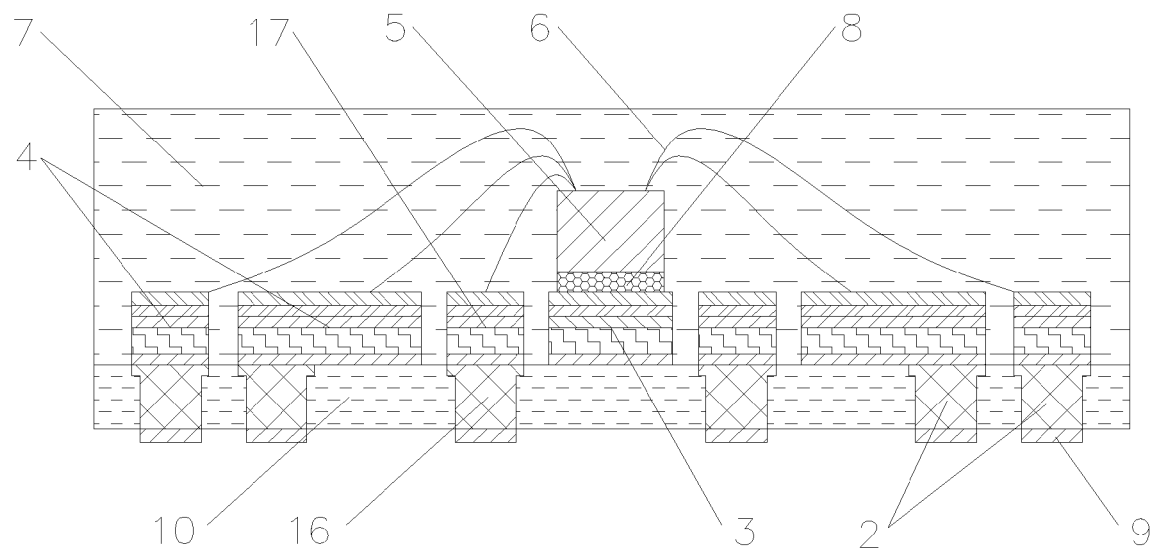
FIG. 29A is a cross-sectional view of another exemplary barrel-plating QFN packaging structure consistent with the disclosed embodiments.
Figure 29B:
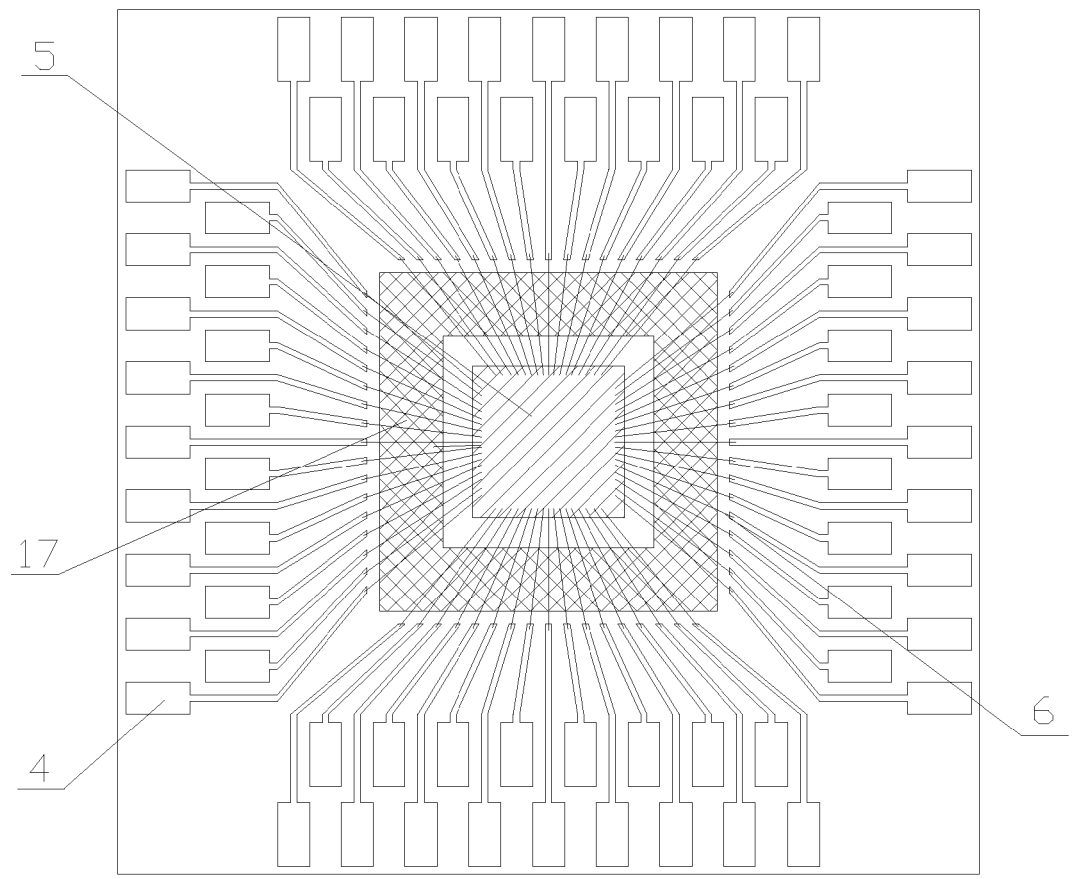
FIG. 29B is a top view of the exemplary barrel-plating QFN packaging structure of FIG. 29A.

FIG. 29A and FIG. 29B illustrate another exemplary barrel-plating QFN packaging structure. FIG. 29A is a cross-sectional view of FIG. 29B.

As shown in FIG. 29A and FIG. 29B, the barrel-plating QFN packaging structure in FIG. 29A and FIG. 29B is similar to the barrel-plating QFN packaging structure in FIG. 28A and FIG. 28B. However, the barrel-plating QFN packaging structure in FIGS. 29A and 32B includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad, multiple lead rings, and electrostatic discharge rings may be formed.

Figure 30A:
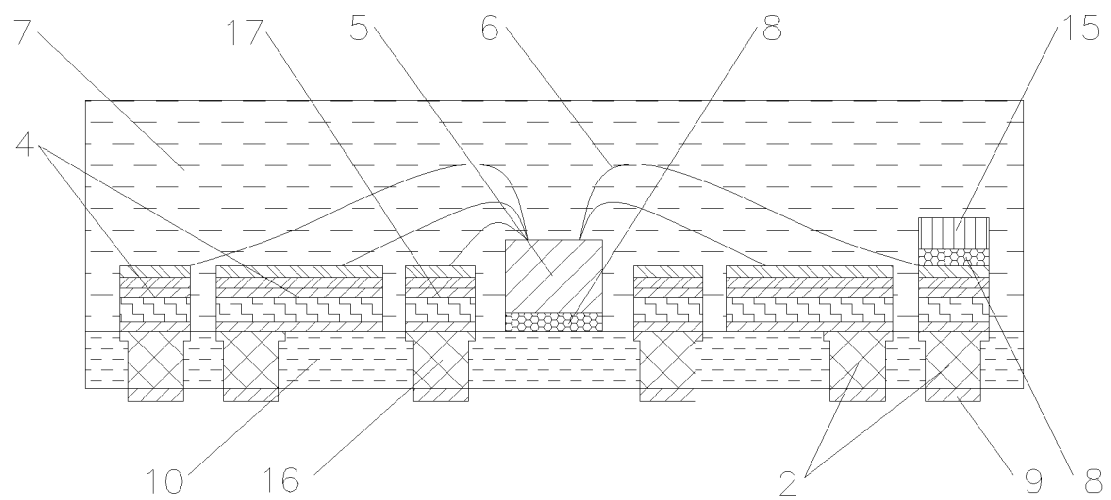
FIG. 30A is a cross-sectional view of another exemplary barrel-plating QFN packaging structure consistent with the disclosed embodiments.
Figure 30B:
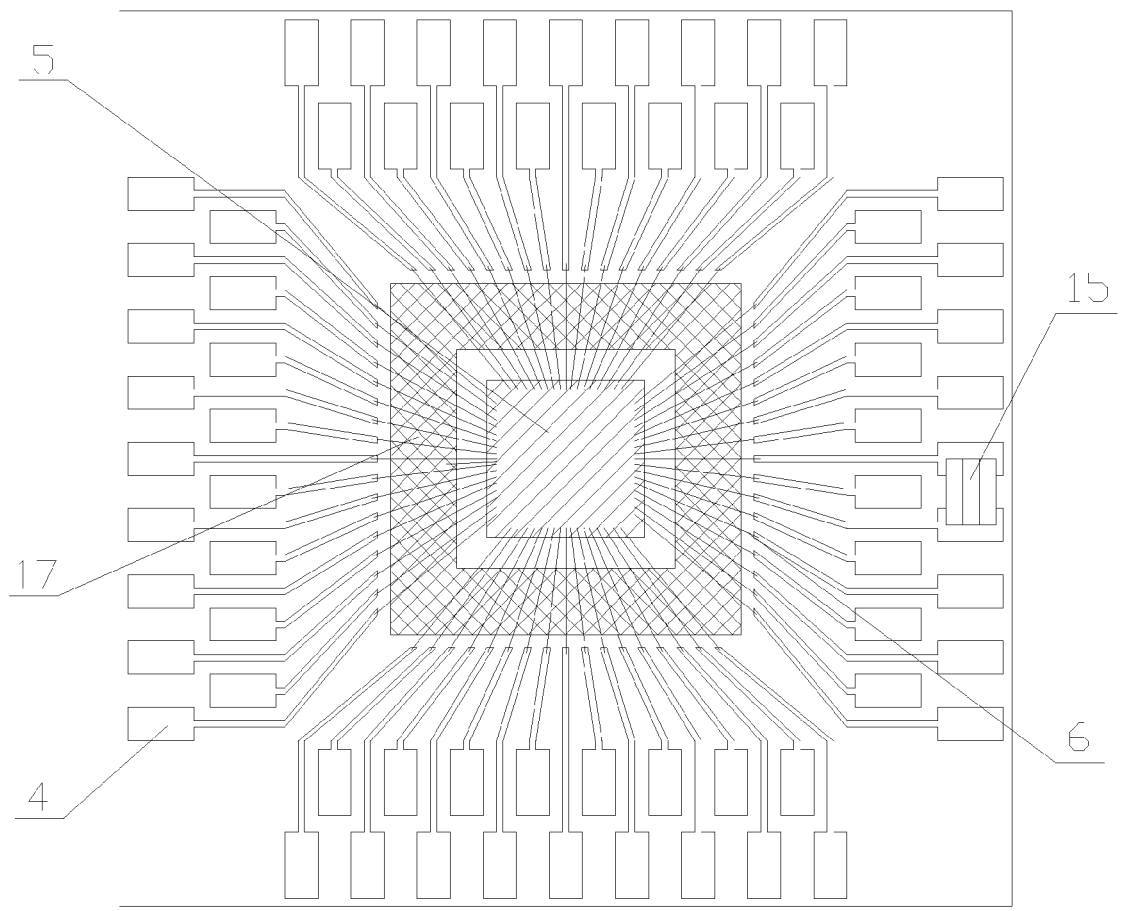
FIG. 30B is a top view of the exemplary barrel-plating QFN packaging structure of FIG. 30A.

FIG. 30A and FIG. 30B illustrate another exemplary barrel-plating QFN packaging structure. FIG. 30A is a cross-sectional view of FIG. 30B.

As shown in FIG. 30A and FIG. 30B, the barrel-plating QFN packaging structure in FIG. 30A and FIG. 30B is similar to the barrel-plating QFN packaging structure in FIG. 28A and FIG. 28B. However, the barrel-plating QFN packaging structure in FIGS. 30A and 33B includes one or more passive devices 15 coupled between the inner leads 4 using conductive or non-conductive adhesive material 8. Thus, a barrel-plating QFN packaging structure with multiple lead rings coupled with passive devices, and electrostatic discharge rings may be formed.

Figure 31A:
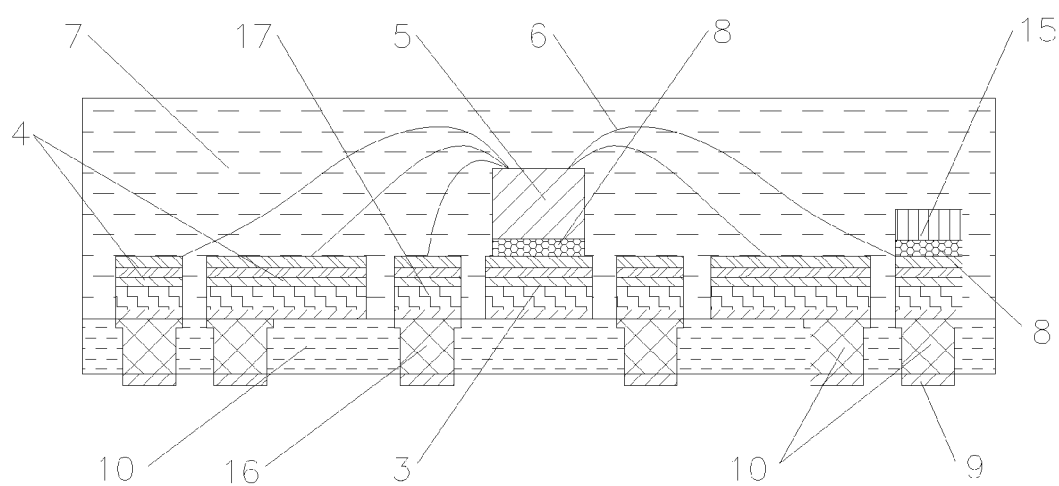
FIG. 31A is a cross-sectional view of another exemplary barrel-plating QFN packaging structure consistent with the disclosed embodiments.
Figure 31B:
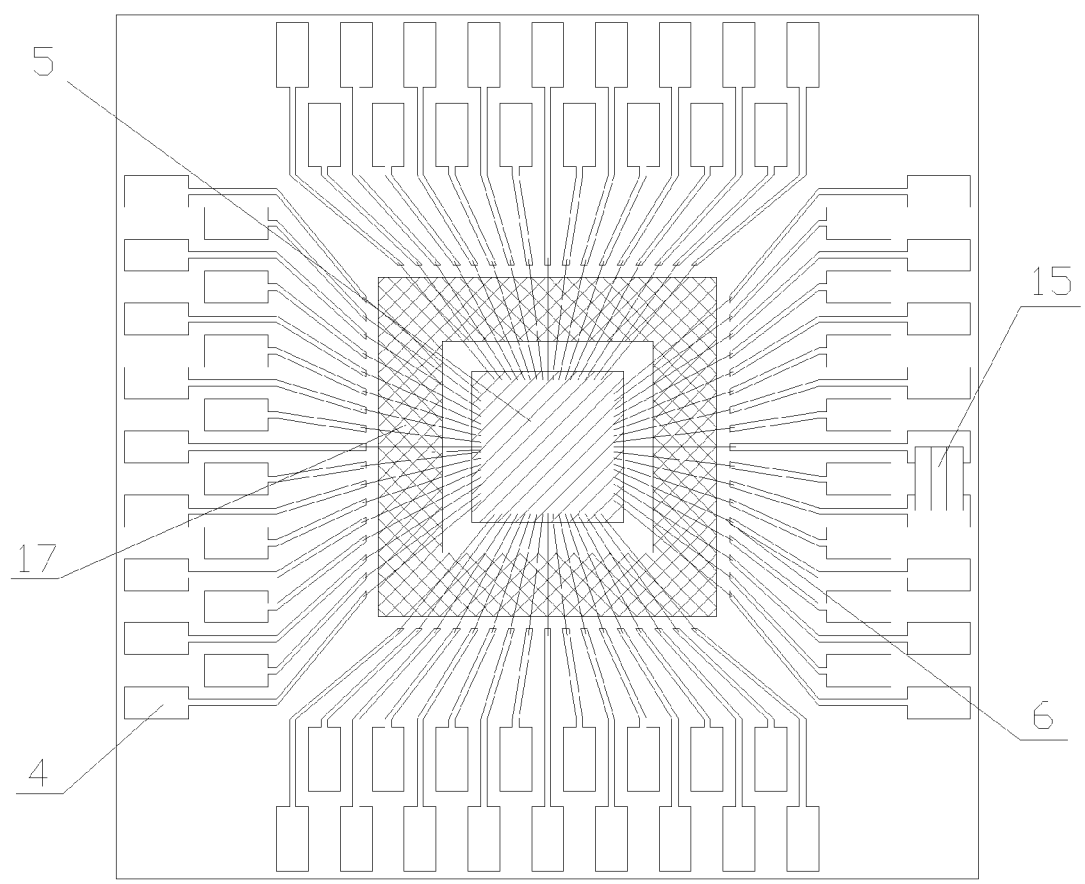
FIG. 31B is a top view of the exemplary barrel-plating QFN packaging structure of FIG. 31A.

FIG. 31A and FIG. 31B illustrate another exemplary barrel-plating QFN packaging structure. FIG. 31A is a cross-sectional view of FIG. 31B.

As shown in FIG. 31A and FIG. 31B, the barrel-plating QFN packaging structure in FIG. 31A and FIG. 31B is similar to the barrel-plating QFN packaging structure in FIG. 30A and FIG. 30B. However, the barrel-plating QFN packaging structure in FIGS. 31A and 34B includes an inner die pad 3 formed on the predetermined area for attaching the die 5 or within a ring or rings of inner leads 4. The inner die pad 3 may also be formed by the multi-layer plating process for forming the inner leads 4. Thus, the inner die pad 3 may also be included in the first metal layer 14. Further, the die 5 is attached at the top surface of the inner die pad 3 via the conductive or non-conductive adhesive material 8. Thus, a barrel-plating QFN packaging structure with an inner die pad, multiple lead rings coupled with passive devices, and electrostatic discharge rings may be formed.

Figure 32A:
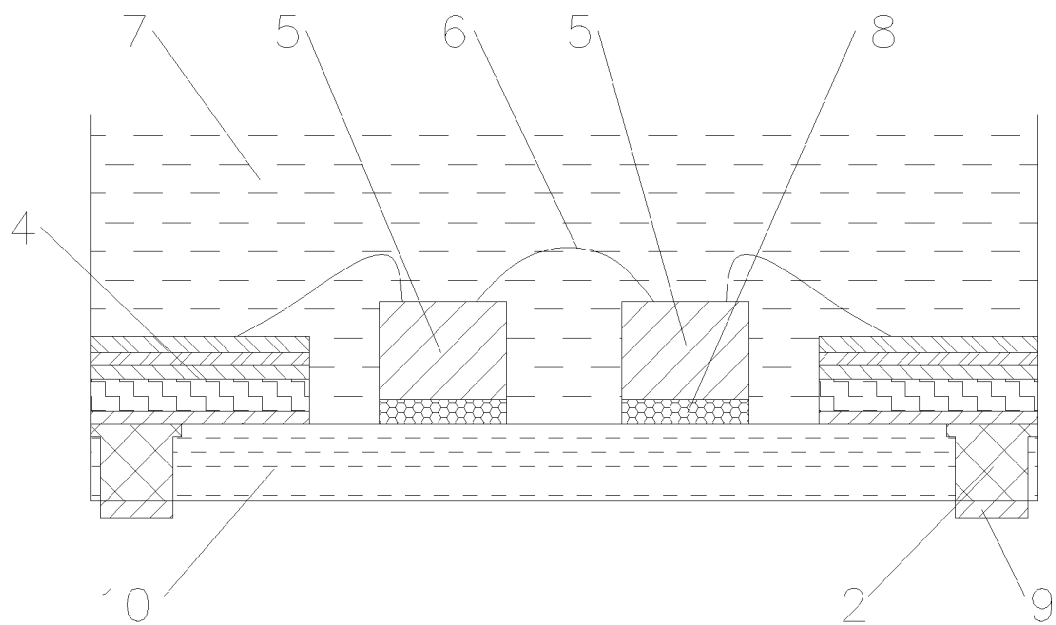
FIG. 32A is a cross-sectional view of another exemplary barrel-plating QFN packaging structure consistent with the disclosed embodiments.
Figure 32B:
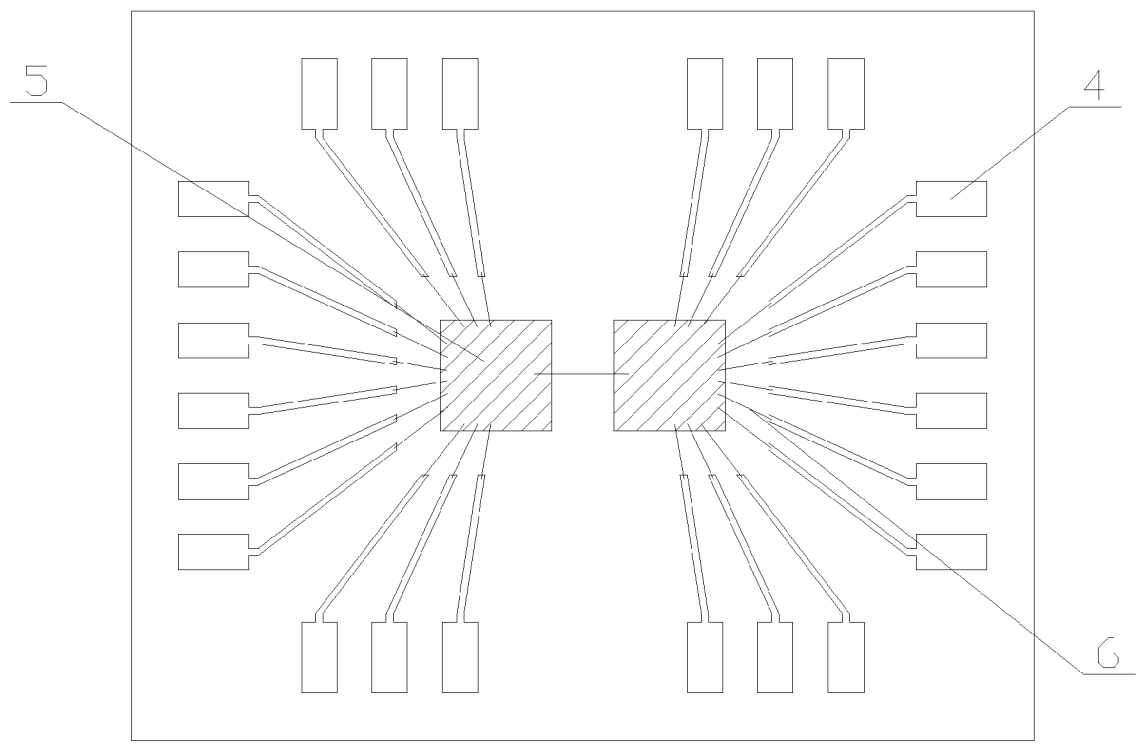
FIG. 32B is a top view of the exemplary barrel-plating QFN packaging structure of FIG. 32A.

FIG. 32A and FIG. 32B illustrate another exemplary barrel-plating QFN packaging structure. FIG. 32A is a cross-sectional view of FIG. 32B.

As shown in FIG. 32A and FIG. 32B, the barrel-plating QFN packaging structure in FIG. 32A and FIG. 32B is similar to the barrel-plating QFN packaging structure in FIG. 16A and FIG. 16B. However, the barrel-plating QFN packaging structure in FIGS. 32A and 35B includes a plurality of dies 5. Each of the plurality of dies 5 is attached on predetermined areas on the substrate or other planar supporting structure or within the ring or rings of inner leads 4 by the conductive or non-conductive adhesive material 8. For example, a second die 5 is arranged in a side-by-side configuration with respect to the first die 5, and both of the dies 5 are arranged within the ring or rings of inner leads 4. Further, the top surface of each die 5 may be connected by the metal wires 6. Thus, a barrel-plating QFN packaging structure with multiple dies and a single lead ring may be formed.

Figure 33A:
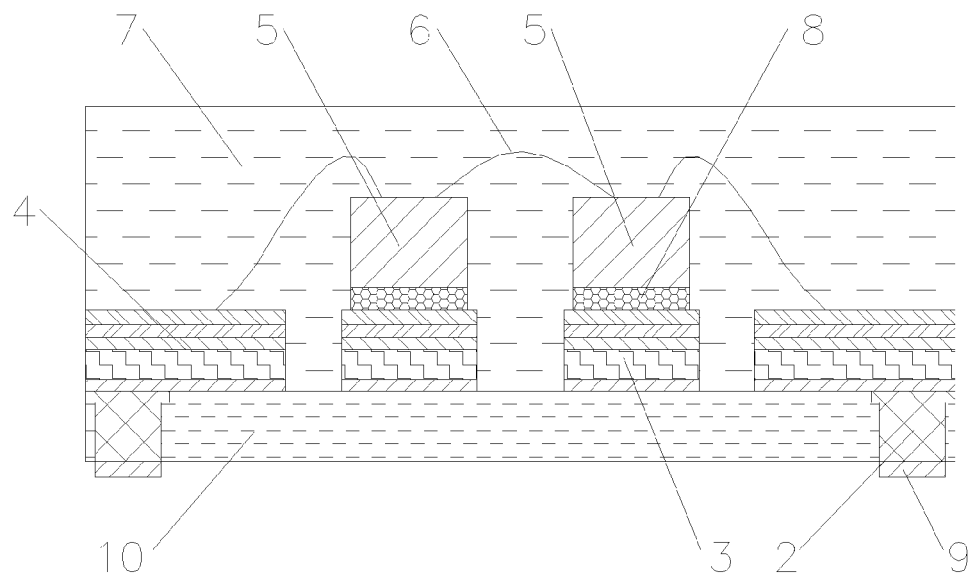
FIG. 33A is a cross-sectional view of another exemplary barrel-plating QFN packaging structure consistent with the disclosed embodiments.
Figure 33B:
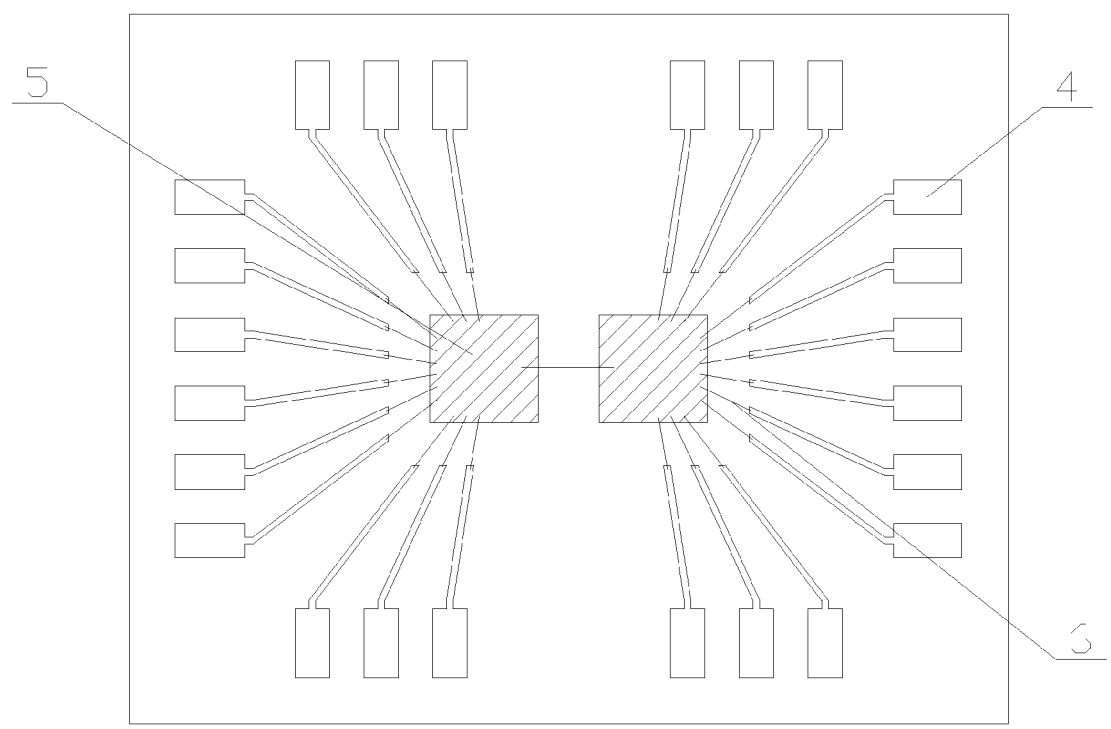
FIG. 33B is a top view of the exemplary barrel-plating QFN packaging structure of FIG. 33A.

FIG. 33A and FIG. 33B illustrate another exemplary barrel-plating QFN packaging structure. FIG. 33A is a cross-sectional view of FIG. 33B.

As shown in FIG. 33A and FIG. 33B, the barrel-plating QFN packaging structure in FIG. 33A and FIG. 33B is similar to the barrel-plating QFN packaging structure in FIG. 32A and FIG. 32B. However, the barrel-plating QFN packaging structure in FIGS. 33A and 36B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, and a single lead ring may be formed.

Figure 34A:
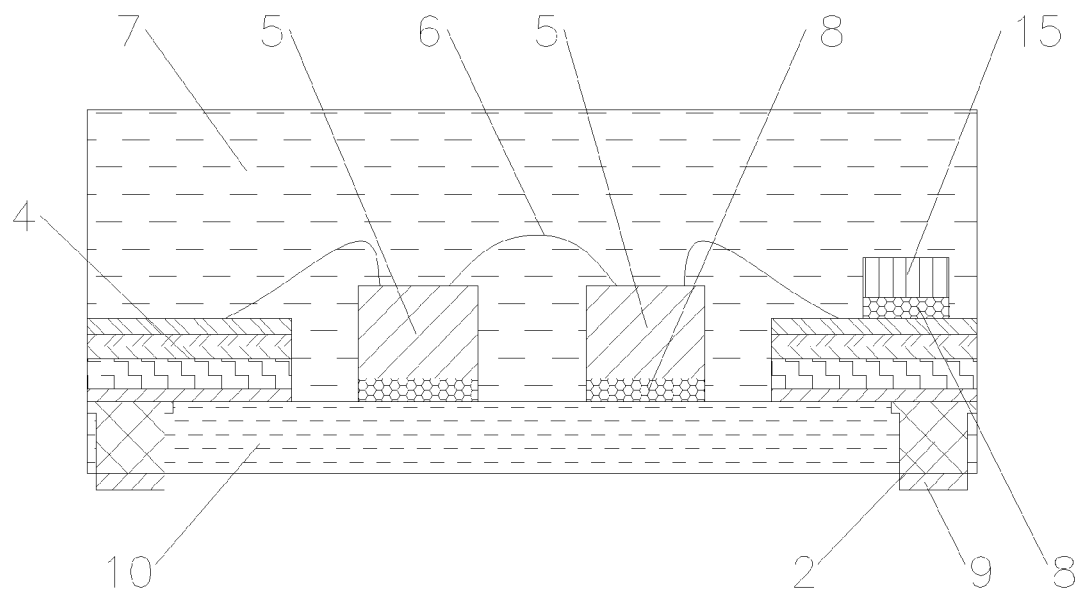
FIG. 34A is a cross-sectional view of another exemplary barrel-plating QFN packaging structure consistent with the disclosed embodiments.
Figure 34B:
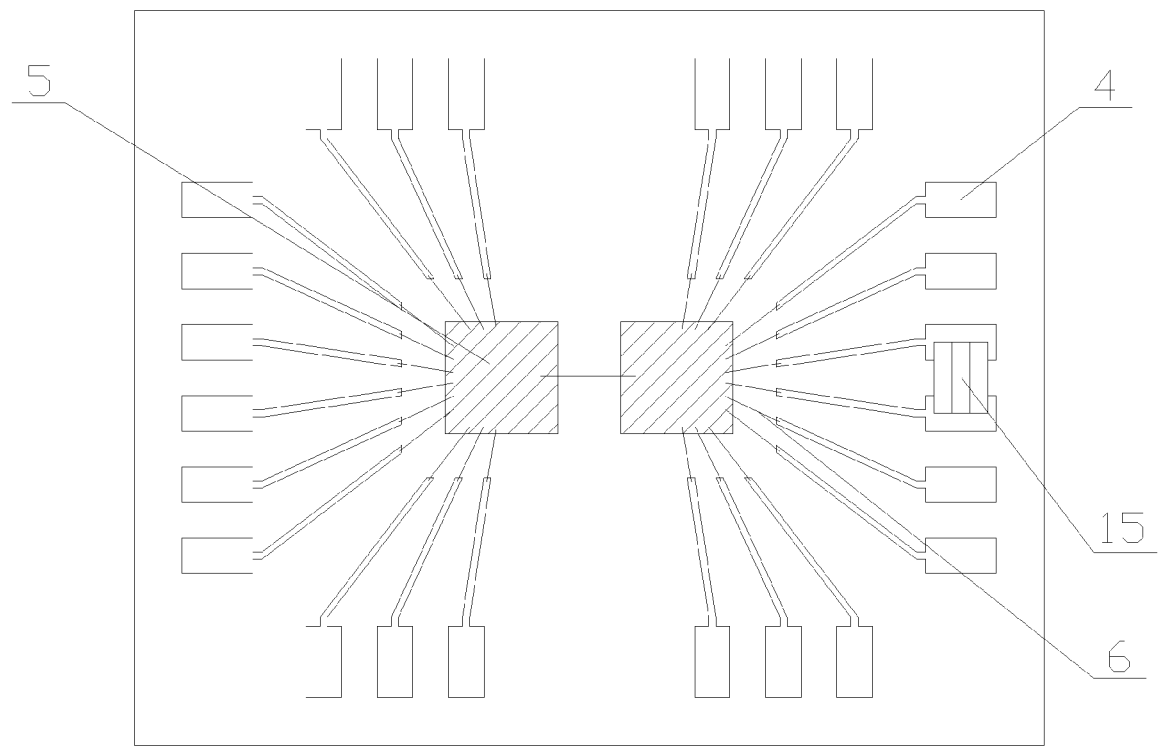
FIG. 34B is a top view of the exemplary barrel-plating QFN packaging structure of FIG. 34A.

FIG. 34A and FIG. 34B illustrate another exemplary barrel-plating QFN packaging structure. FIG. 34A is a cross-sectional view of FIG. 34B.

As shown in FIG. 34A and FIG. 34B, the barrel-plating QFN packaging structure in FIG. 34A and FIG. 34B is similar to the barrel-plating QFN packaging structure in FIG. 18A and FIG. 18B. However, the barrel-plating QFN packaging structure in FIGS. 34A and 37B includes a plurality of dies 5. Each of the plurality of dies 5 is attached on predetermined areas on the substrate or other planar supporting structure or within the ring or rings of inner leads 4 by the conductive or non-conductive adhesive material 8. For example, a second die 5 is arranged in a side-by-side configuration with respect to the first die 5, and both of the dies 5 are arranged within the ring or rings of inner leads 4. Further, the top surface of each die 5 may be connected by the metal wires 6. Other configurations may also be used. Thus, a barrel-plating QFN packaging structure with multiple dies and a single lead ring coupled with passive devices may be formed.

Figure 35A:
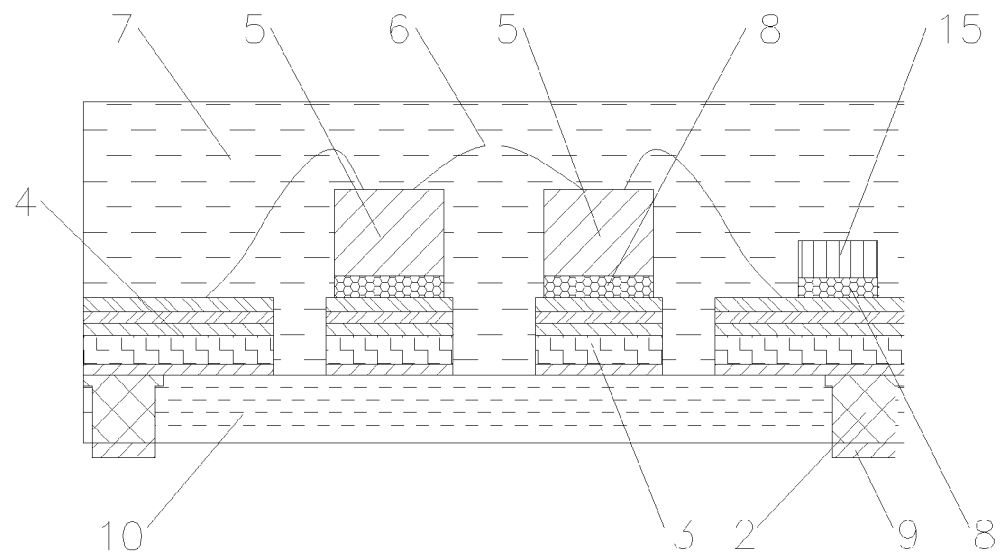
FIG. 35A is a cross-sectional view of another exemplary barrel-plating QFN packaging structure consistent with the disclosed embodiments.
Figure 35B:
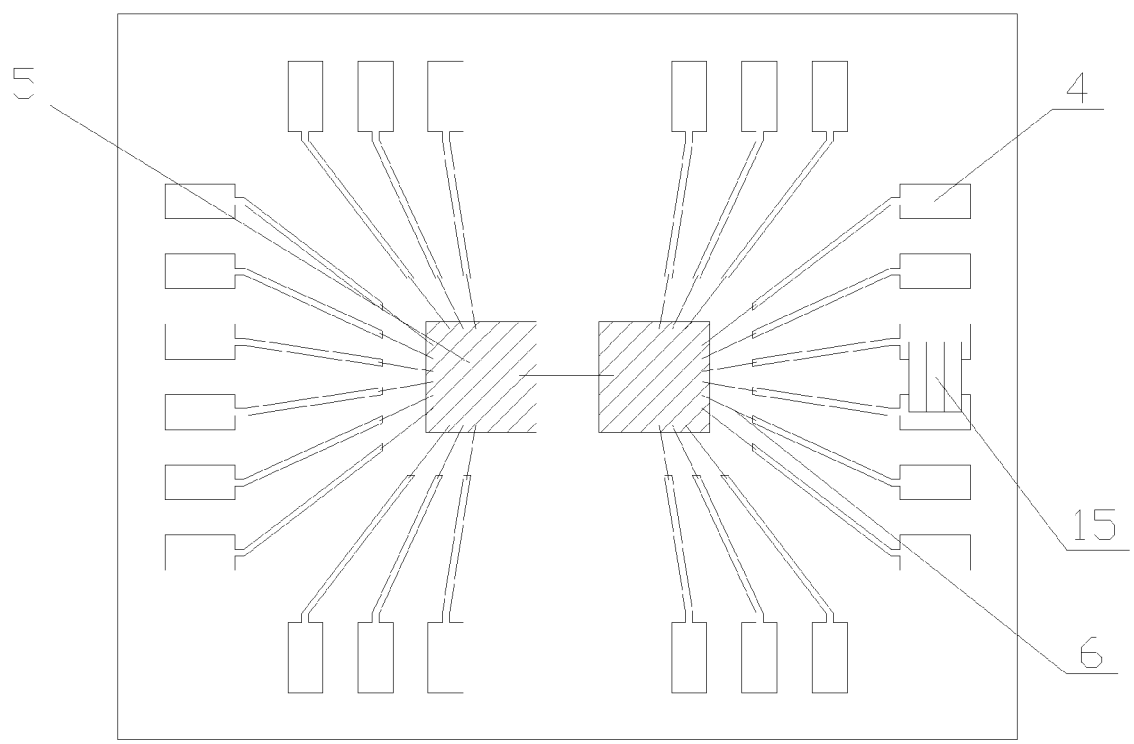
FIG. 35B is a top view of the exemplary barrel-plating QFN packaging structure of FIG. 35A.

FIG. 35A and FIG. 35B illustrate another exemplary barrel-plating QFN packaging structure. FIG. 35A is a cross-sectional view of FIG. 35B.

As shown in FIG. 35A and FIG. 35B, the barrel-plating QFN packaging structure in FIG. 35A and FIG. 35B is similar to the barrel-plating QFN packaging structure in FIG. 34A and FIG. 34B. However, the barrel-plating QFN packaging structure in FIGS. 35A and 38B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, and a single lead ring coupled with passive devices may be formed.

Figure 36A:
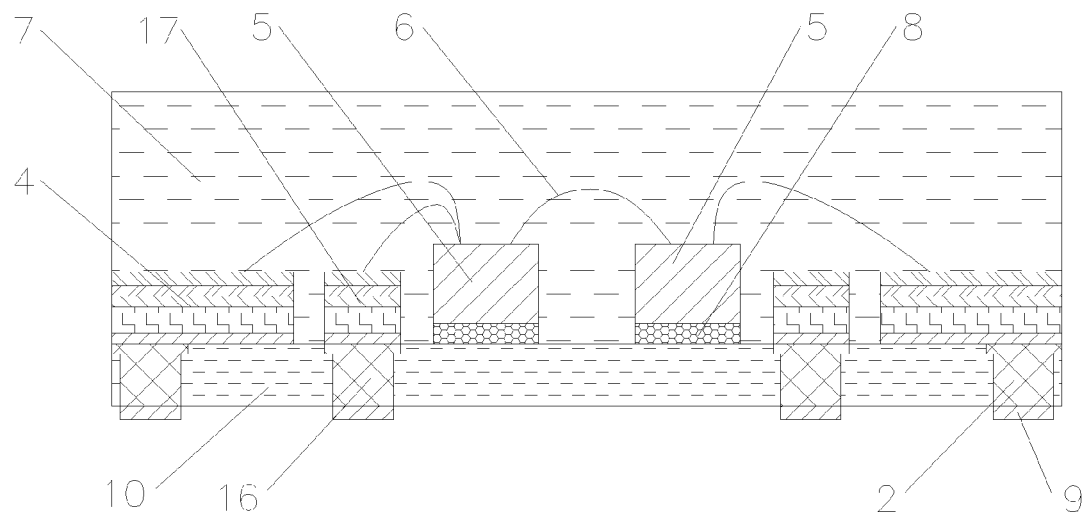
FIG. 36A is a cross-sectional view of another exemplary barrel-plating QFN packaging structure consistent with the disclosed embodiments.
Figure 36B:
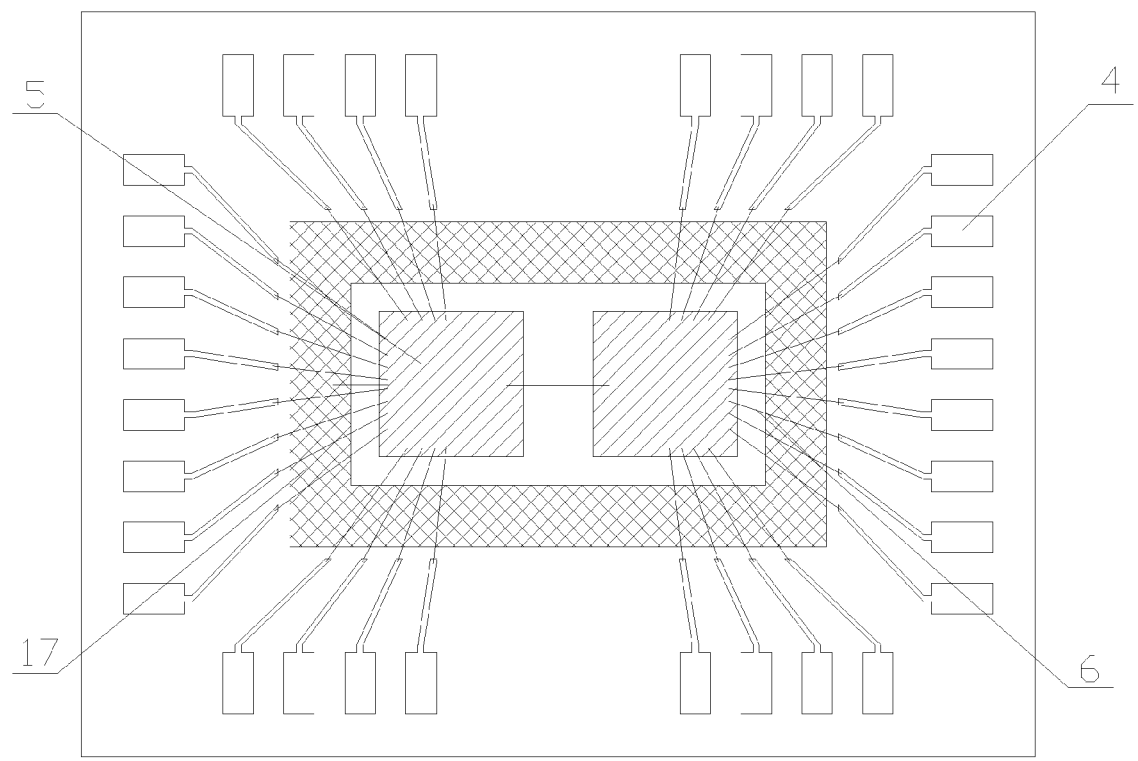
FIG. 36B is a top view of the exemplary barrel-plating QFN packaging structure of FIG. 36A.

FIG. 36A and FIG. 36B illustrate another exemplary barrel-plating QFN packaging structure. FIG. 36A is a cross-sectional view of FIG. 36B.

As shown in FIG. 36A and FIG. 36B, the barrel-plating QFN packaging structure in FIG. 36A and FIG. 36B is similar to the barrel-plating QFN packaging structure in FIG. 20A and FIG. 20B. However, the barrel-plating QFN packaging structure in FIGS. 36A and 39B includes a plurality of dies 5. Each of the plurality of dies 5 is attached on predetermined areas on the substrate or other planar supporting structure or within the ring or rings of inner leads 4 by the conductive or non-conductive adhesive material 8. For example, a second die 5 is arranged in a side-by-side configuration with respect to the first die 5, and both of the dies 5 are arranged within the ring or rings of inner leads 4. Further, the top surface of each die 5 may be connected by the metal wires 6. Other configurations may also be used. Thus, a barrel-plating QFN packaging structure with multiple dies, a single lead ring, and electrostatic discharge rings may be formed.

Figure 37A:
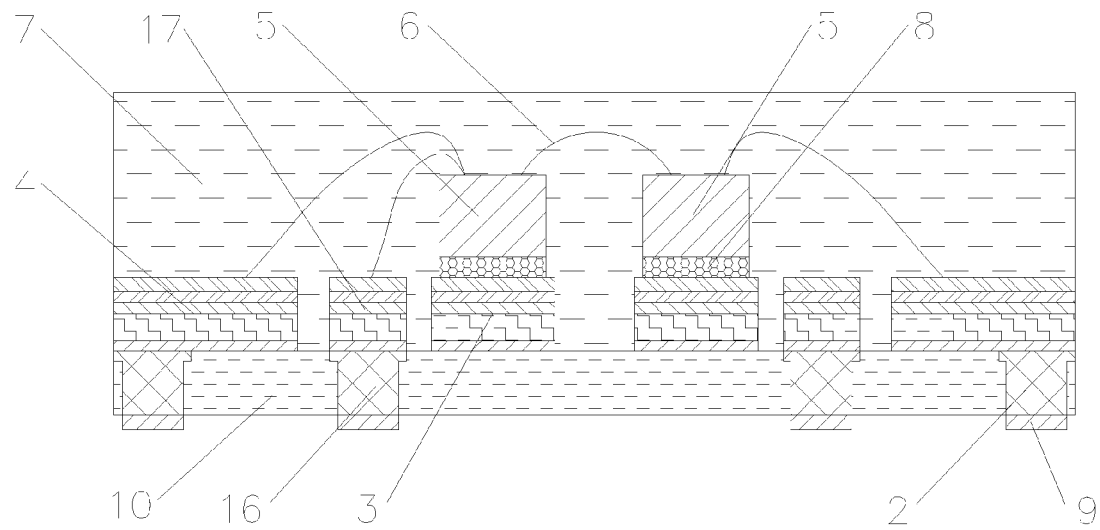
FIG. 37A is a cross-sectional view of another exemplary barrel-plating QFN packaging structure consistent with the disclosed embodiments.
Figure 37B:
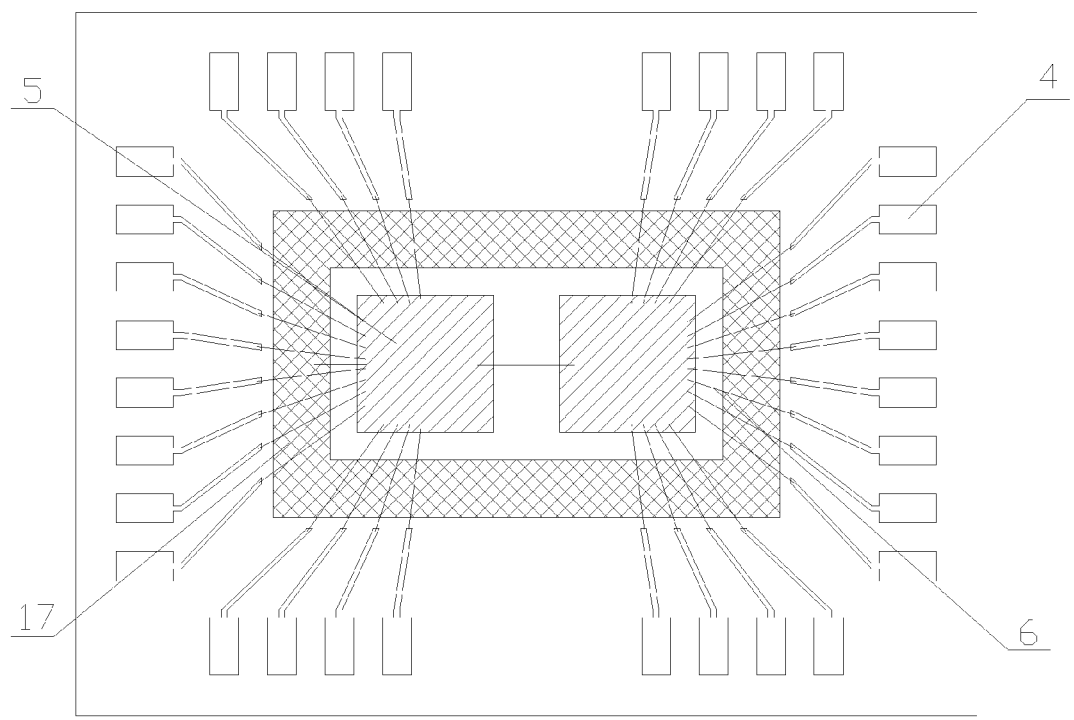
FIG. 37B is a top view of the exemplary barrel-plating QFN packaging structure of FIG. 37A.

FIG. 37A and FIG. 37B illustrate another exemplary barrel-plating QFN packaging structure. FIG. 37A is a cross-sectional view of FIG. 37B.

As shown in FIG. 37A and FIG. 37B, the barrel-plating QFN packaging structure in FIG. 37A and FIG. 37B is similar to the barrel-plating QFN packaging structure in FIG. 36A and FIG. 36B. However, the barrel-plating QFN packaging structure in FIGS. 37A and 40B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, a single lead ring, and electrostatic discharge rings may be formed.

Figure 38A:
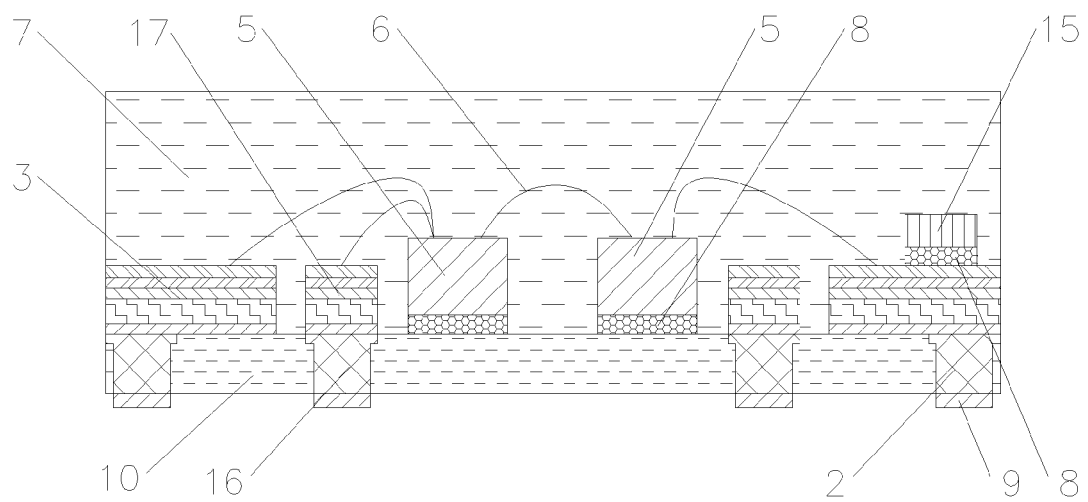
FIG. 38A is a cross-sectional view of another exemplary barrel-plating QFN packaging structure consistent with the disclosed embodiments.
Figure 38B:
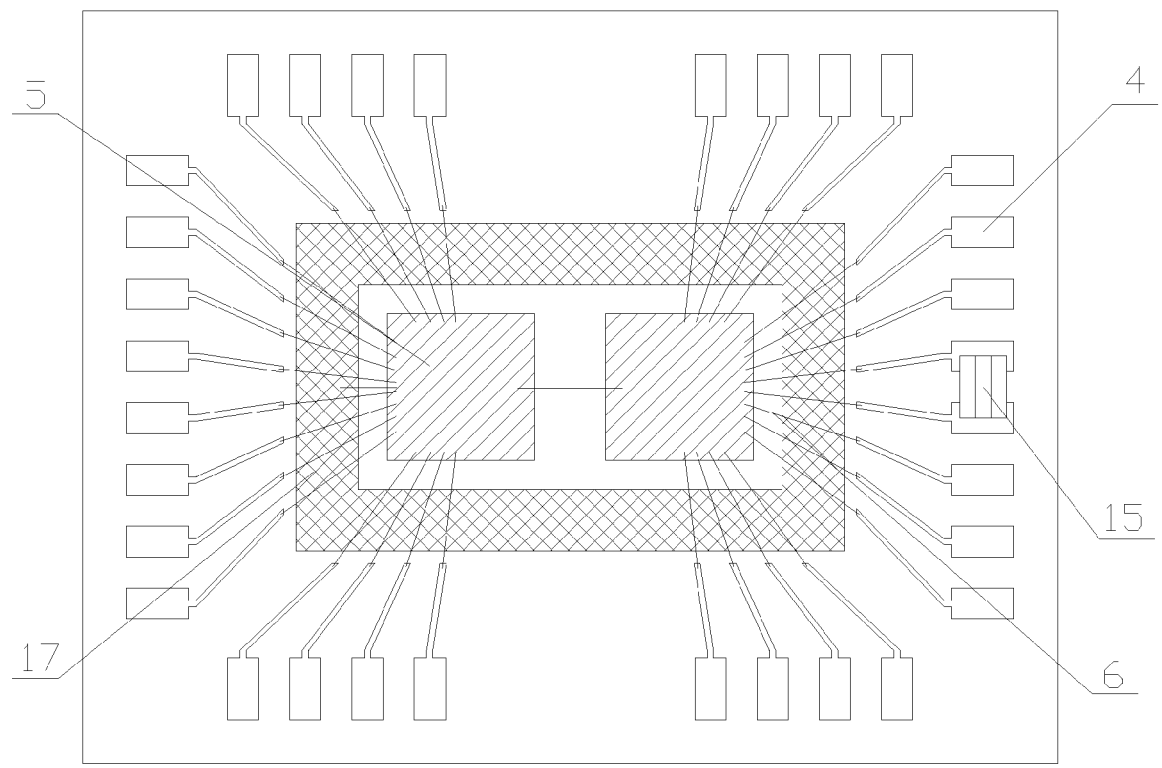
FIG. 38B is a top view of the exemplary barrel-plating QFN packaging structure of FIG. 38A.

FIG. 38A and FIG. 38B illustrate another exemplary barrel-plating QFN packaging structure. FIG. 38A is a cross-sectional view of FIG. 38B.

As shown in FIG. 38A and FIG. 38B, the barrel-plating QFN packaging structure in FIG. 38A and FIG. 38B is similar to the barrel-plating QFN packaging structure in FIG. 22A and FIG. 22B. However, the barrel-plating QFN packaging structure in FIGS. 38A and 41B includes a plurality of dies 5. Each of the plurality of dies 5 is attached on predetermined areas on the substrate or other planar supporting structure or within the ring or rings of inner leads 4 by the conductive or non-conductive adhesive material 8. For example, a second die 5 is arranged in a side-by-side configuration with respect to the first die 5, and both of the dies 5 are arranged within the ring or rings of inner leads 4. Further, the top surface of each die 5 may be connected by the metal wires 6. Other configurations may also be used. Thus, a barrel-plating QFN packaging structure with multiple dies, a single lead ring coupled with passive devices, and electrostatic discharge rings may be formed.

Figure 39A:
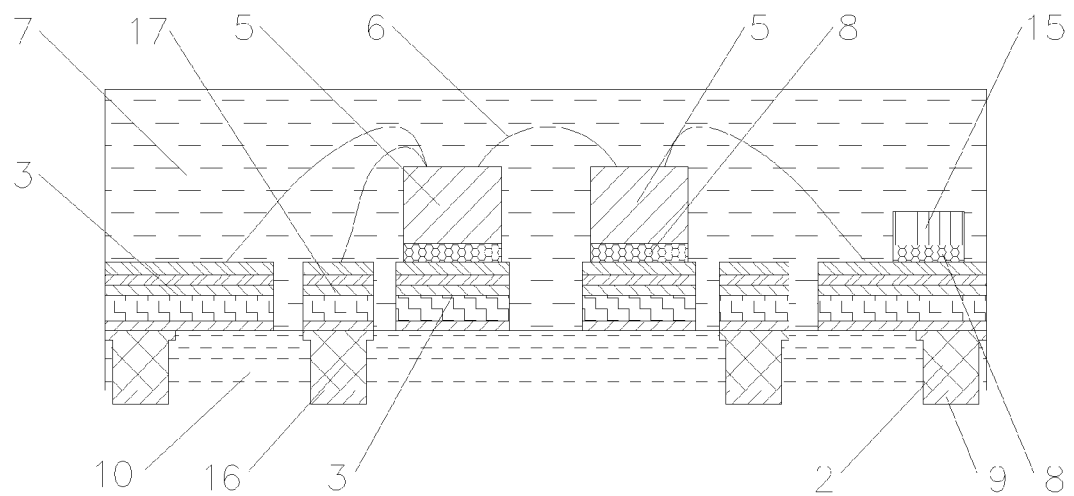
FIG. 39A is a cross-sectional view of another exemplary barrel-plating QFN packaging structure consistent with the disclosed embodiments.
Figure 39B:
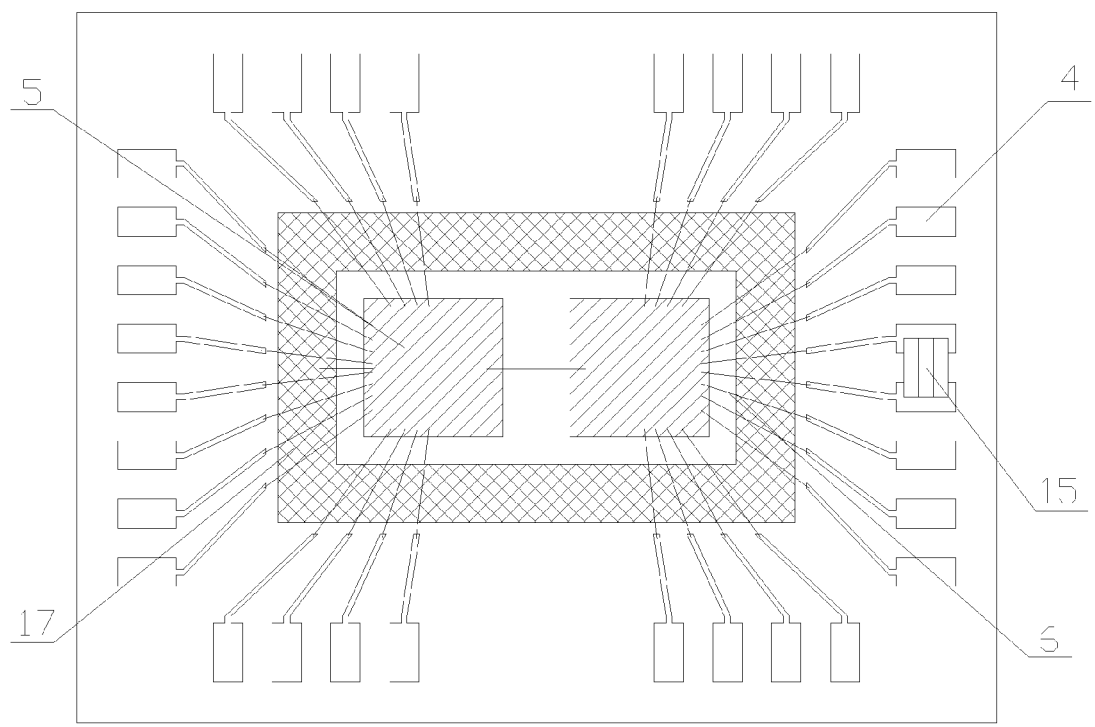
FIG. 39B is a top view of the exemplary barrel-plating QFN packaging structure of FIG. 39A.

FIG. 39A and FIG. 39B illustrate another exemplary barrel-plating QFN packaging structure. FIG. 39A is a cross-sectional view of FIG. 39B.

As shown in FIG. 39A and FIG. 39B, the barrel-plating QFN packaging structure in FIG. 39A and FIG. 39B is similar to the barrel-plating QFN packaging structure in FIG. 38A and FIG. 38B. However, the barrel-plating QFN packaging structure in FIGS. 39A and 42B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, a single lead ring coupled with passive devices, and electrostatic discharge rings may be formed.

Figure 40A:
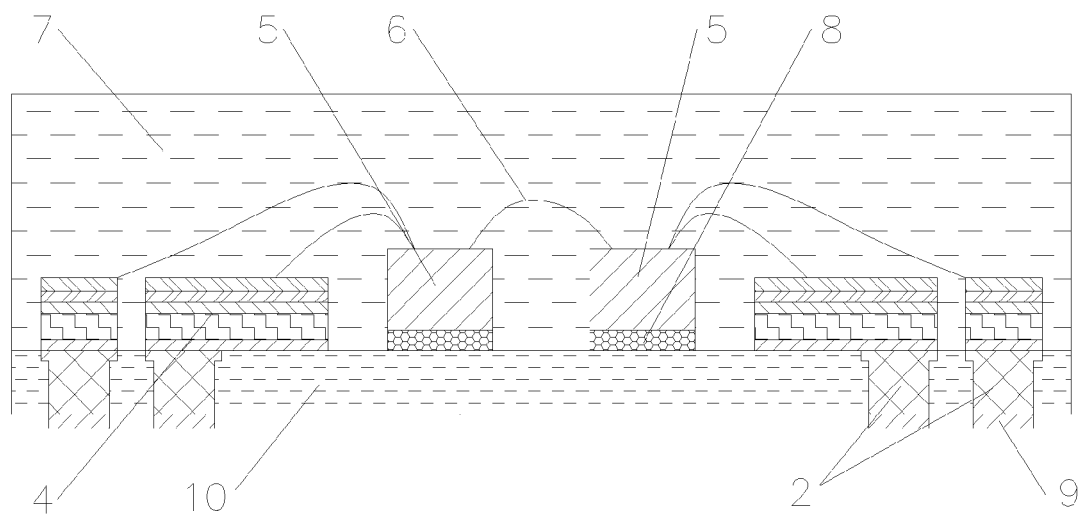
FIG. 40A is a cross-sectional view of another exemplary barrel-plating QFN packaging structure consistent with the disclosed embodiments.
Figure 40B:
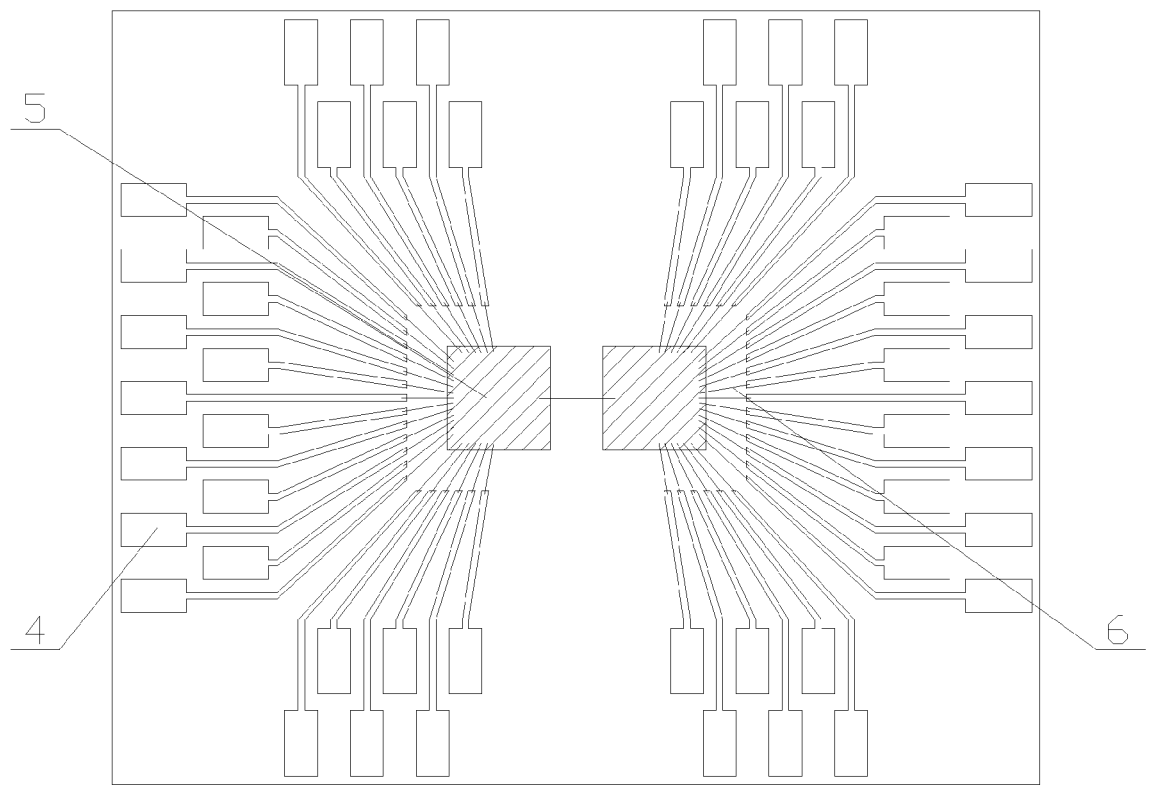
FIG. 40B is a top view of the exemplary barrel-plating QFN packaging structure of FIG. 40A.

FIG. 40A and FIG. 40B illustrate another exemplary barrel-plating QFN packaging structure. FIG. 40A is a cross-sectional view of FIG. 40B.

As shown in FIG. 40A and FIG. 40B, the barrel-plating QFN packaging structure in FIG. 40A and FIG. 40B is similar to the barrel-plating QFN packaging structure in FIG. 32A and FIG. 32B. However, the barrel-plating QFN packaging structure in FIGS. 40A and 43B includes multiple rings of I/O pads 2. In other words, the I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced. Thus, a barrel-plating QFN packaging structure with multiple dies and multiple lead rings may be formed.

Figure 41A:
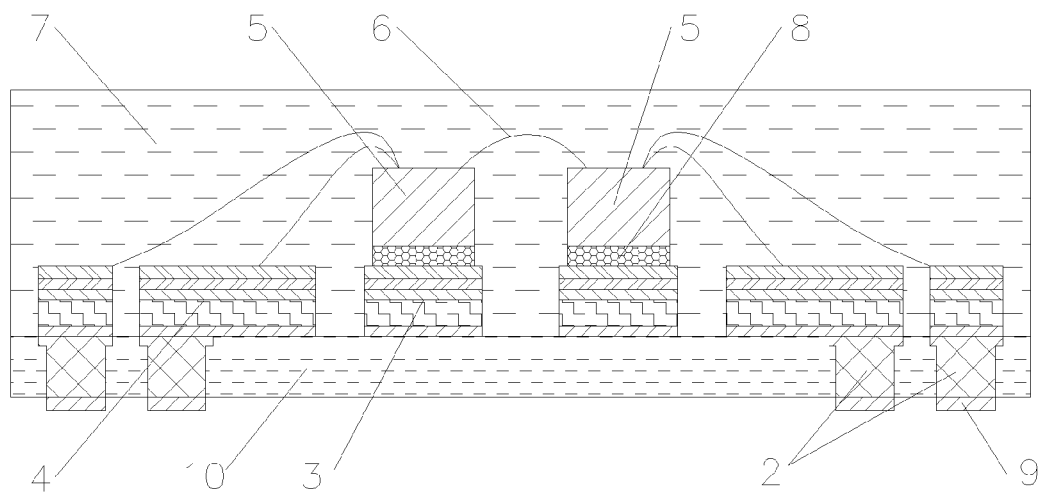
FIG. 41A is a cross-sectional view of another exemplary barrel-plating QFN packaging structure consistent with the disclosed embodiments.
Figure 41B:
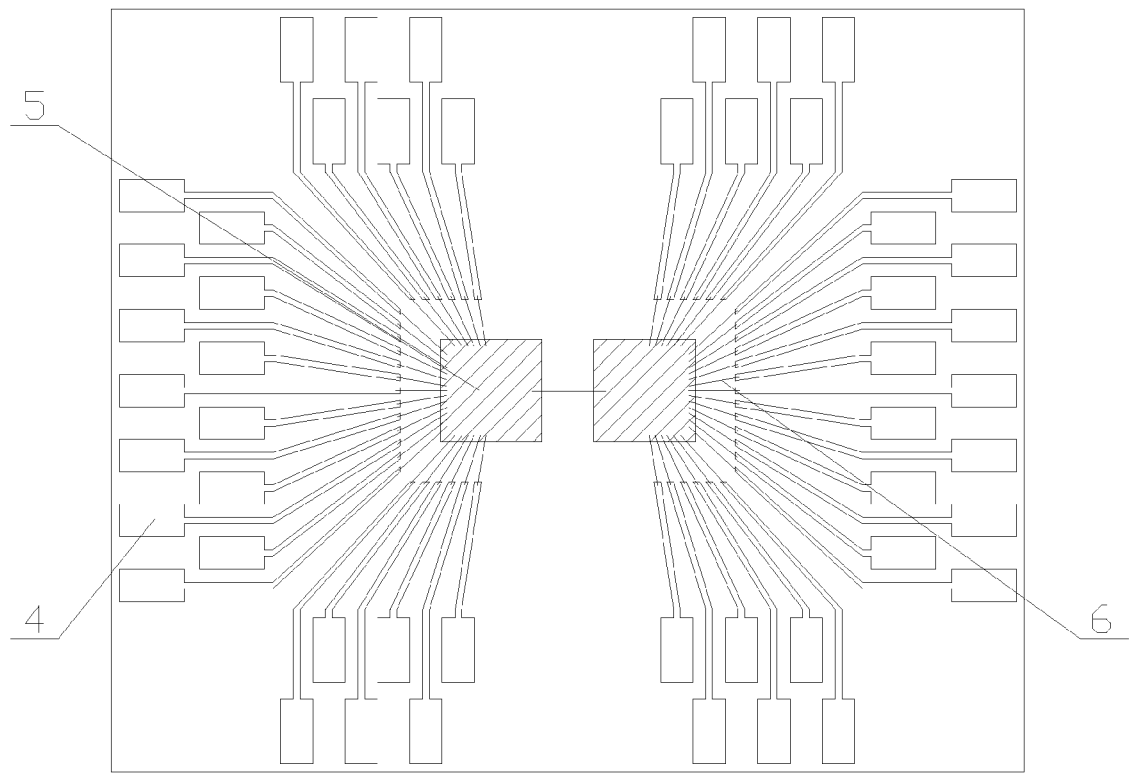
FIG. 41B is a top view of the exemplary barrel-plating QFN packaging structure of FIG. 41A.

FIG. 41A and FIG. 41B illustrate another exemplary barrel-plating QFN packaging structure. FIG. 41A is a cross-sectional view of FIG. 41B.

As shown in FIG. 41A and FIG. 41B, the barrel-plating QFN packaging structure in FIG. 41A and FIG. 41B is similar to the barrel-plating QFN packaging structure in FIG. 40A and FIG. 40B. However, the barrel-plating QFN packaging structure in FIGS. 41A and 44B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, and multiple lead rings may be formed.

Figure 42A:
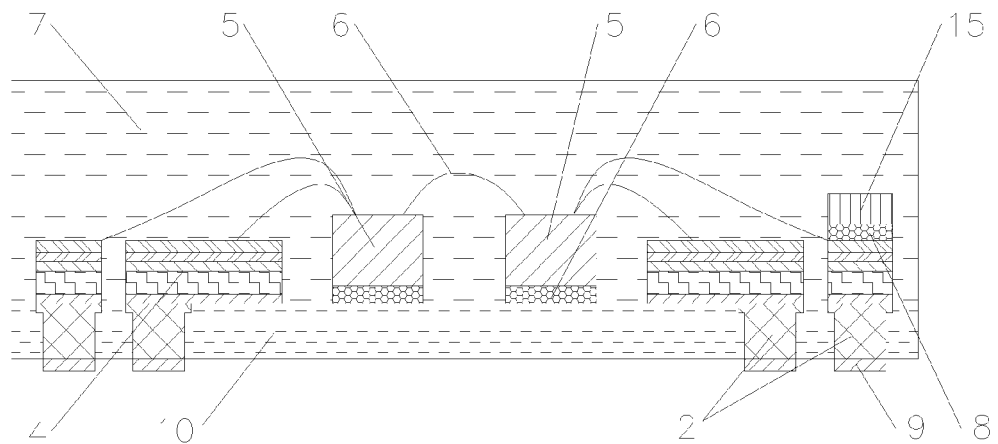
FIG. 42A is a cross-sectional view of another exemplary barrel-plating QFN packaging structure consistent with the disclosed embodiments.
Figure 42B:
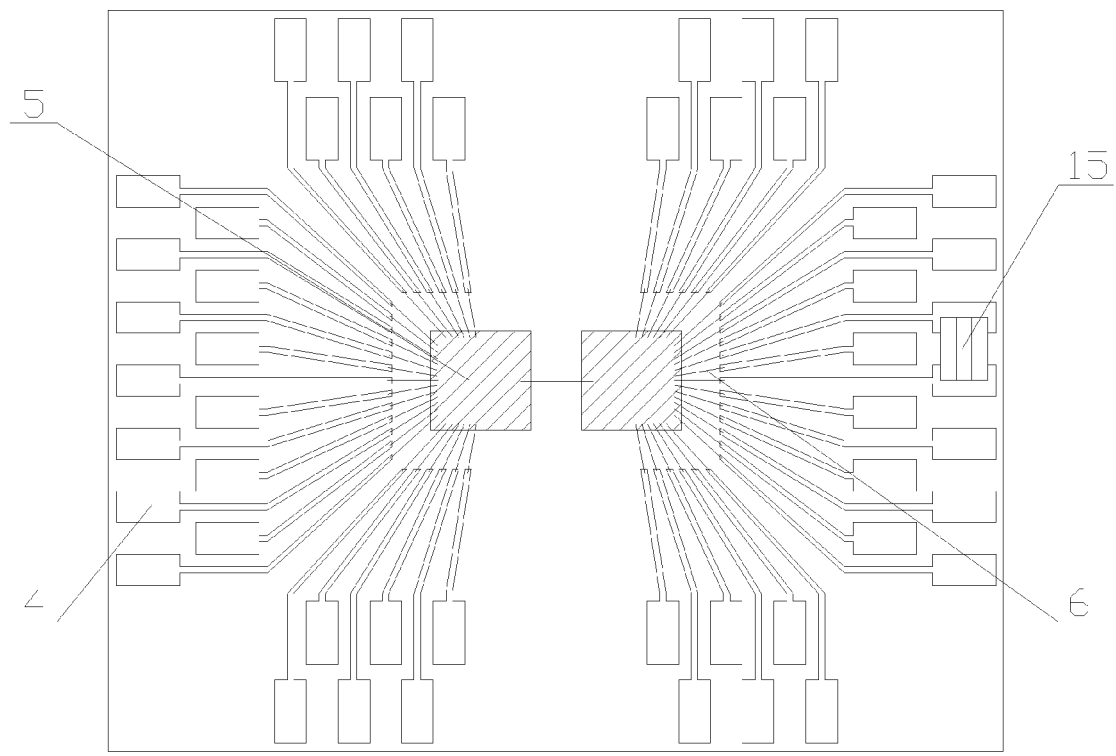
FIG. 42B is a top view of the exemplary barrel-plating QFN packaging structure of FIG. 42A.

FIG. 42A and FIG. 42B illustrate another exemplary barrel-plating QFN packaging structure. FIG. 42A is a cross-sectional view of FIG. 42B.

As shown in FIG. 42A and FIG. 42B, the barrel-plating QFN packaging structure in FIG. 42A and FIG. 42B is similar to the barrel-plating QFN packaging structure in FIG. 34A and FIG. 34B. However, the barrel-plating QFN packaging structure in FIGS. 42A and 45B includes multiple rings of I/O pads 2. In other words, the I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced. Thus, a barrel-plating QFN packaging structure with multiple dies and multiple lead rings coupled with passive devices may be formed.

Figure 43A:
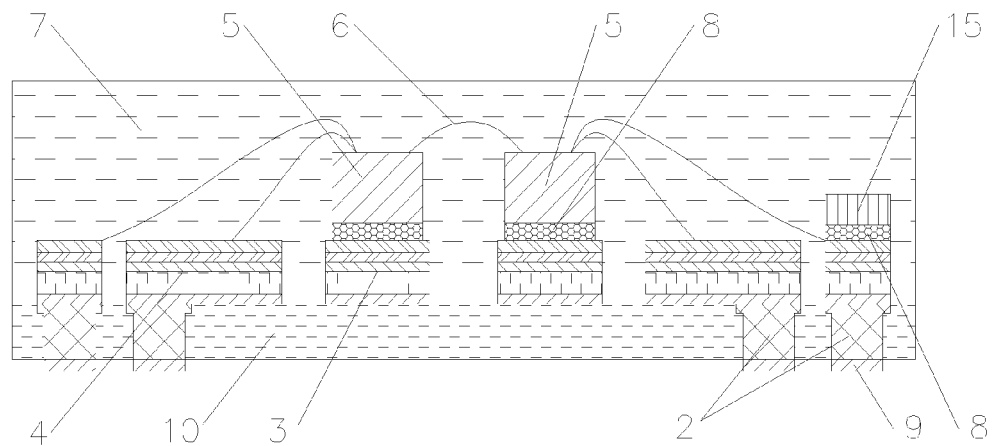
FIG. 43A is a cross-sectional view of another exemplary barrel-plating QFN packaging structure consistent with the disclosed embodiments.
Figure 43B:
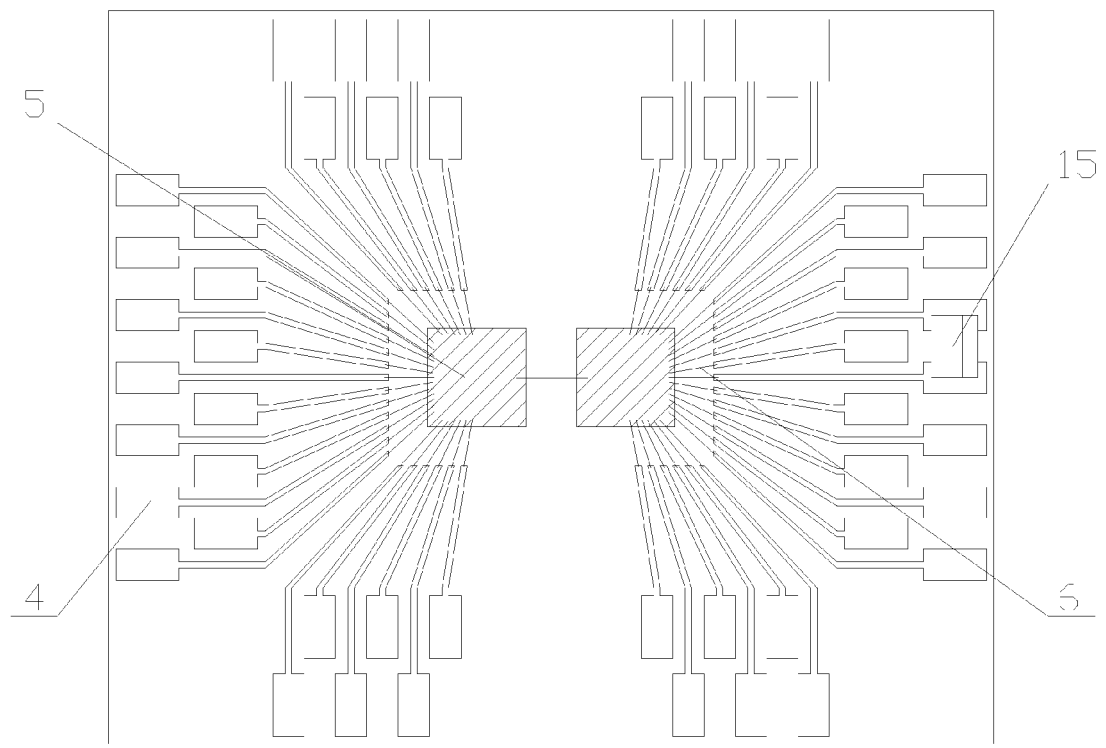
FIG. 43B is a top view of the exemplary barrel-plating QFN packaging structure of FIG. 43A.

FIG. 43A and FIG. 43B illustrate another exemplary barrel-plating QFN packaging structure. FIG. 43A is a cross-sectional view of FIG. 43B.

As shown in FIG. 43A and FIG. 43B, the barrel-plating QFN packaging structure in FIG. 43A and FIG. 43B is similar to the barrel-plating QFN packaging structure in FIG. 42A and FIG. 42B. However, the barrel-plating QFN packaging structure in FIGS. 43A and 46B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, and multiple lead rings coupled with passive devices may be formed.

Figure 44A:
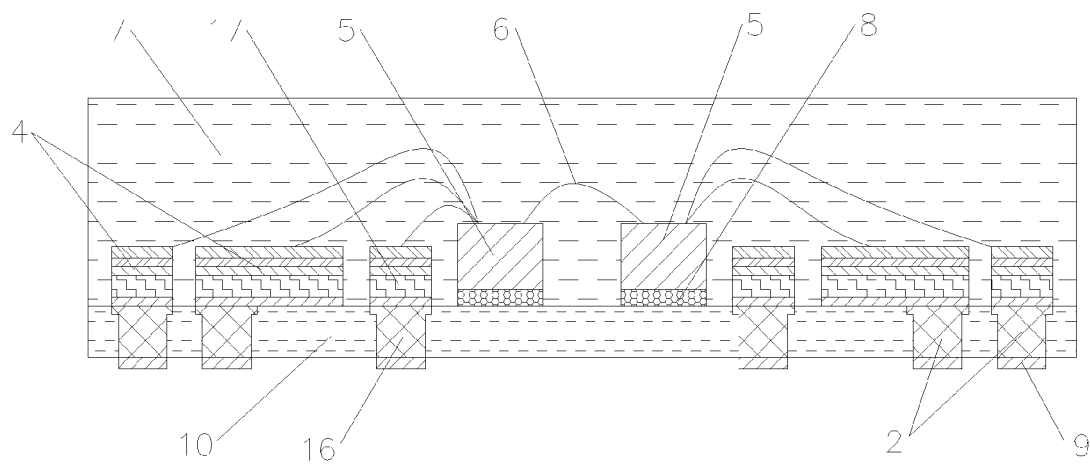
FIG. 44A is a cross-sectional view of another exemplary barrel-plating QFN packaging structure consistent with the disclosed embodiments.
Figure 44B:
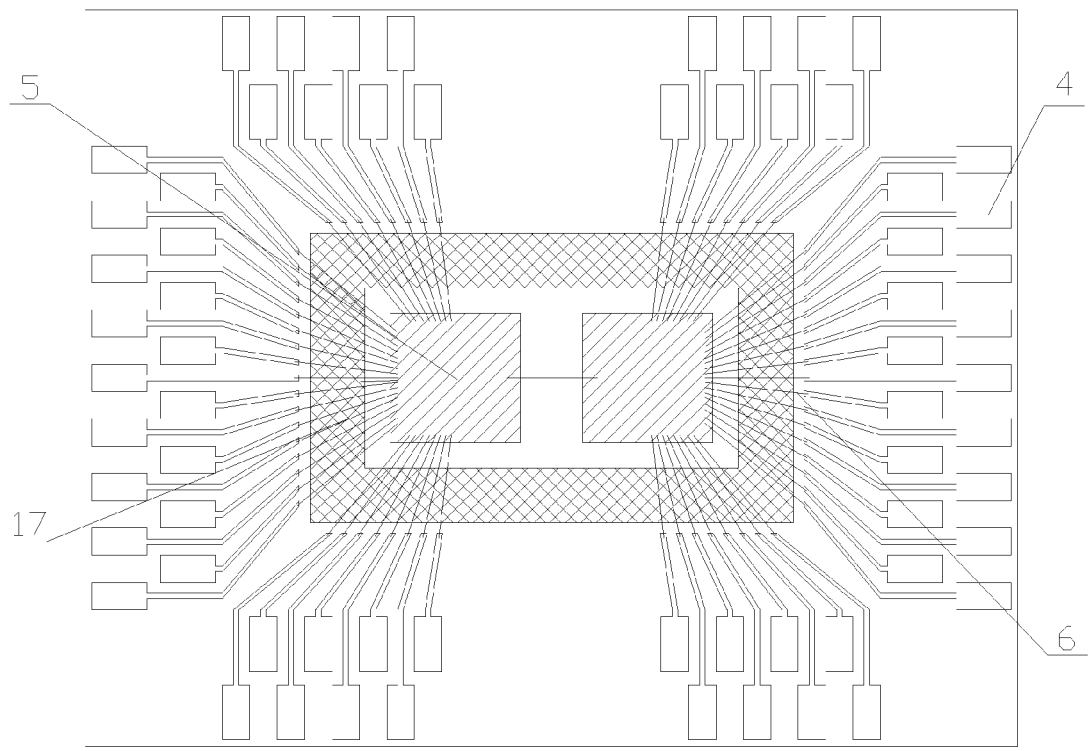
FIG. 44B is a top view of the exemplary barrel-plating QFN packaging structure of FIG. 44A.

FIG. 44A and FIG. 44B illustrate another exemplary barrel-plating QFN packaging structure. FIG. 44A is a cross-sectional view of FIG. 44B.

As shown in FIG. 44A and FIG. 44B, the barrel-plating QFN packaging structure in FIG. 44A and FIG. 44B is similar to the barrel-plating QFN packaging structure in FIG. 36A and FIG. 36B. However, the barrel-plating QFN packaging structure in FIGS. 44A and 47B includes multiple rings of I/O pads 2. In other words, the I/O pads 2 are arranged in a multiple-ring configuration. Further, multiple rings of inner leads 4 may be formed on the top surface of the I/O pads 2. That is, the multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced. Thus, a barrel-plating QFN packaging structure with multiple dies, multiple lead rings, and electrostatic discharge rings may be formed.

Figure 45A:
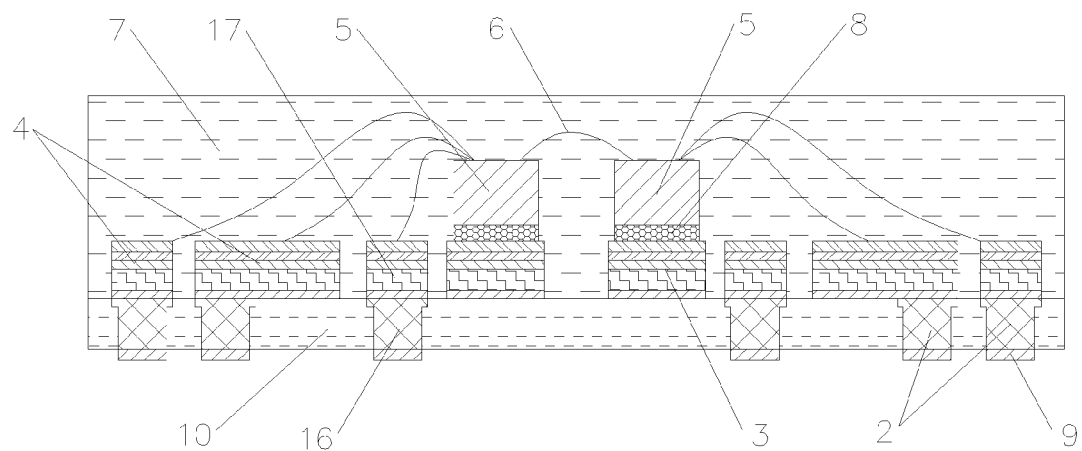
FIG. 45A is a cross-sectional view of another exemplary barrel-plating QFN packaging structure consistent with the disclosed embodiments.
Figure 45B:
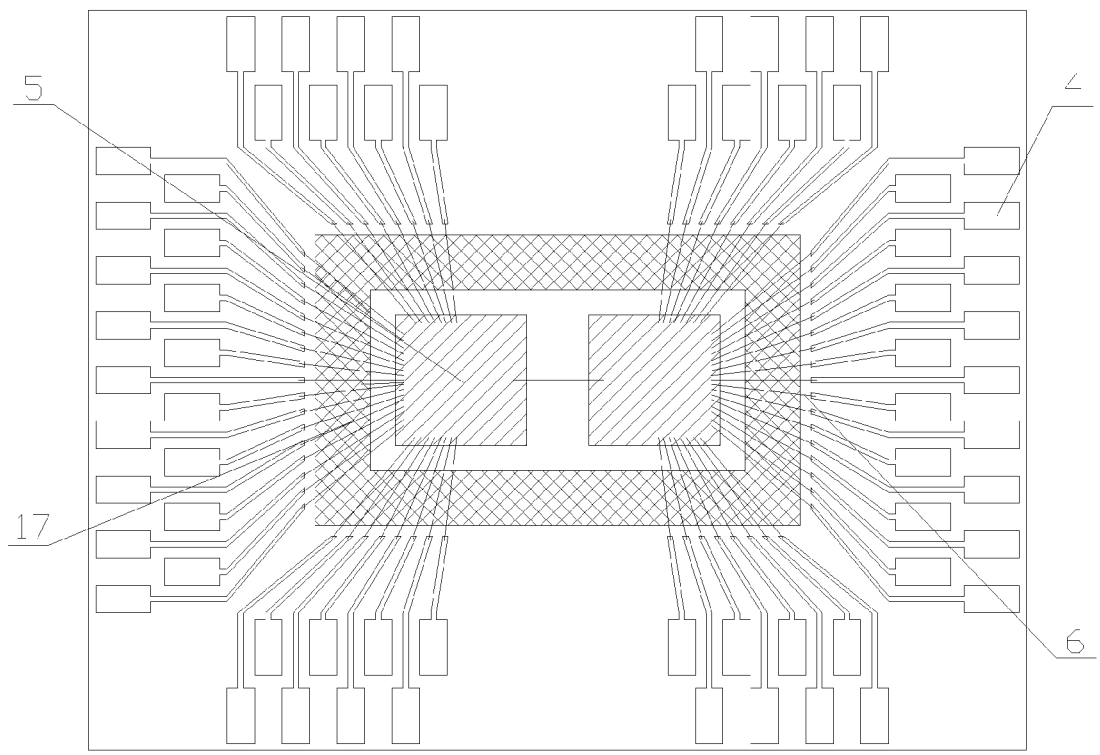
FIG. 45B is a top view of the exemplary barrel-plating QFN packaging structure of FIG. 45A.

FIG. 45A and FIG. 45B illustrate another exemplary barrel-plating QFN packaging structure. FIG. 45A is a cross-sectional view of FIG. 45B.

As shown in FIG. 45A and FIG. 45B, the barrel-plating QFN packaging structure in FIG. 45A and FIG. 45B is similar to the barrel-plating QFN packaging structure in FIG. 44A and FIG. 44B. However, the barrel-plating QFN packaging structure in FIGS. 45A and 48B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, multiple lead rings, and electrostatic discharge ring may be formed.

Figure 46A:
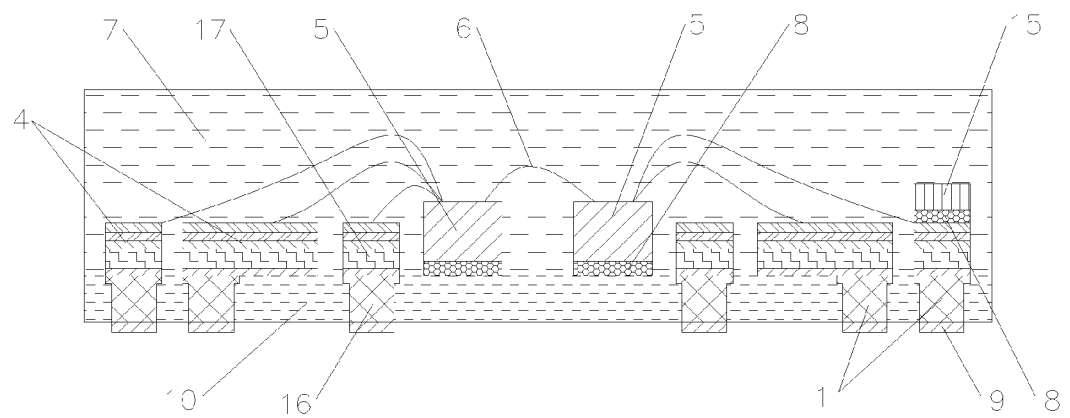
FIG. 46A is a cross-sectional view of another exemplary barrel-plating QFN packaging structure consistent with the disclosed embodiments.
Figure 46B:
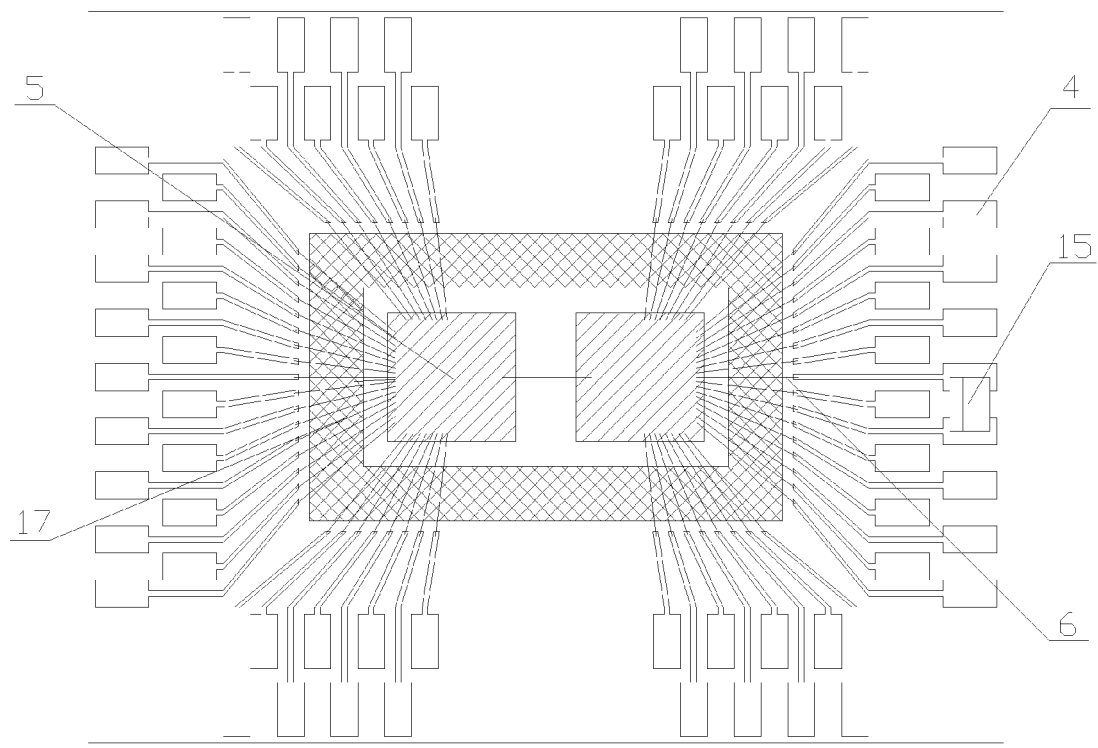
FIG. 46B is a top view of the exemplary barrel-plating QFN packaging structure of FIG. 46A.

FIG. 46A and FIG. 46B illustrate another exemplary barrel-plating QFN packaging structure. FIG. 46A is a cross-sectional view of FIG. 46B.

As shown in FIG. 46A and FIG. 46B, the barrel-plating QFN packaging structure in FIG. 46A and FIG. 46B is similar to the barrel-plating QFN packaging structure in FIG. 38A and FIG. 38B. However, the barrel-plating QFN packaging structure in FIGS. 46A and 49B includes multiple rings of I/O pads 2. In other words, I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced. Thus, a barrel-plating QFN packaging structure with multiple dies, multiple lead rings coupled with passive devices, and electrostatic discharge rings may be formed.

Figure 47A:
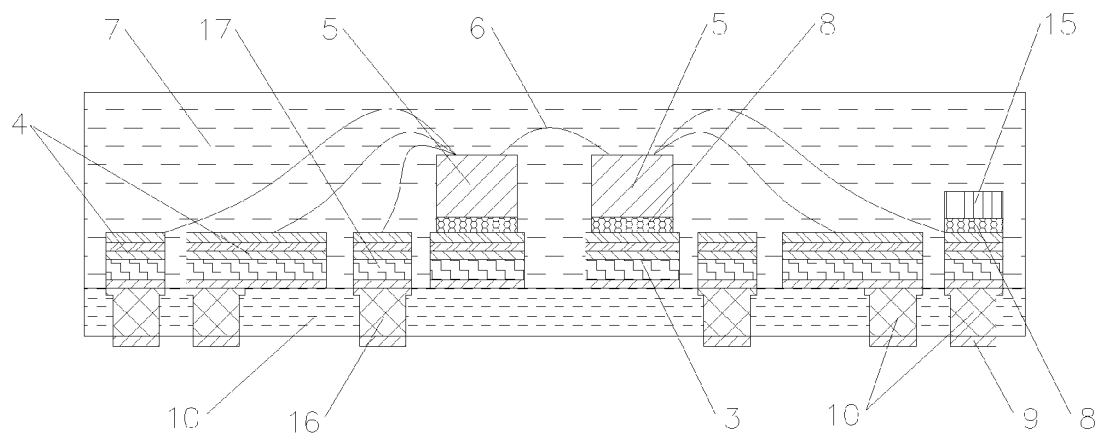
FIG. 47A is a cross-sectional view of another exemplary barrel-plating QFN packaging structure consistent with the disclosed embodiments.
Figure 47B:
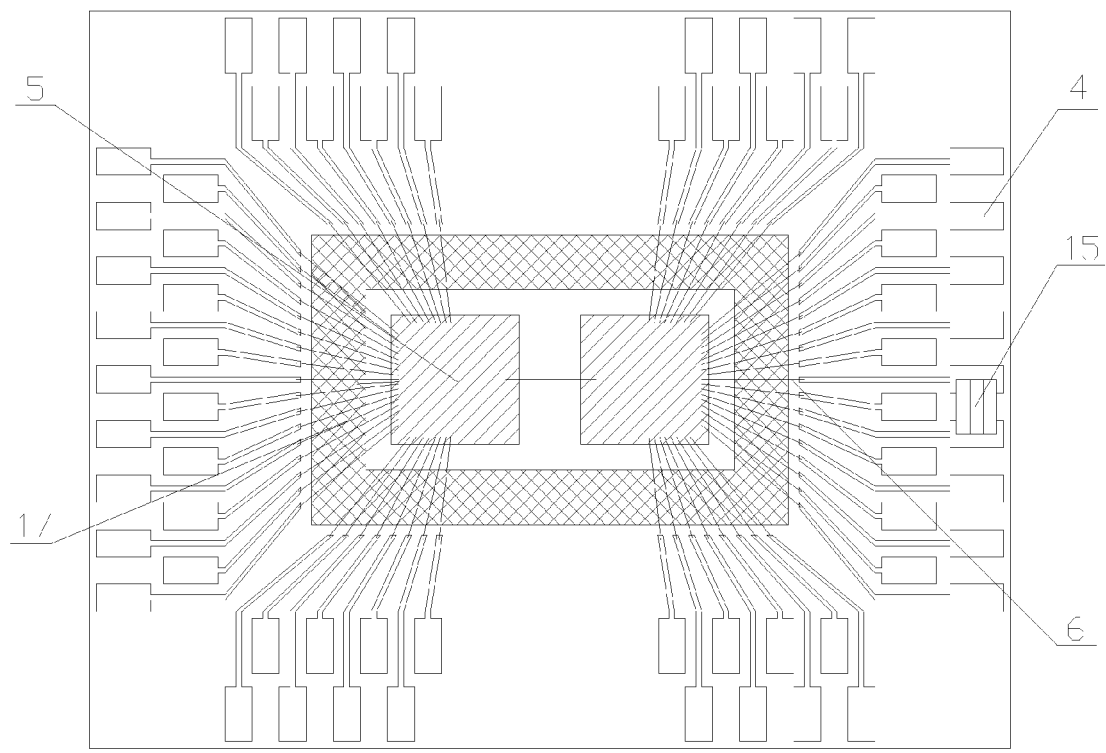
FIG. 47B is a top view of the exemplary barrel-plating QFN packaging structure of FIG. 47A.

FIG. 47A and FIG. 47B illustrate another exemplary barrel-plating QFN packaging structure. FIG. 47A is a cross-sectional view of FIG. 47B.

As shown in FIG. 47A and FIG. 47B, the barrel-plating QFN packaging structure in FIG. 47A and FIG. 47B is similar to the barrel-plating QFN packaging structure in FIG. 46A and FIG. 46B. However, the barrel-plating QFN packaging structure in FIGS. 47A and 50B includes a plurality of inner die pads 3 formed on the predetermined areas for attaching the dies 5 or within a ring or rings of inner leads 4. The plurality of inner die pads 3 may also be formed by the multi-layer plating process for forming the inner leads 4. Thus, the plurality of inner die pads 3 may also be included in the first metal layer 14. Further, the plurality of dies 5 is attached at the top surface of the corresponding plurality of inner die pads 3 via the conductive or non-conductive adhesive material 8. Thus, a barrel-plating QFN packaging structure with multiple dies, multiple inner die pads, multiple lead rings coupled with passive devices, and electrostatic discharge rings may be formed.

Figure 48A:
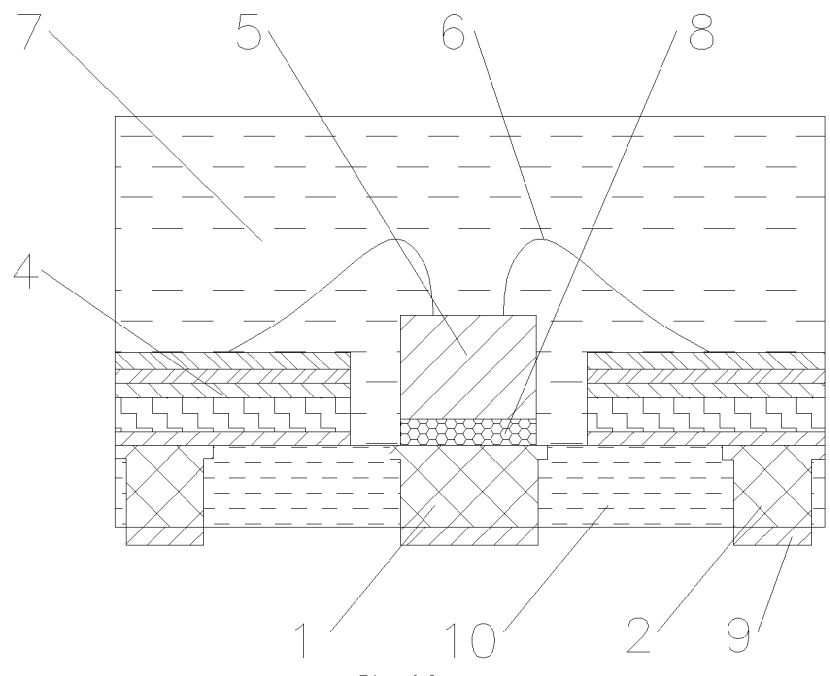
FIG. 48A is a cross-sectional view of another exemplary barrel-plating QFN packaging structure consistent with the disclosed embodiments.
Figure 48B:
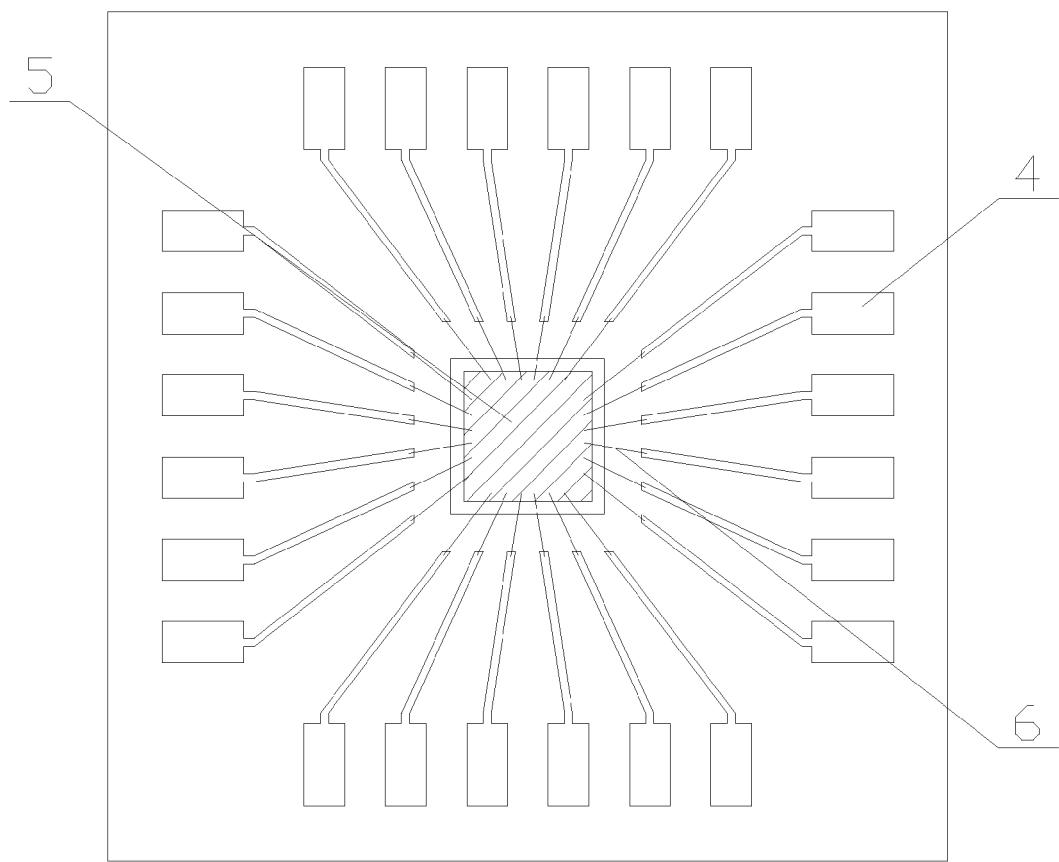
FIG. 48B is a top view of the exemplary barrel-plating QFN packaging structure of FIG. 48A.

FIG. 48A and FIG. 48B illustrate an exemplary quad flat no-lead (QFN) packaging structure with an outer die pad or island consistent with the disclosed embodiments. FIG. 48A is a cross-sectional view of FIG. 48B.

As shown in FIG. 48A and FIG. 48B, the QFN packaging structure in FIG. 48A and FIG. 48B is similar to the barrel-plating QFN packaging structure in FIG. 16A and FIG. 16B. However, the QFN packaging structure in FIGS. 48A and 51B includes an outer die pad 1. That is, the QFN packaging structure in FIGS. 48A and 51B is not barrel-plating. The outer die pad 1 may include any structure to be configured as a die pad to provide contact (e.g., thermal, electrical, etc.) to the die 5, and the outer die pad 1 may be in any appropriate shape, such as a rectangle, a square, or a circle, etc. The die 5 may be mounted on the top surface of the outer die pad 1 through the conductive or non-conductive adhesive material 8. The outer die pad 1 may be formed within the I/O pads 2 or surrounded by the I/O pads 2 in the same etching process forming the I/O pads 2 using the etching pattern.

Correspondingly, the second metal layer pattern for forming the second metal layer 9 before forming the outer die pad 1 and the I/O pads 2 may also include the portion of the second metal layer corresponding to the outer die pad 1. Further, at the backside of the substrate, the sealant 10 is filled in the peripheral areas of the outer die pad 1 and I/O pads 2, in the area between the outer die pad 1 and the I/O pads 2, and in the area between adjacent I/O pads 2. Thus, a QFN packaging structure with a single outer die pad and a single lead ring may be formed.

Figure 49A:
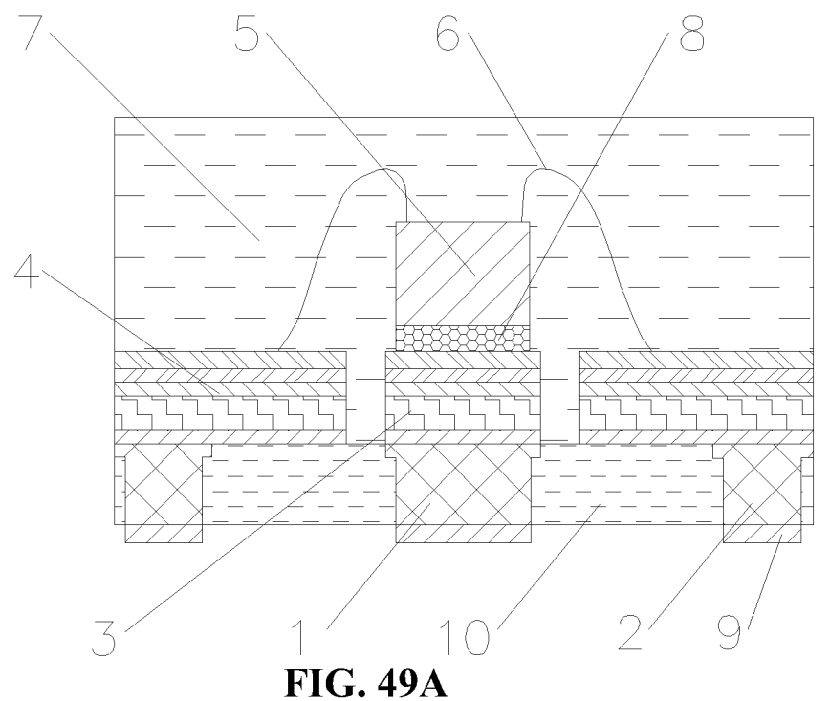
FIG. 49A is a cross-sectional view of an exemplary barrel-plating QFN packaging structure consistent with the disclosed embodiments.
Figure 49B:
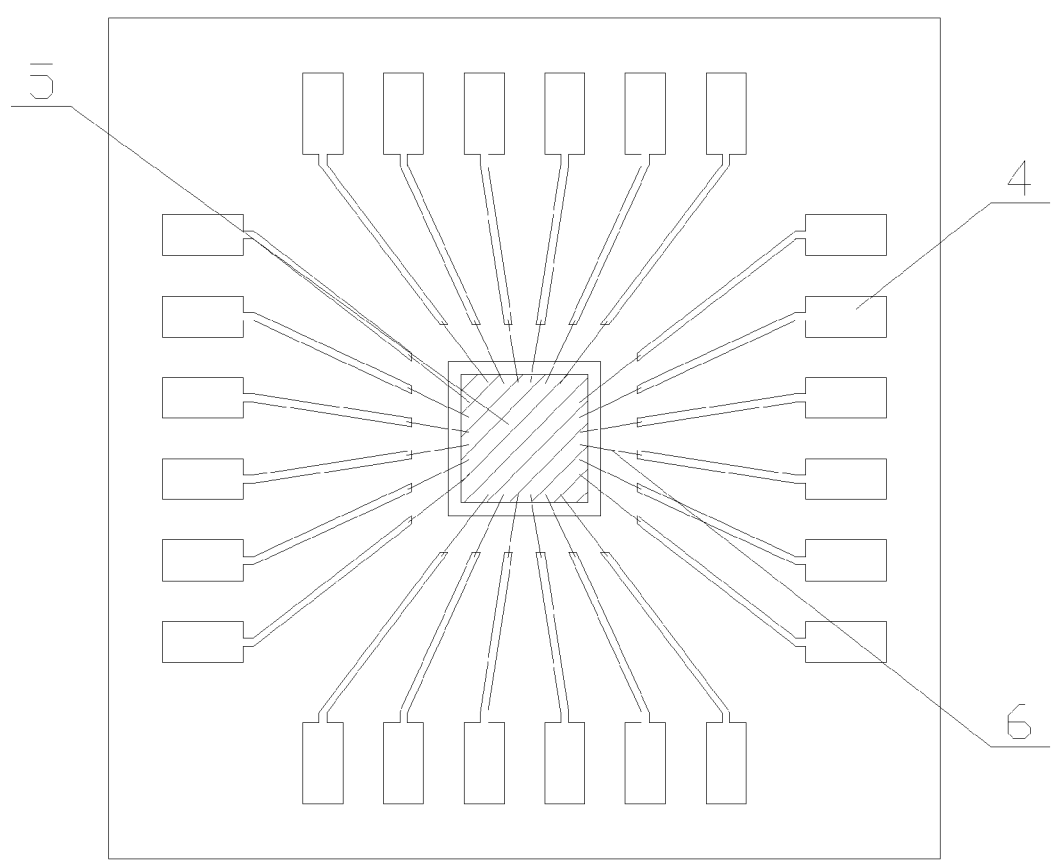
FIG. 49B is a top view of the exemplary barrel-plating QFN packaging structure of FIG. 49A.

FIG. 49A and FIG. 49B illustrate another exemplary barrel-plating QFN packaging structure. FIG. 49A is a cross-sectional view of FIG. 49B.

As shown in FIG. 49A and FIG. 49B, the QFN packaging structure in FIG. 49A and FIG. 49B is similar to the QFN packaging structure in FIG. 17A and FIG. 17B. However, the QFN packaging structure in FIG. 49A and FIG. 49B also includes an outer die pad 1, as previously explained. The inner die pad 3 is formed on the top surface of the outer die pad 1 by the multi-layer plating process. Thus, a QFN packaging structure with outer and inner die pads and a single lead ring may be formed.

Figure 50A:
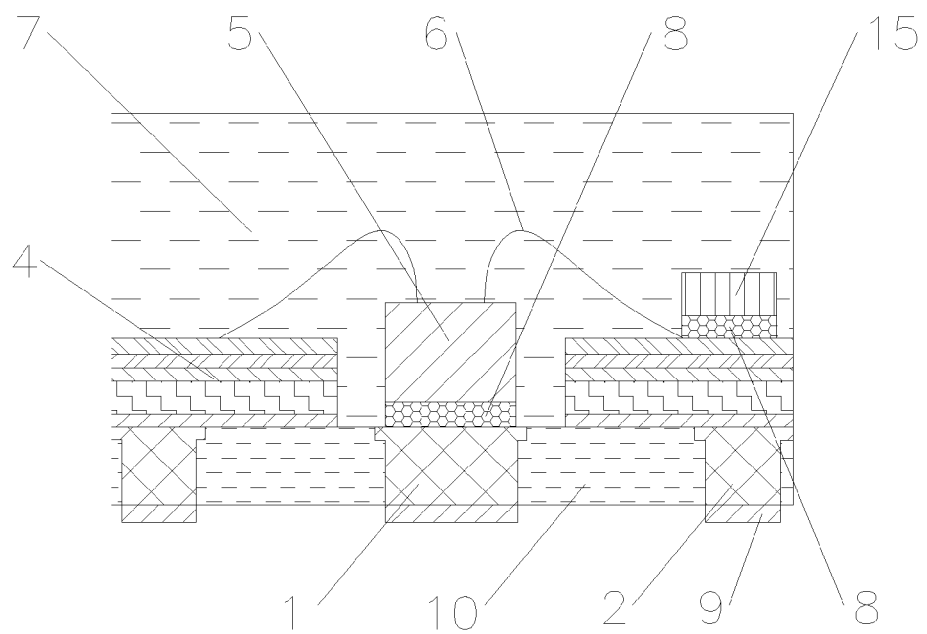
FIG. 50A is a cross-sectional view of another exemplary barrel-plating QFN packaging structure consistent with the disclosed embodiments.
Figure 50B:
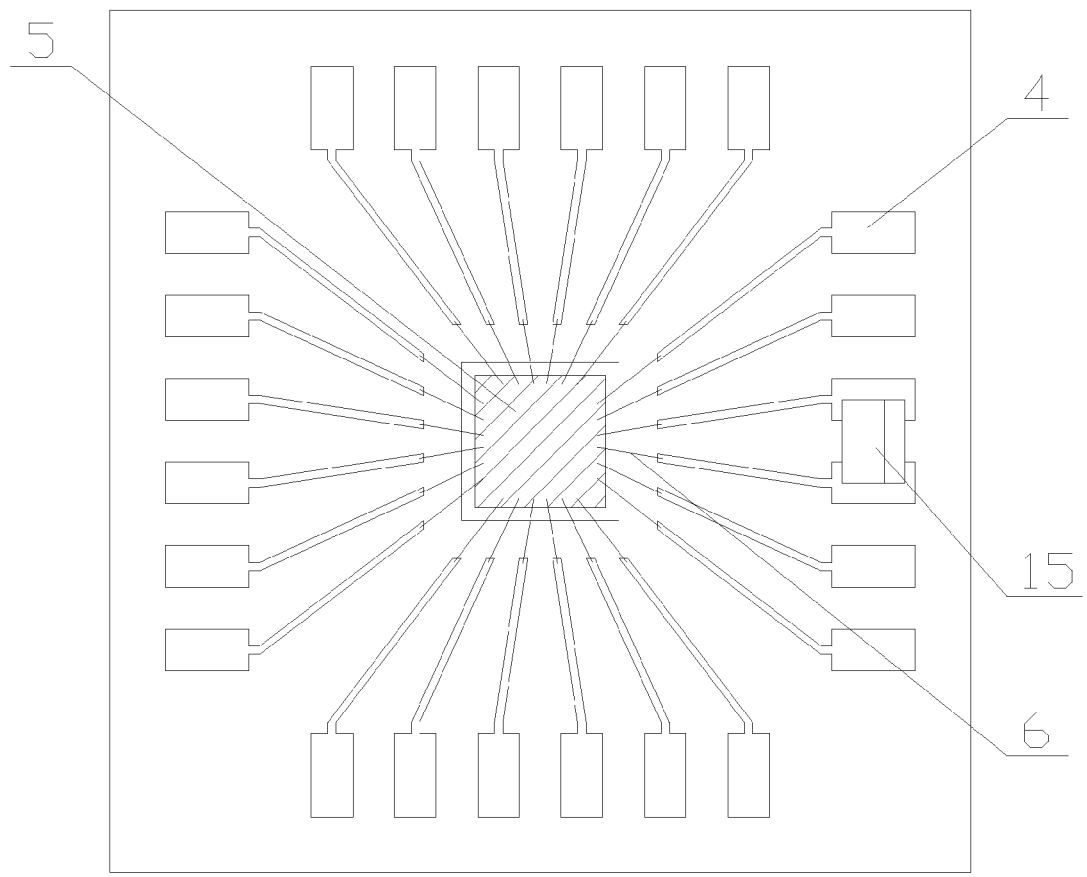
FIG. 50B is a top view of the exemplary barrel-plating QFN packaging structure of FIG. 50A.

FIG. 50A and FIG. 50B illustrate another exemplary barrel-plating QFN packaging structure. FIG. 50A is a cross-sectional view of FIG. 50B.

As shown in FIG. 50A and FIG. 50B, the QFN packaging structure in FIG. 50A and FIG. 50B is similar to the QFN packaging structure in FIG. 18A and FIG. 18B. However, the QFN packaging structure in FIGS. 50A and 53B also includes an outer die pad 1, as previously explained. The die 5 is attached on the top surface of the outer die pad 1 via the conductive or non-conductive adhesive material 8. Thus, a QFN packaging structure with a single outer die pad and a single lead ring coupled with passive devices may be formed.

Figure 51A:
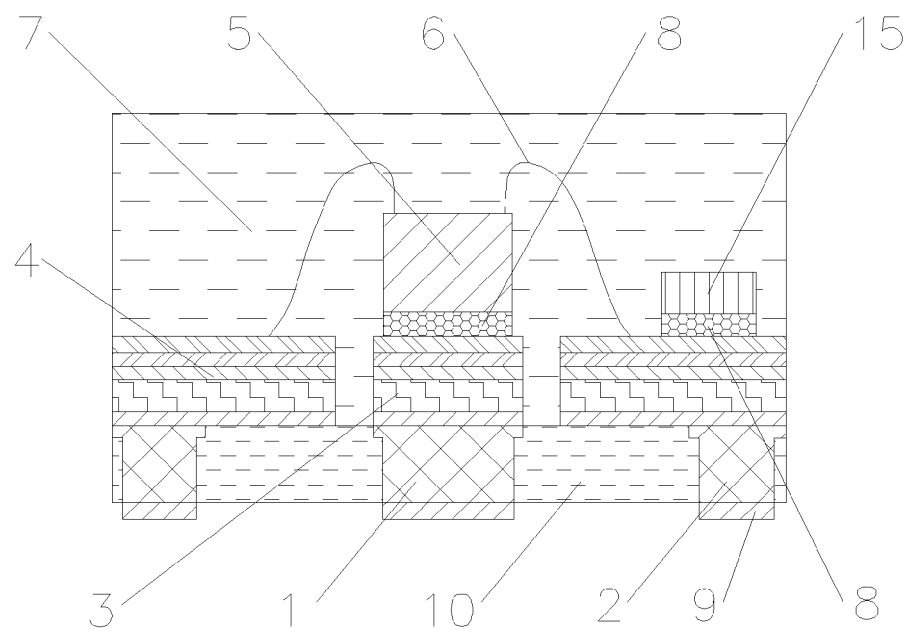
FIG. 51A is a cross-sectional view of another exemplary barrel-plating QFN packaging structure consistent with the disclosed embodiments.
Figure 51B:
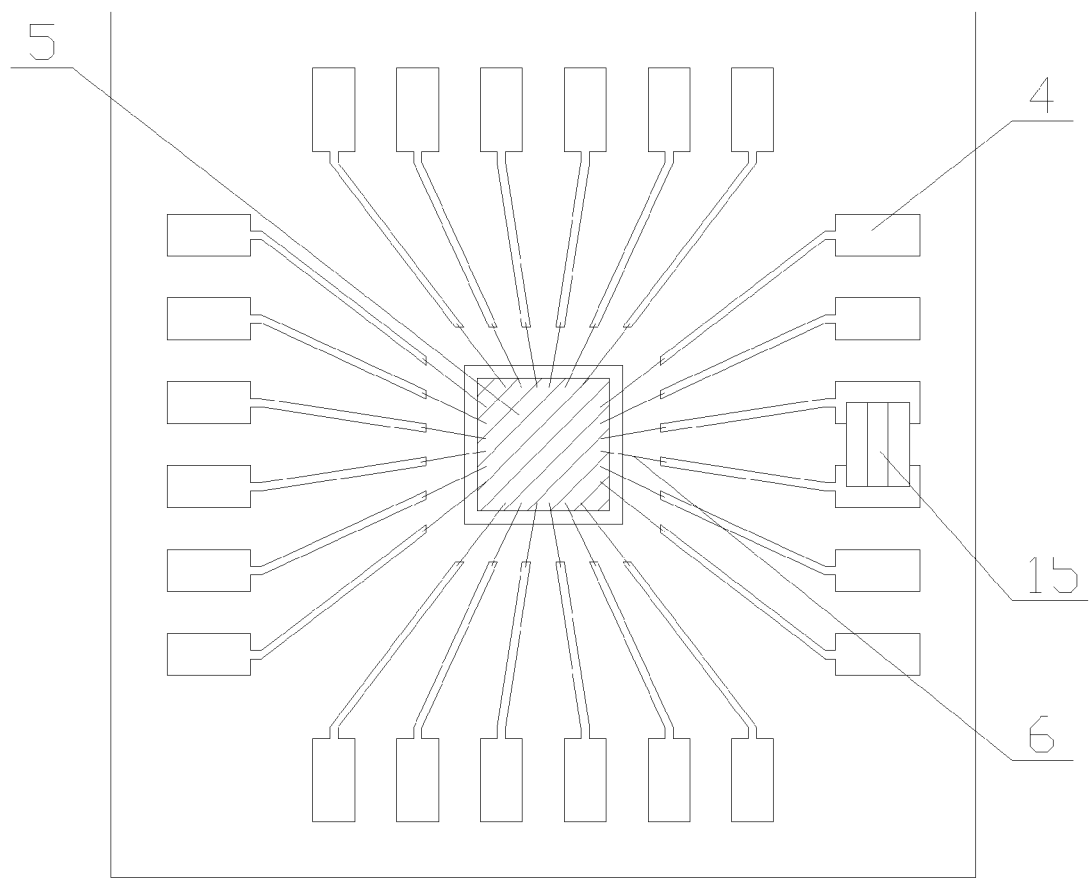
FIG. 51B is a top view of the exemplary barrel-plating QFN packaging structure of FIG. 51A.

FIG. 51A and FIG. 51B illustrate another exemplary barrel-plating QFN packaging structure. FIG. 51A is a cross-sectional view of FIG. 51B.

As shown in FIG. 51A and FIG. 51B, the QFN packaging structure in FIG. 51A and FIG. 51B is similar to the QFN packaging structure in FIG. 19A and FIG. 19B. However, the QFN packaging structure in FIG. 51A and FIG. 51B also includes an outer die pad 1, as previously explained. The inner die pad 3 is formed on the top surface of the outer die pad 1 by the multi-layer plating process. Thus, a QFN packaging structure with outer and inner die pads and a single lead ring coupled with passive devices may be formed.

Figure 52A:
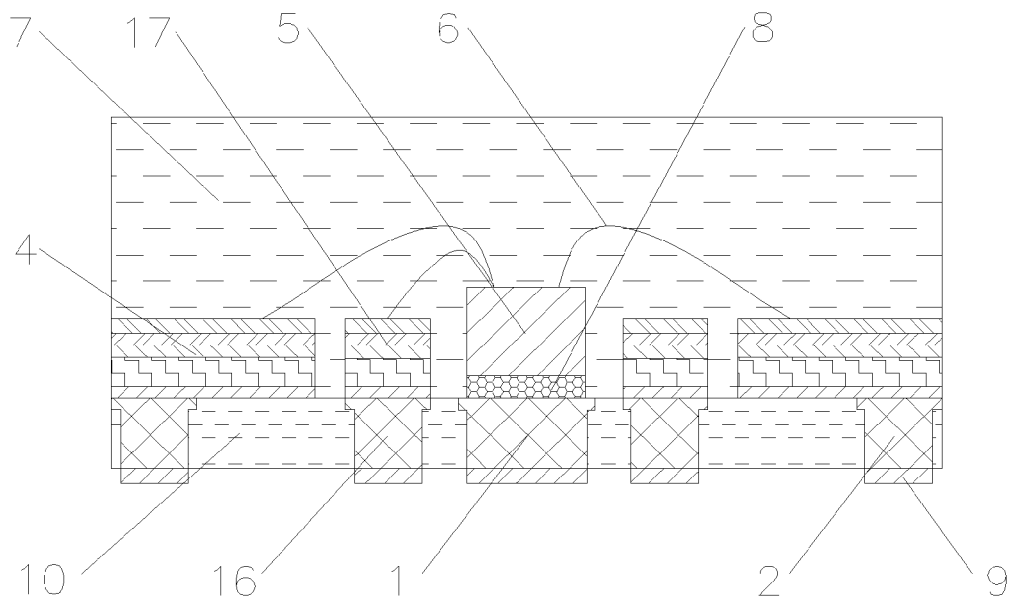
FIG. 52A is a cross-sectional view of another exemplary barrel-plating QFN packaging structure consistent with the disclosed embodiments.
Figure 52B:
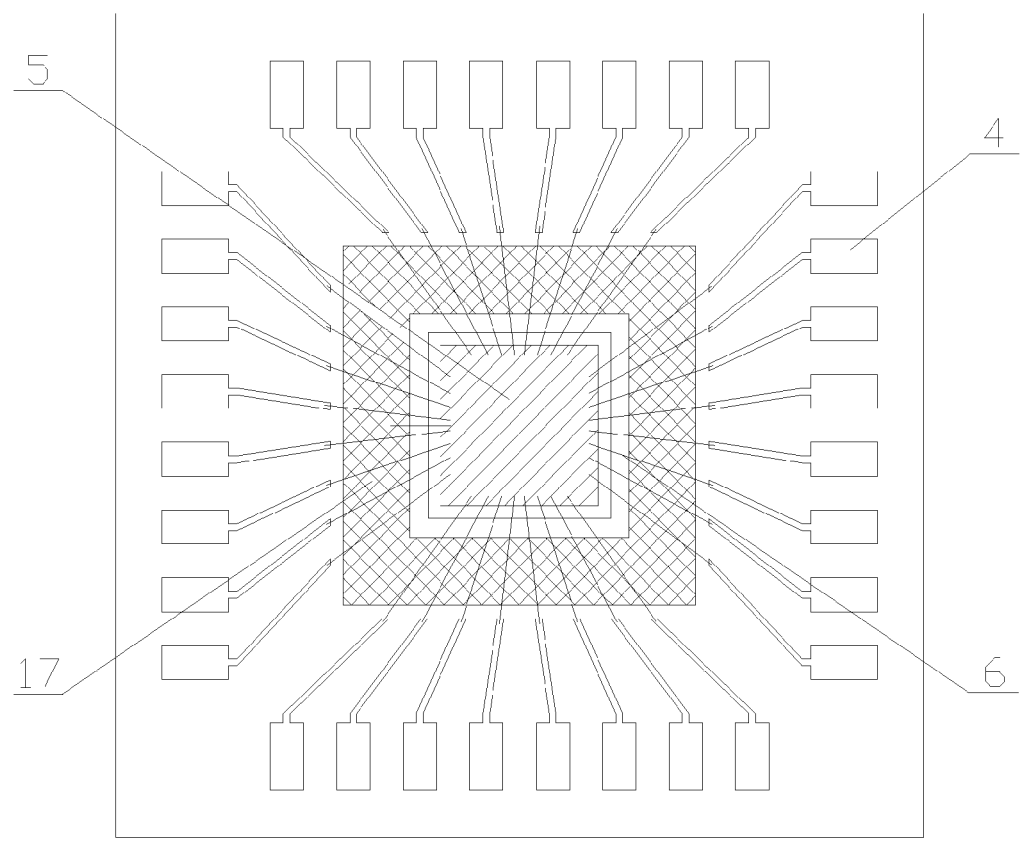
FIG. 52B is a top view of the exemplary barrel-plating QFN packaging structure of FIG. 52A.

FIG. 52A and FIG. 52B illustrate another exemplary barrel-plating QFN packaging structure. FIG. 52A is a cross-sectional view of FIG. 52B.

As shown in FIG. 52A and FIG. 52B, the QFN packaging structure in FIG. 52A and FIG. 52B is similar to the QFN packaging structure in FIG. 20A and FIG. 20B. However, the QFN packaging structure in FIG. 52A and FIG. 52B also includes an outer die pad 1, as previously explained. The die 5 is attached on the top surface of the outer die pad 1 via the conductive or non-conductive adhesive material 8. Thus, a QFN packaging structure with a single outer die pad, a single lead ring, and electrostatic discharge rings may be formed.

Figure 53A:
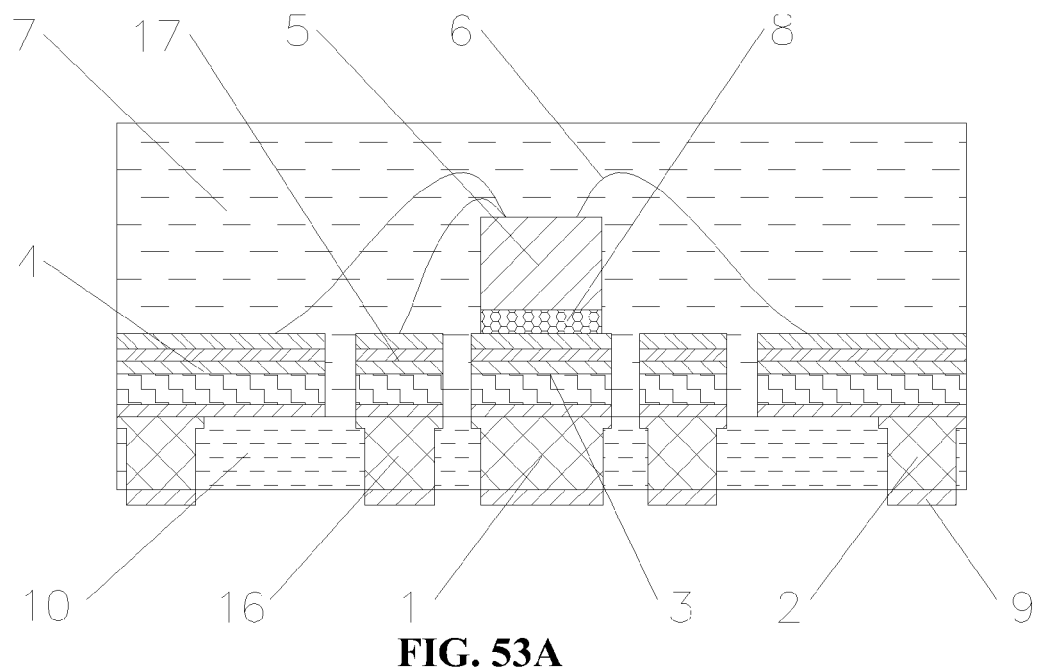
FIG. 53A is a cross-sectional view of another exemplary barrel-plating QFN packaging structure consistent with the disclosed embodiments.
Figure 53B:
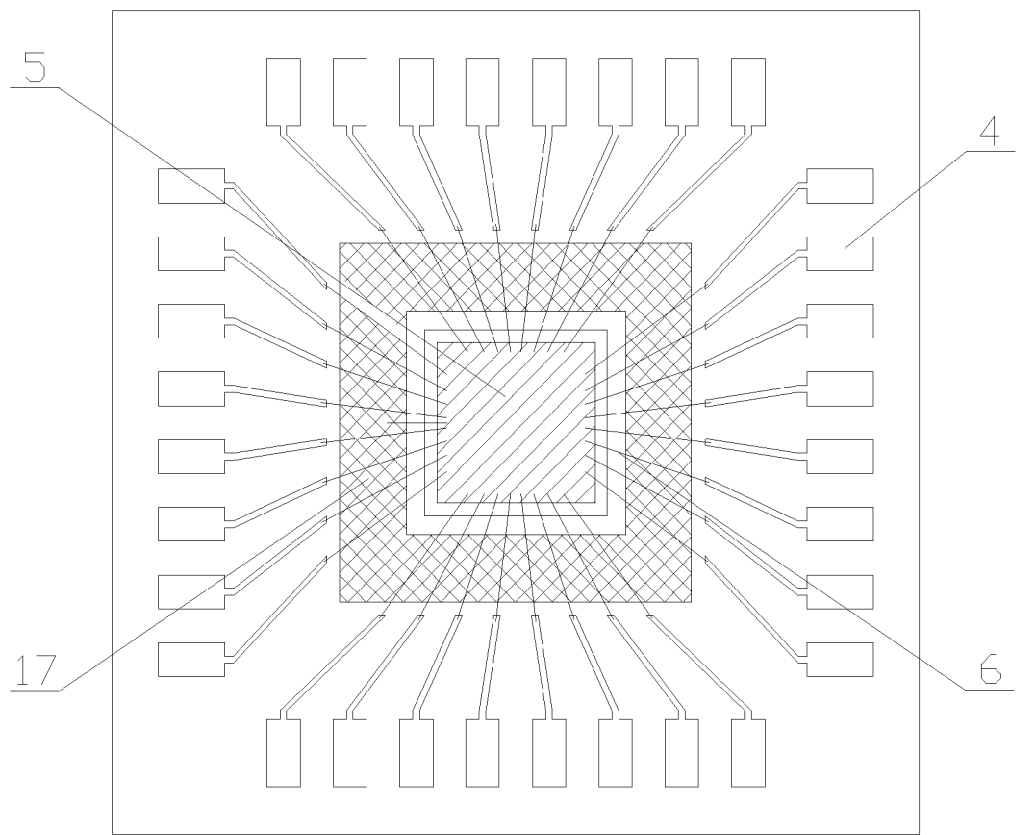
FIG. 53B is a top view of the exemplary barrel-plating QFN packaging structure of FIG. 53A.

FIG. 53A and FIG. 53B illustrate another exemplary barrel-plating QFN packaging structure. FIG. 53A is a cross-sectional view of FIG. 53B.

As shown in FIG. 53A and FIG. 53B, the QFN packaging structure in FIG. 53A and FIG. 53B is similar to the QFN packaging structure in FIG. 21A and FIG. 21B. However, the QFN packaging structure in FIG. 53A and FIG. 53B also includes an outer die pad 1, as previously explained. The inner die pad 3 is formed on the top surface of the outer die pad 1 by the multi-layer plating process. Thus, a QFN packaging structure with outer and inner die pads, a single lead ring, and electrostatic discharge rings may be formed.

Figure 54A:
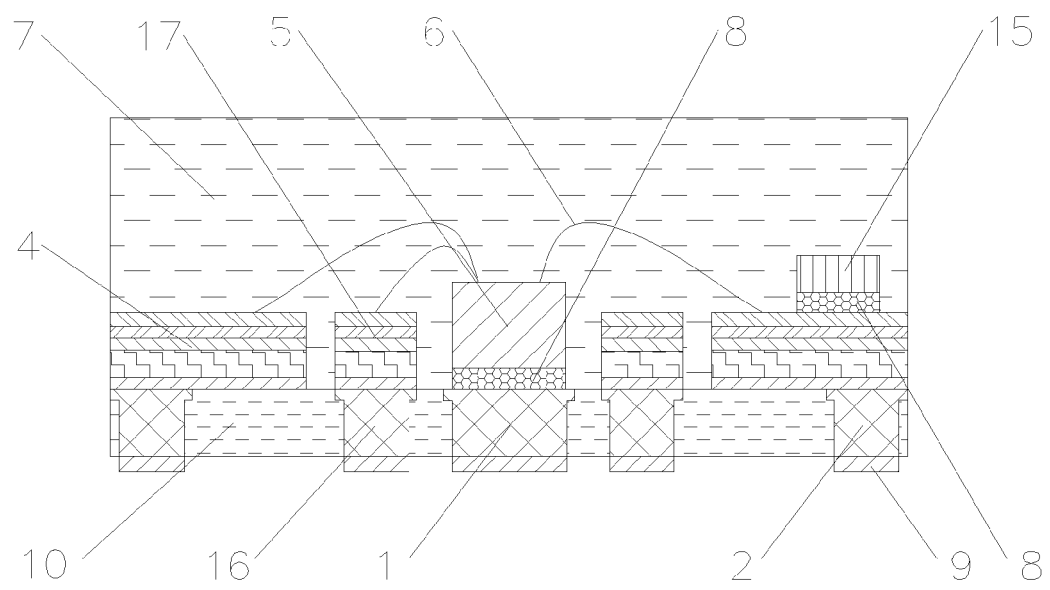
FIG. 54A is a cross-sectional view of another exemplary barrel-plating QFN packaging structure consistent with the disclosed embodiments.
Figure 54B:
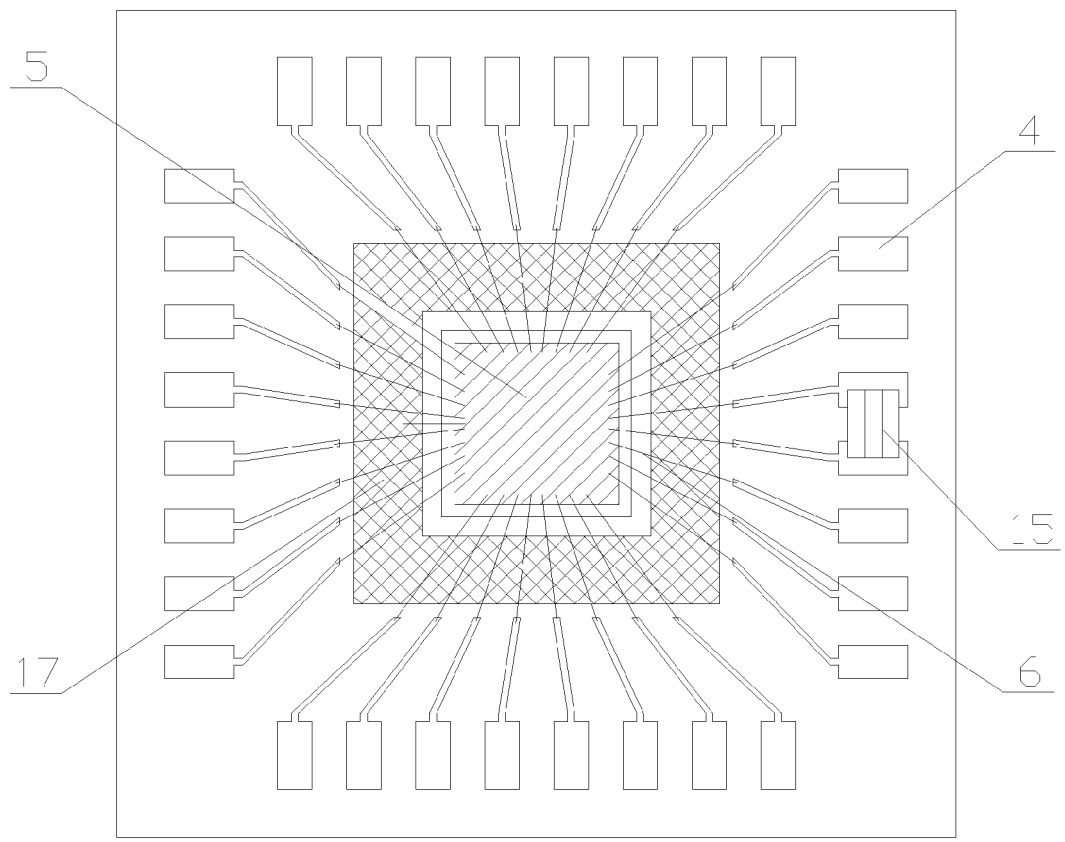
FIG. 54B is a top view of the exemplary barrel-plating QFN packaging structure of FIG. 54A.

FIG. 54A and FIG. 54B illustrate another exemplary barrel-plating QFN packaging structure. FIG. 54A is a cross-sectional view of FIG. 54B.

As shown in FIG. 54A and FIG. 54B, the QFN packaging structure in FIG. 54A and FIG. 54B is similar to the QFN packaging structure in FIG. 22A and FIG. 22B. However, the QFN packaging structure in FIG. 54A and FIG. 54B also includes an outer die pad 1, as previously explained. The die 5 is attached on the top surface of the outer die pad 1 via the conductive or non-conductive adhesive material 8. Thus, a QFN packaging structure with a single outer die pad, a single lead ring coupled with passive devices, and electrostatic discharge ring may be formed.

Figure 55A:
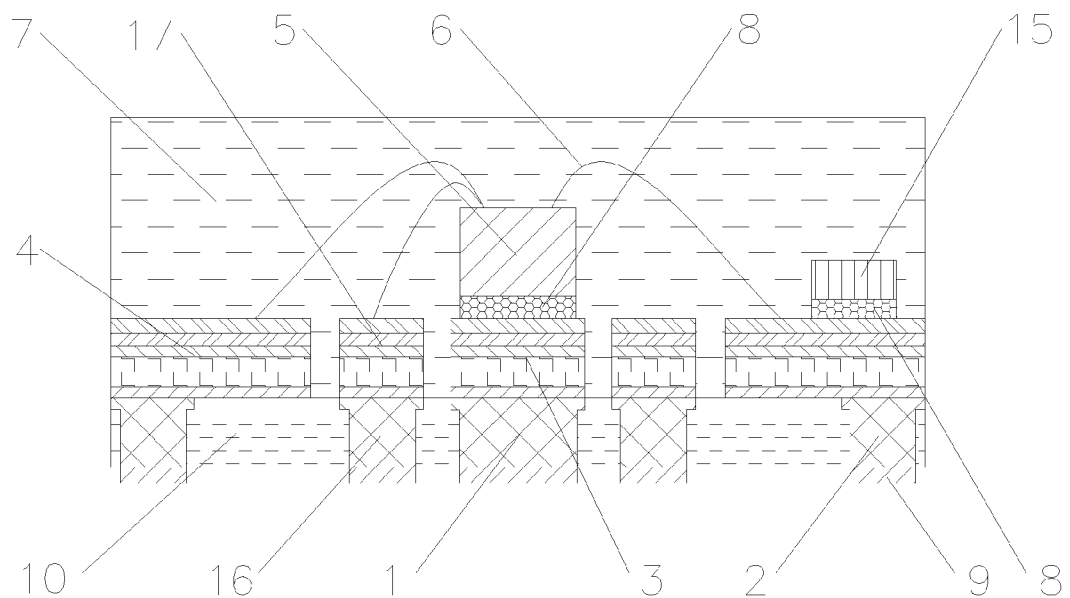
FIG. 55A is a cross-sectional view of another exemplary barrel-plating QFN packaging structure consistent with the disclosed embodiments.
Figure 55B:
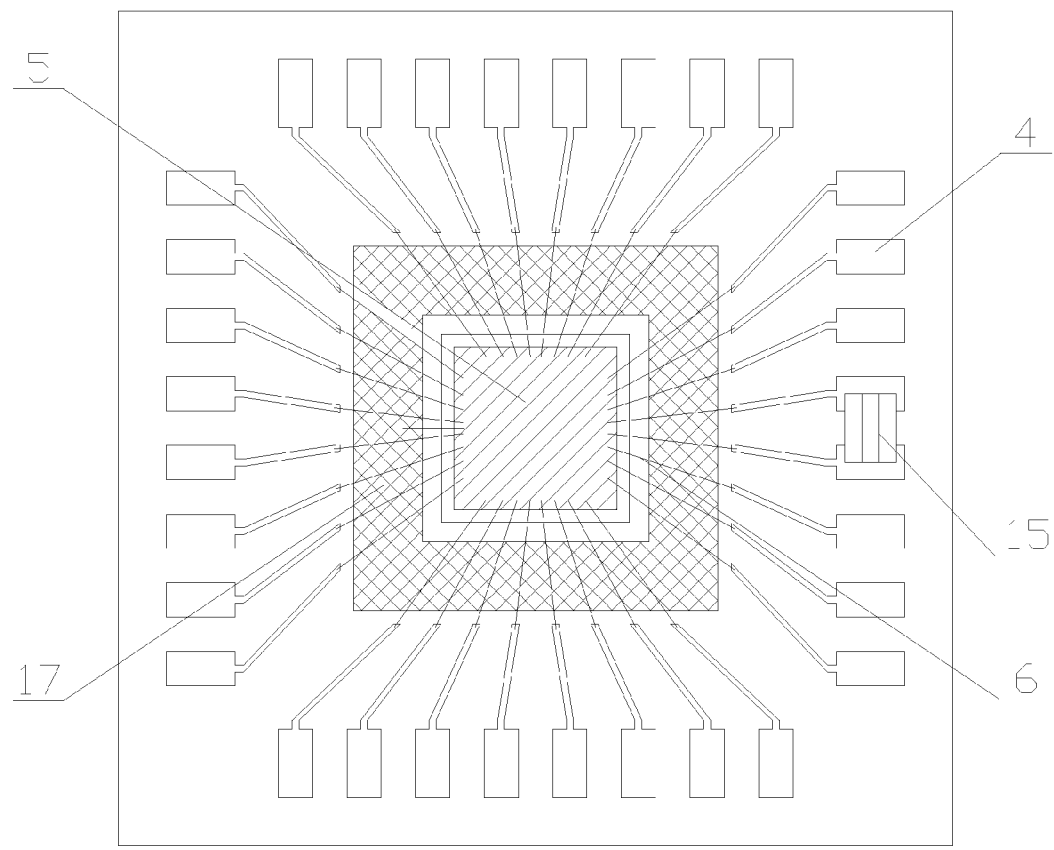
FIG. 55B is a top view of the exemplary barrel-plating QFN packaging structure of FIG. 55A.

FIG. 55A and FIG. 55B illustrate another exemplary barrel-plating QFN packaging structure. FIG. 55A is a cross-sectional view of FIG. 55B.

As shown in FIG. 55A and FIG. 55B, the QFN packaging structure in FIG. 55A and FIG. 55B is similar to the QFN packaging structure in FIG. 23A and FIG. 23B. However, the QFN packaging structure in FIG. 55A and FIG. 55B also includes an outer die pad 1, as previously explained. The inner die pad 3 is formed on the top surface of the outer die pad 1 by the multi-layer plating process. Thus, a QFN packaging structure with outer and inner die pads, a single lead ring coupled with passive devices, and electrostatic discharge rings may be formed.

Figure 56A:
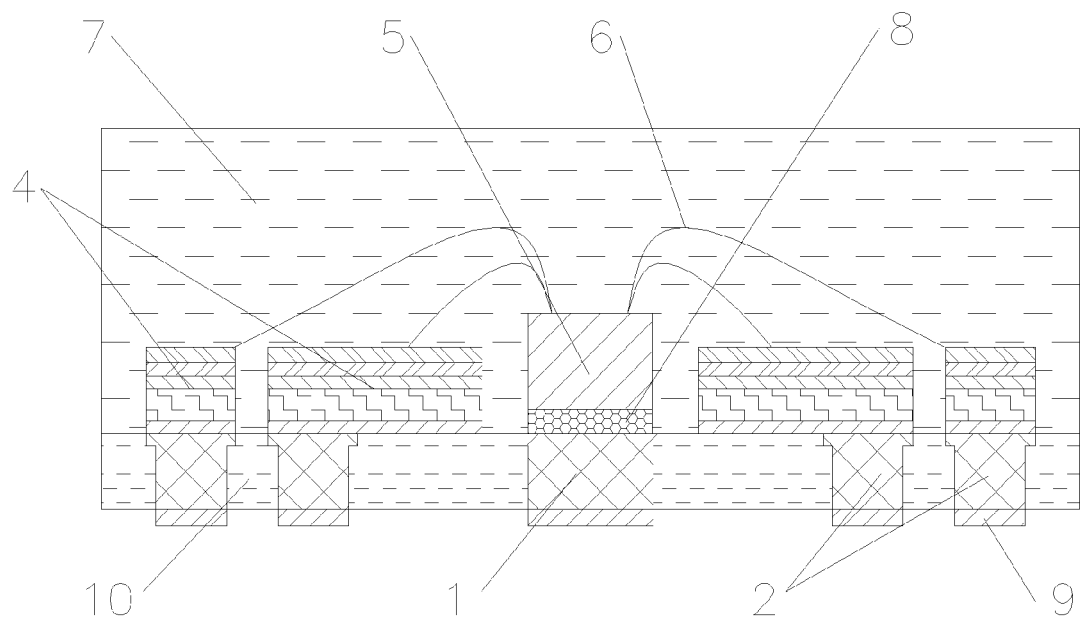
FIG. 56A is a cross-sectional view of another exemplary barrel-plating QFN packaging structure consistent with the disclosed embodiments.
Figure 56B:
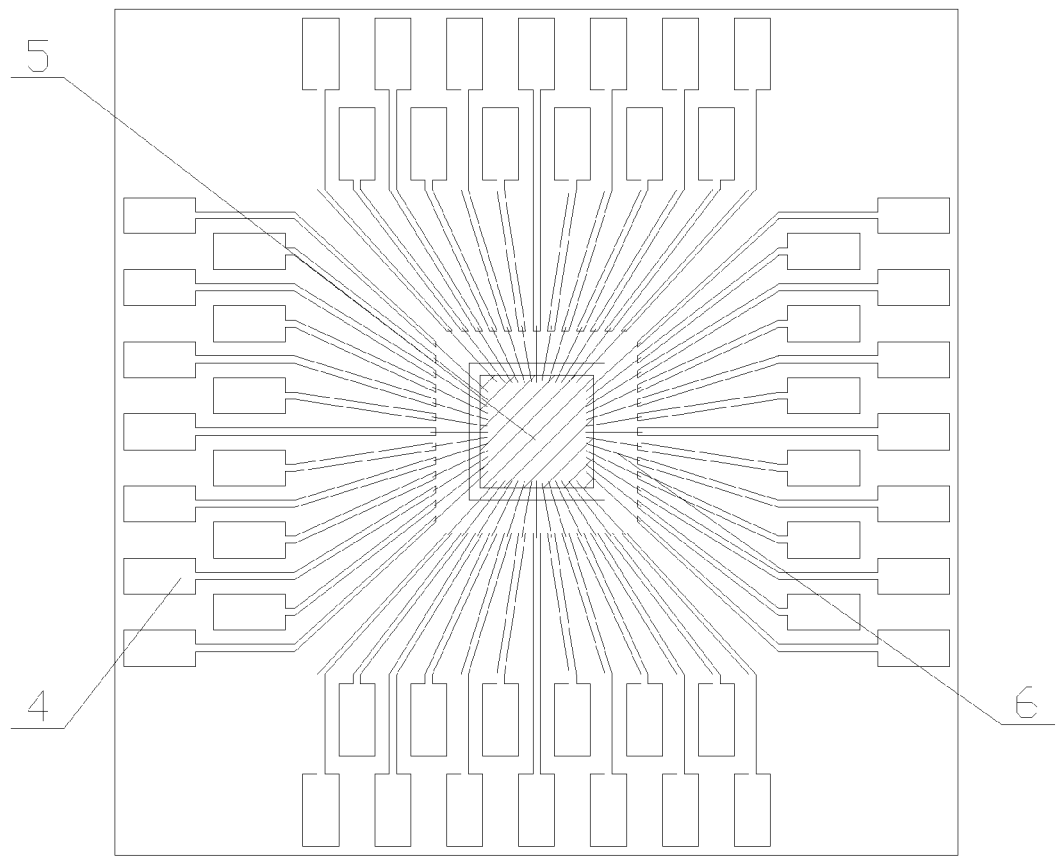
FIG. 56B is a top view of the exemplary barrel-plating QFN packaging structure of FIG. 56A.

FIG. 56A and FIG. 56B illustrate another exemplary barrel-plating QFN packaging structure. FIG. 56A is a cross-sectional view of FIG. 56B.

As shown in FIG. 56A and FIG. 56B, the QFN packaging structure in FIG. 56A and FIG. 56B is similar to the QFN packaging structure in FIG. 24A and FIG. 24B. However, the QFN packaging structure in FIGS. 56A and 59B includes an outer die pad 1, as previously explained. The die 5 is attached on the top surface of the outer die pad 1 via the conductive or non-conductive adhesive material 8. Thus, a QFN packaging structure with a single outer die pad and multiple lead rings may be formed.

Figure 57A:
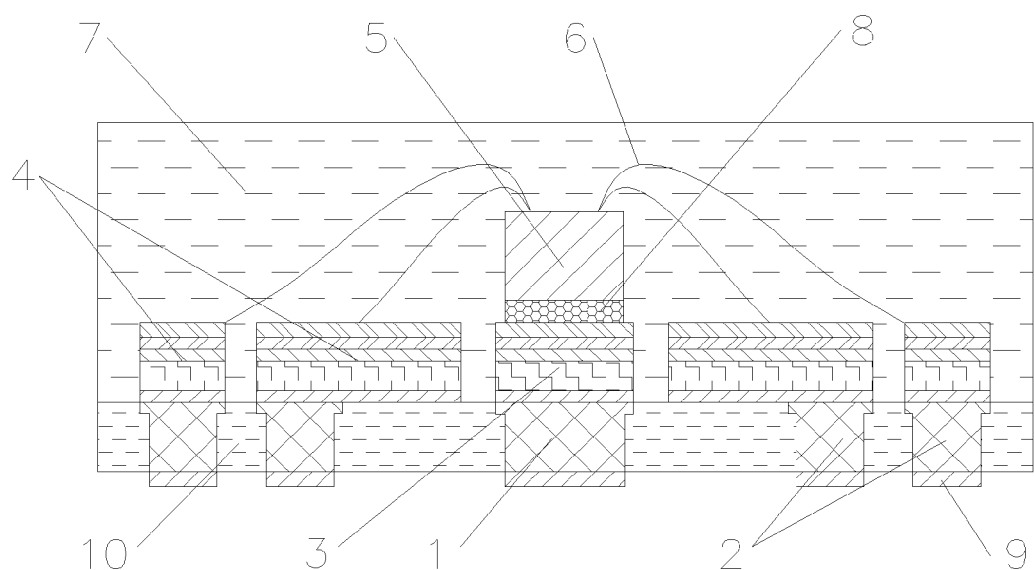
FIG. 57A is a cross-sectional view of another exemplary barrel-plating QFN packaging structure consistent with the disclosed embodiments.
Figure 57B:
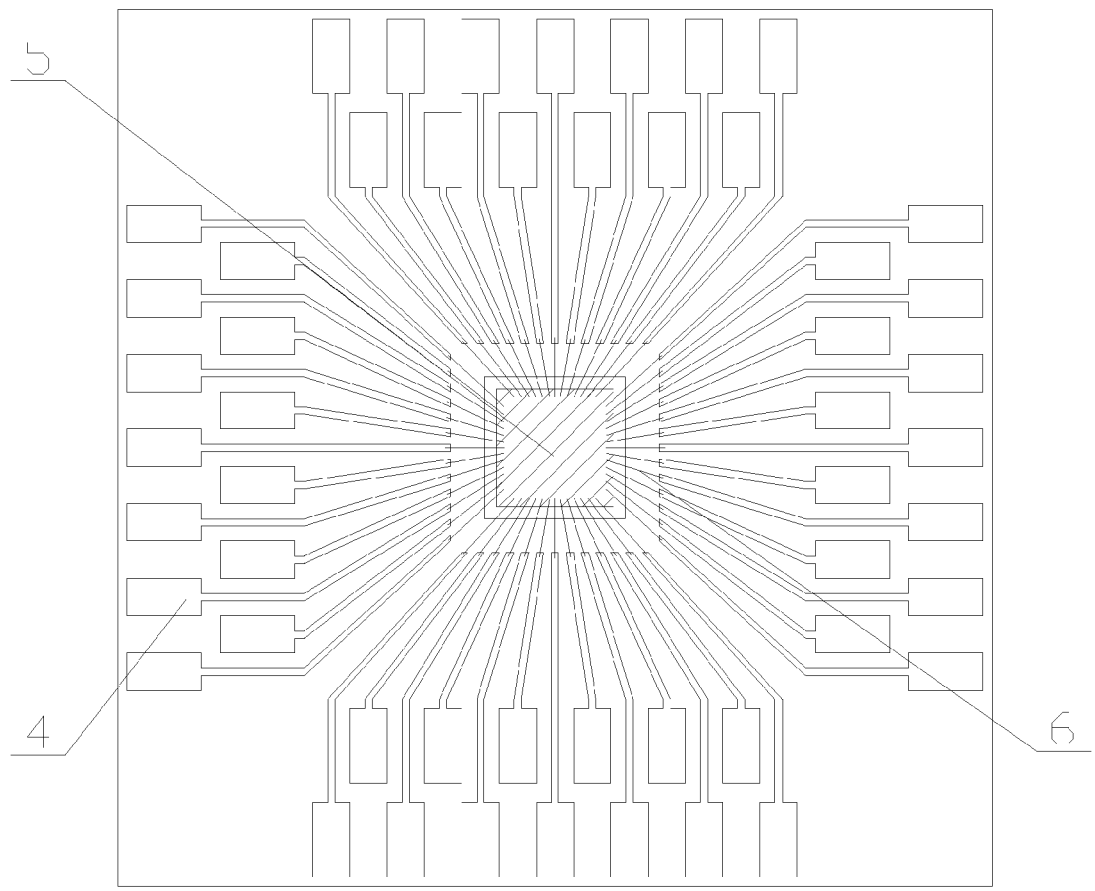
FIG. 57B is a top view of the exemplary barrel-plating QFN packaging structure of FIG. 57A.

FIG. 57A and FIG. 57B illustrate another exemplary barrel-plating QFN packaging structure. FIG. 57A is a cross-sectional view of FIG. 57B.

As shown in FIG. 57A and FIG. 57B, the QFN packaging structure in FIG. 57A and FIG. 57B is similar to the QFN packaging structure in FIG. 25A and FIG. 25B. However, the QFN packaging structure in FIGS. 57A and 60B includes an outer die pad 1, as previously explained. The inner die pad 3 is formed on the top surface of the outer die pad 1 by the multi-layer plating process. Thus, a QFN packaging structure with outer and inner die pads and multiple lead rings may be formed.

Figure 58A:
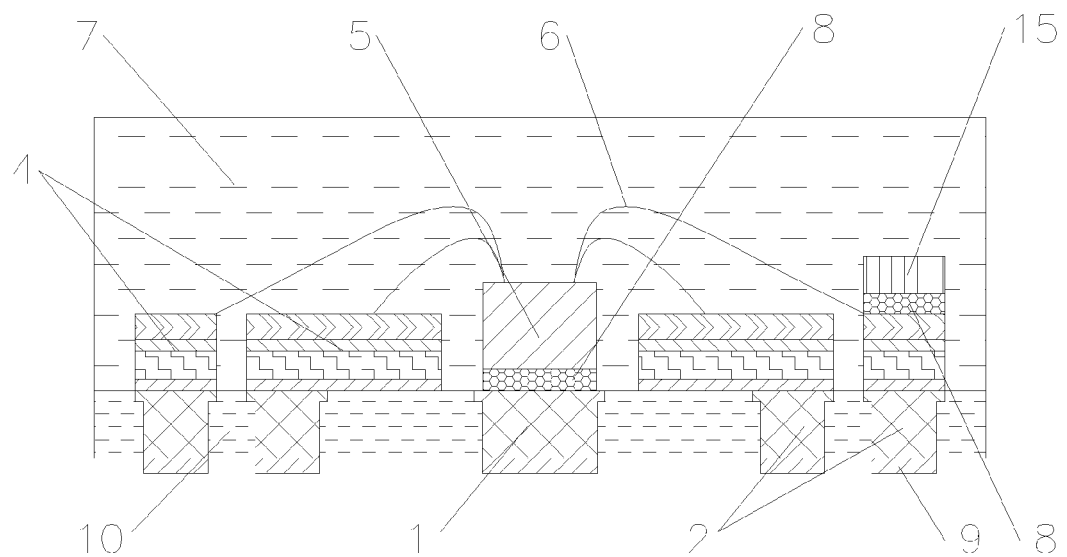
FIG. 58A is a cross-sectional view of another exemplary barrel-plating QFN packaging structure consistent with the disclosed embodiments.
Figure 58B:
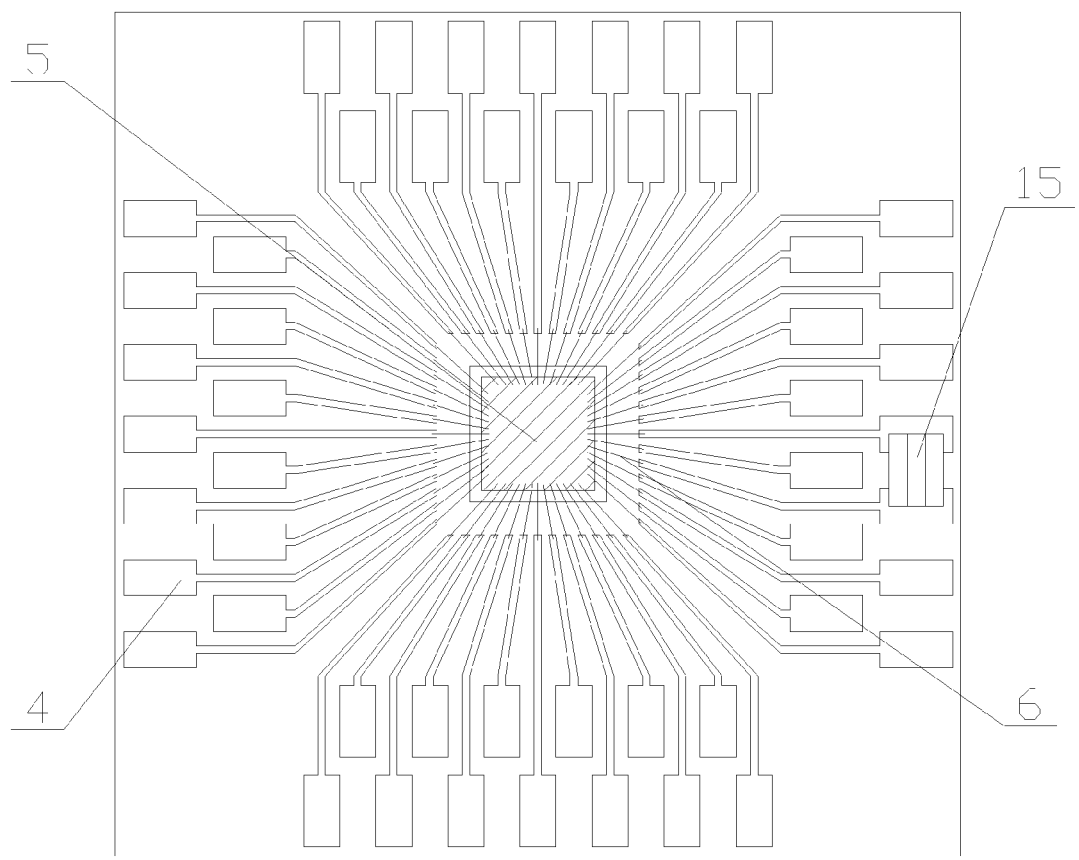
FIG. 58B is a top view of the exemplary barrel-plating QFN packaging structure of FIG. 58A.

FIG. 58A and FIG. 58B illustrate another exemplary barrel-plating QFN packaging structure. FIG. 58A is a cross-sectional view of FIG. 58B.

As shown in FIG. 58A and FIG. 58B, the QFN packaging structure in FIG. 58A and FIG. 58B is similar to the QFN packaging structure in FIG. 26A and FIG. 26B. However, the QFN packaging structure in FIGS. 58A and 61B includes an outer die pad 1, as previously explained. The die 5 is attached on the top surface of the outer die pad 1 via the conductive or non-conductive adhesive material 8. Thus, a QFN packaging structure with a single outer die pad and multiple lead rings coupled with passive devices may be formed.

Figure 59A:
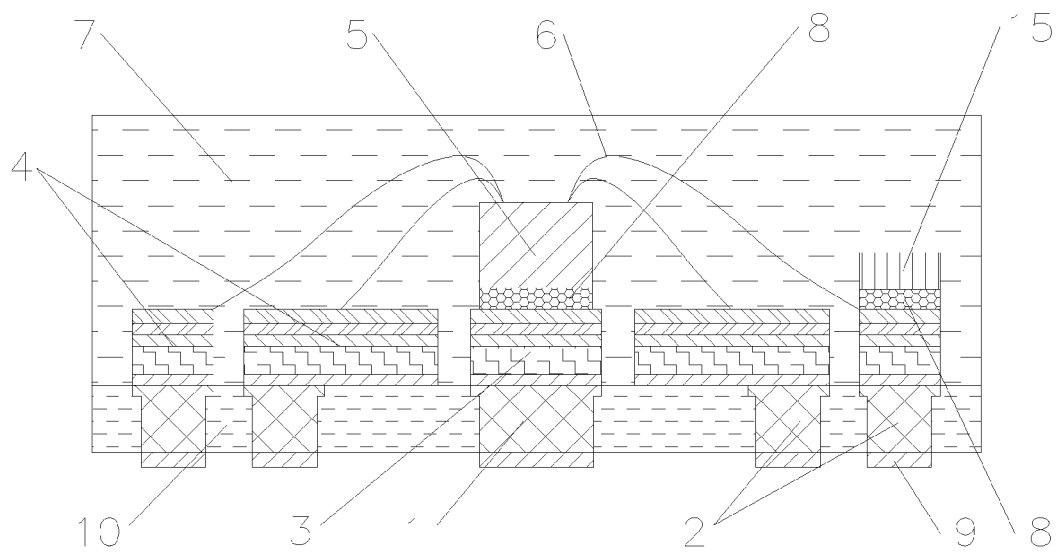
FIG. 59A is a cross-sectional view of another exemplary barrel-plating QFN packaging structure consistent with the disclosed embodiments.
Figure 59B:
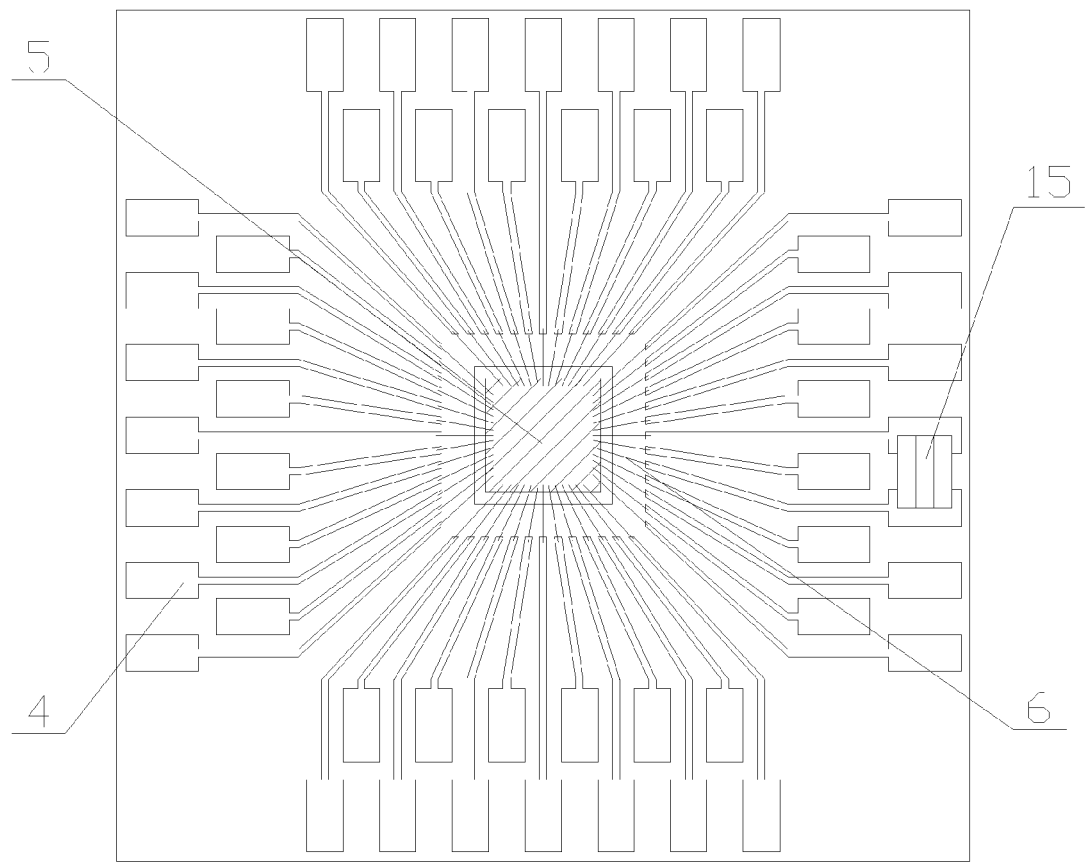
FIG. 59B is a top view of the exemplary barrel-plating QFN packaging structure of FIG. 59A.

FIG. 59A and FIG. 59B illustrate another exemplary barrel-plating QFN packaging structure. FIG. 59A is a cross-sectional view of FIG. 59B.

As shown in FIG. 59A and FIG. 59B, the QFN packaging structure in FIG. 59A and FIG. 59B is similar to the QFN packaging structure in FIG. 27A and FIG. 27B. However, the QFN packaging structure in FIGS. 59A and 62B includes an outer die pad 1, as previously explained. The inner die pad 3 is formed on the top surface of the outer die pad 1 by the multi-layer plating process. Thus, a QFN packaging structure with outer and inner die pads and multiple lead rings coupled with passive devices may be formed.

Figure 60A:
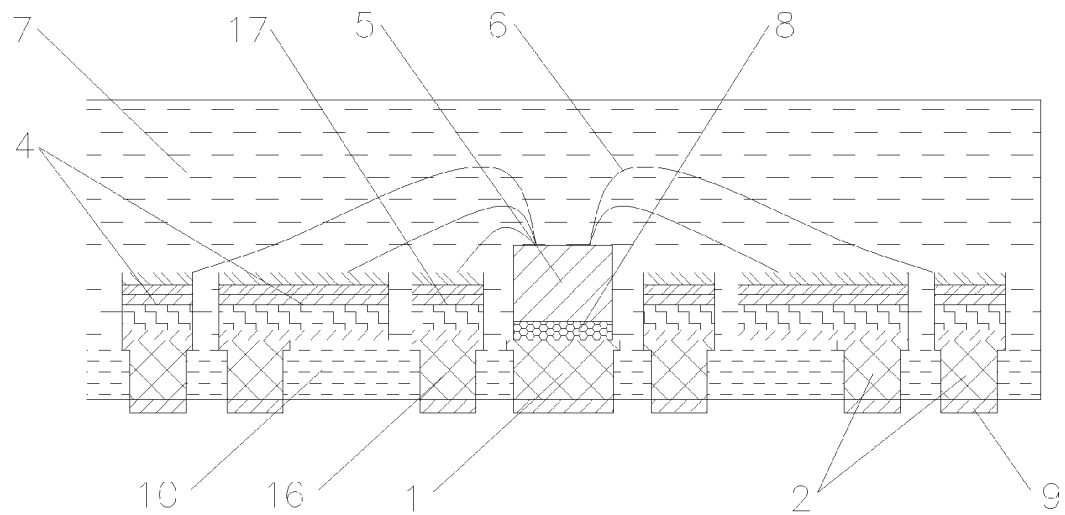
FIG. 60A is a cross-sectional view of another exemplary barrel-plating QFN packaging structure consistent with the disclosed embodiments.
Figure 60B:
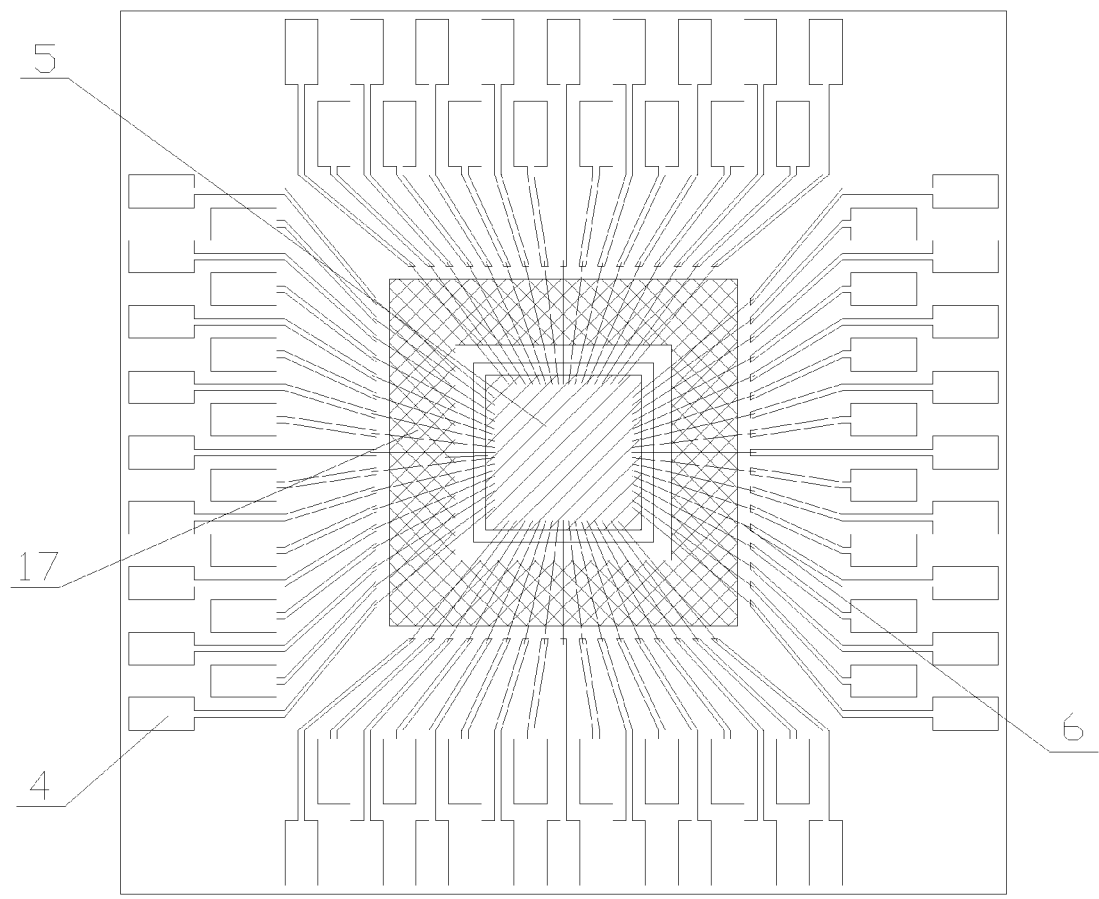
FIG. 60B is a top view of the exemplary barrel-plating QFN packaging structure of FIG. 60A.

FIG. 60A and FIG. 60B illustrate another exemplary barrel-plating QFN packaging structure. FIG. 60A is a cross-sectional view of FIG. 60B.

As shown in FIG. 60A and FIG. 60B, the QFN packaging structure in FIG. 60A and FIG. 60B is similar to the QFN packaging structure in FIG. 28A and FIG. 28B. However, the QFN packaging structure in FIGS. 60A and 63B includes an outer die pad 1, as previously explained. The die 5 is attached on the top surface of the outer die pad 1 via the conductive or non-conductive adhesive material 8. Thus, a QFN packaging structure with a single outer die pad, multiple lead rings, and electrostatic discharge rings may be formed.

Figure 61A:
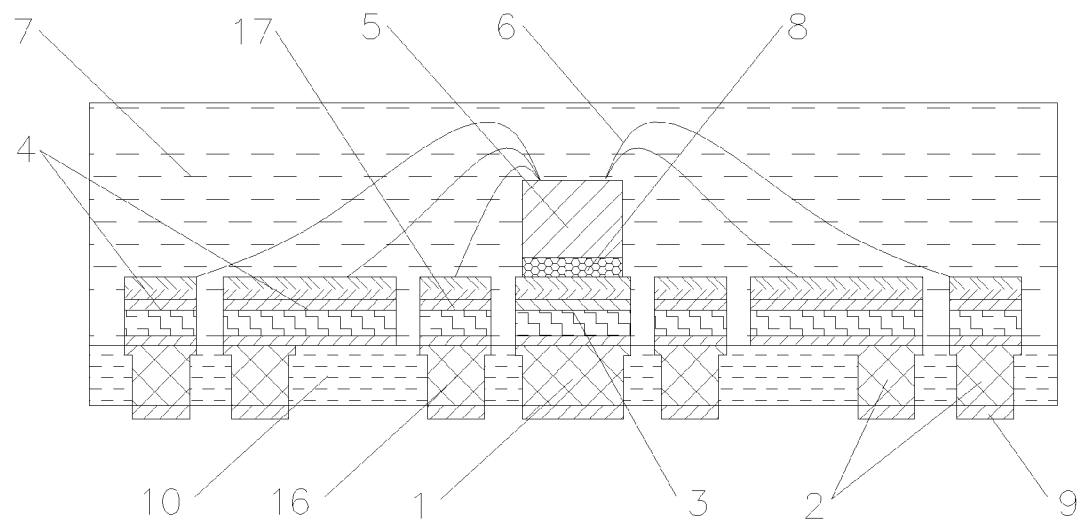
FIG. 61A is a cross-sectional view of another exemplary barrel-plating QFN packaging structure consistent with the disclosed embodiments.
Figure 61B:
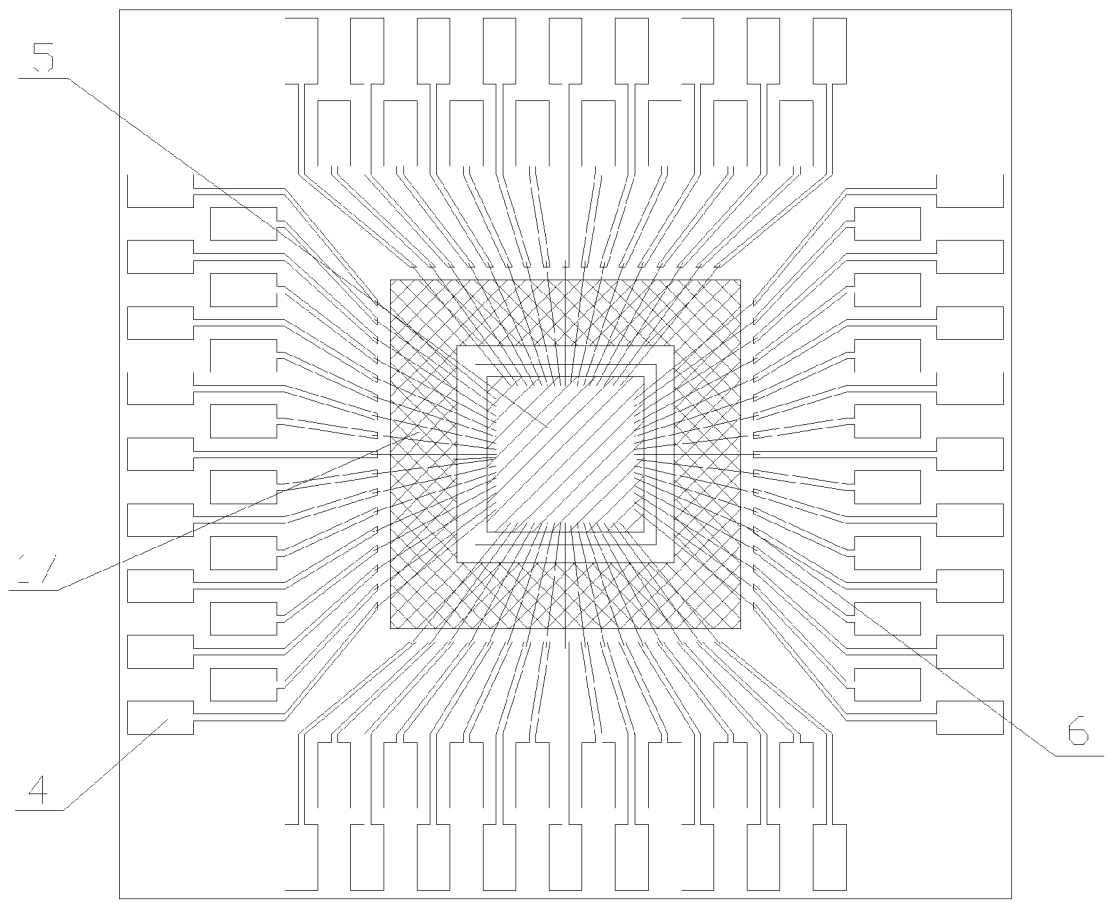
FIG. 61B is a top view of the exemplary barrel-plating QFN packaging structure of FIG. 61A.

FIG. 61A and FIG. 61B illustrate another exemplary barrel-plating QFN packaging structure. FIG. 61A is a cross-sectional view of FIG. 61B.

As shown in FIG. 61A and FIG. 61B, the QFN packaging structure in FIG. 61A and FIG. 61B is similar to the QFN packaging structure in FIG. 29A and FIG. 29B. However, the QFN packaging structure in FIGS. 61A and 64B includes an outer die pad 1, as previously explained. The inner die pad 3 is formed on the top surface of the outer die pad 1 by the multi-layer plating process. Thus, a QFN packaging structure with outer and inner die pads, multiple lead rings, and electrostatic discharge ring may be formed.

Figure 62A:
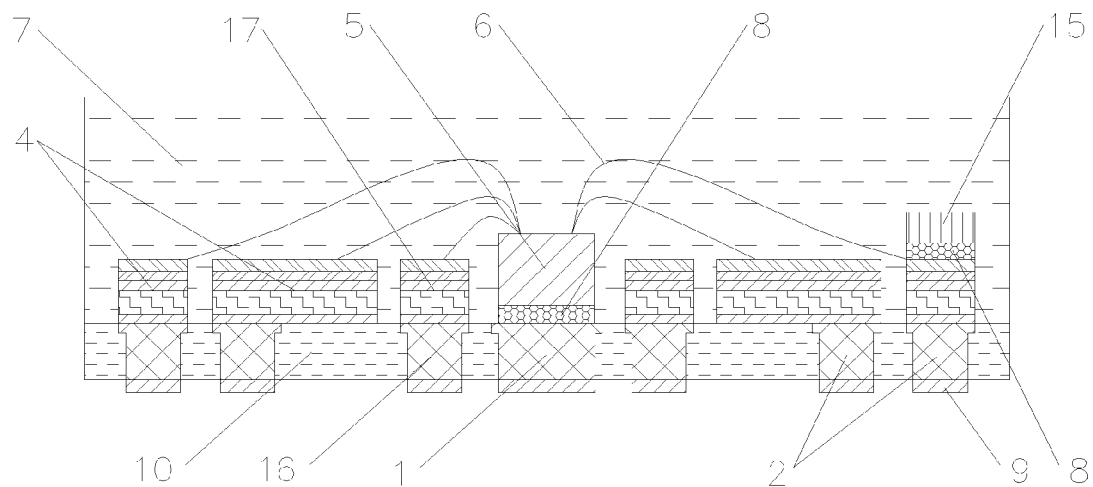
FIG. 62A is a cross-sectional view of another exemplary barrel-plating QFN packaging structure consistent with the disclosed embodiments.
Figure 62B:
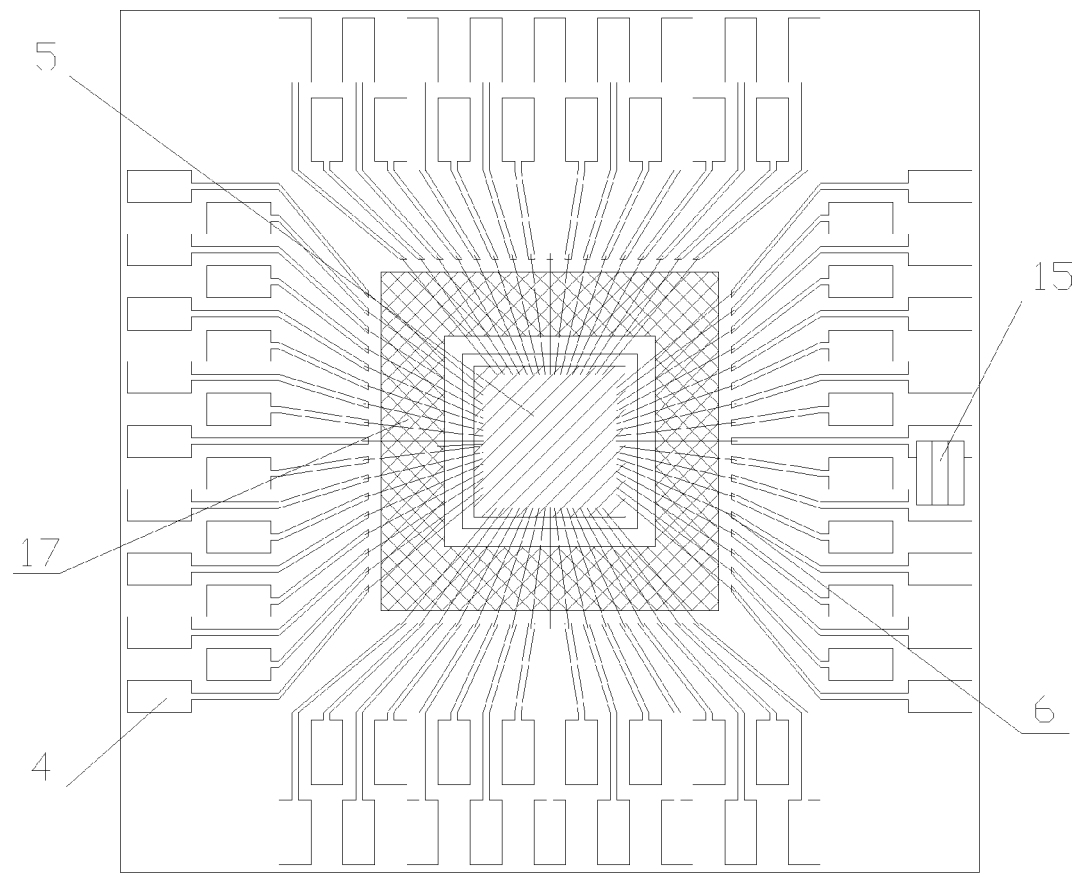
FIG. 62B is a top view of the exemplary barrel-plating QFN packaging structure of FIG. 62A.

FIG. 62A and FIG. 62B illustrate another exemplary barrel-plating QFN packaging structure. FIG. 62A is a cross-sectional view of FIG. 62B.

As shown in FIG. 62A and FIG. 62B, the QFN packaging structure in FIG. 62A and FIG. 62B is similar to the QFN packaging structure in FIG. 30A and FIG. 30B. However, the QFN packaging structure in FIGS. 62A and 65B includes an outer die pad 1, as previously explained. The die 5 is attached on the top surface of the outer die pad 1 via the conductive or non-conductive adhesive material 8. Thus, a QFN packaging structure with a single outer die pad, multiple lead rings coupled with passive devices, and electrostatic discharge rings may be formed.

Figure 63A:
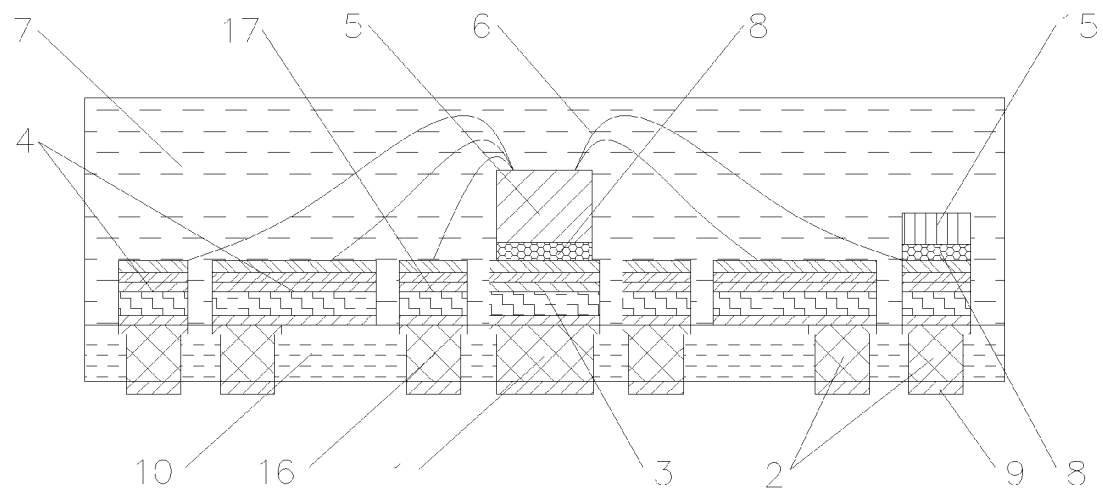
FIG. 63A is a cross-sectional view of another exemplary barrel-plating QFN packaging structure consistent with the disclosed embodiments.
Figure 63B:
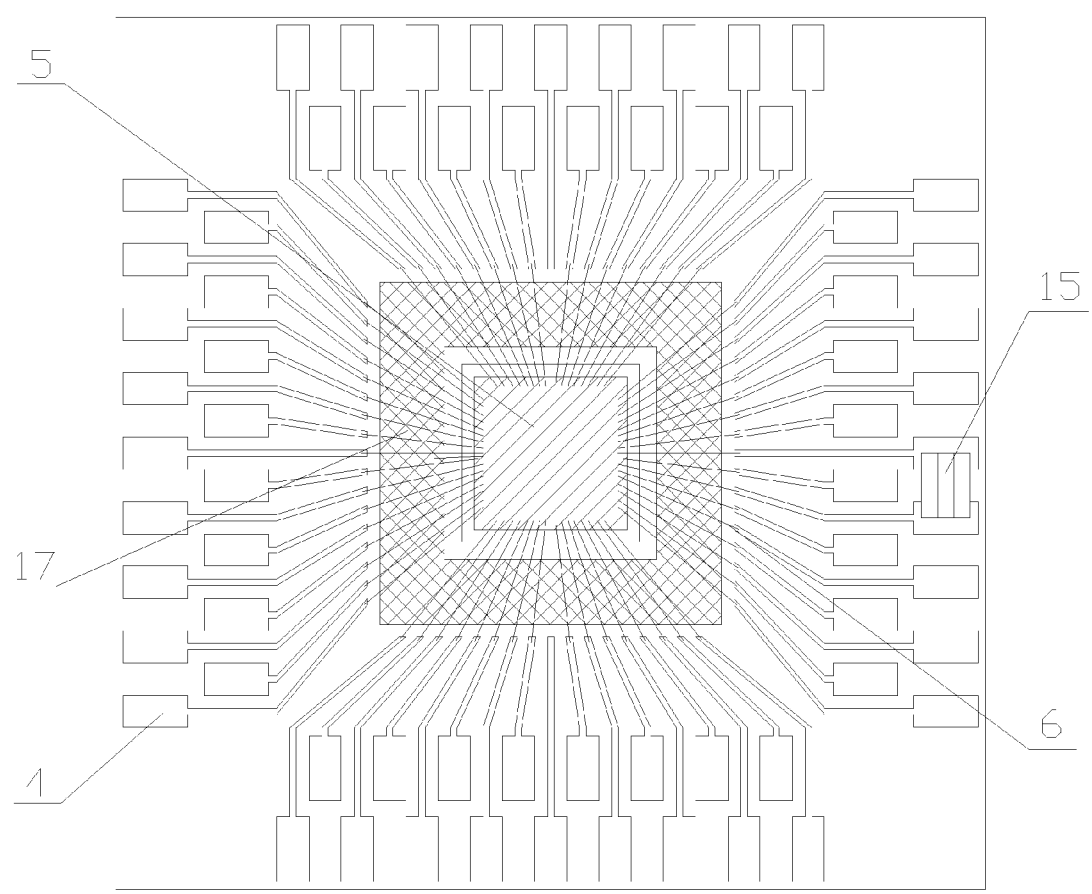
FIG. 63B is a top view of the exemplary barrel-plating QFN packaging structure of FIG. 63A.

FIG. 63A and FIG. 63B illustrate another exemplary barrel-plating QFN packaging structure. FIG. 63A is a cross-sectional view of FIG. 63B.

As shown in FIG. 63A and FIG. 63B, the QFN packaging structure in FIG. 63A and FIG. 63B is similar to the QFN packaging structure in FIG. 31A and FIG. 31B. However, the QFN packaging structure in FIGS. 63A and 66B includes an outer die pad 1, as previously explained. The inner die pad 3 is formed on the top surface of the outer die pad 1 by the multi-layer plating process. Thus, a QFN packaging structure with outer and inner die pads, multiple lead rings coupled with passive devices, and electrostatic discharge rings may be formed.

Figure 64A:
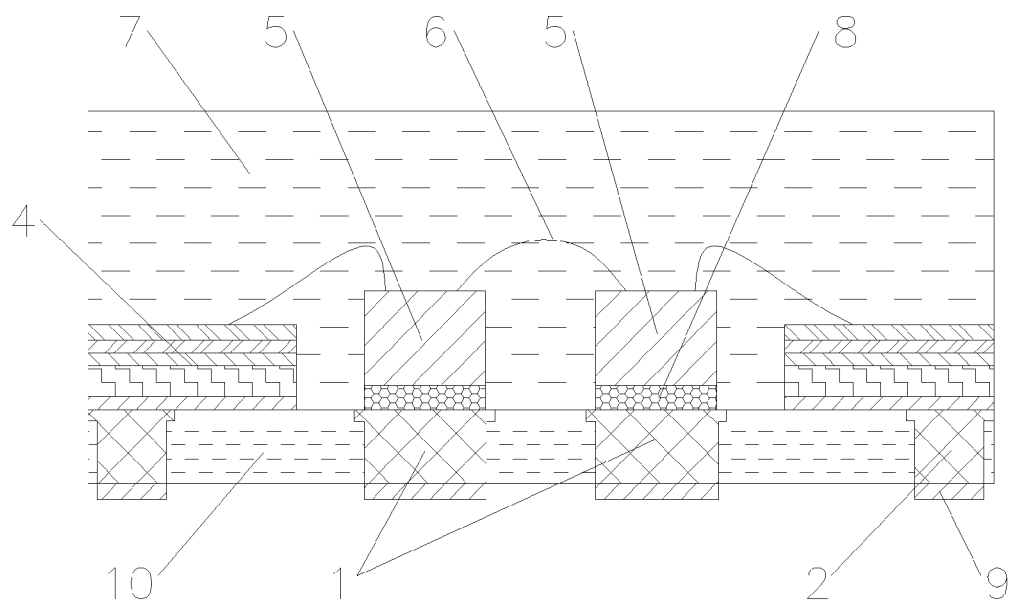
FIG. 64A is a cross-sectional view of another exemplary barrel-plating QFN packaging structure consistent with the disclosed embodiments.
Figure 64B:
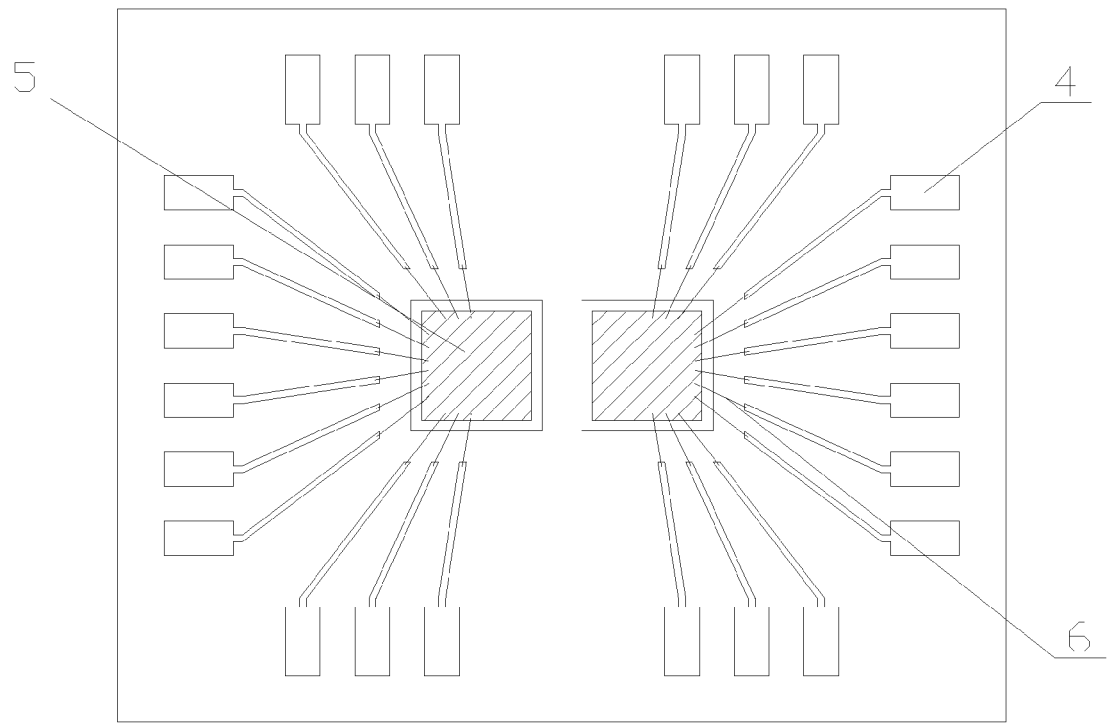
FIG. 64B is a top view of the exemplary barrel-plating QFN packaging structure of FIG. 64A.

FIG. 64A and FIG. 64B illustrate another exemplary barrel-plating QFN packaging structure. FIG. 64A is a cross-sectional view of FIG. 64B.

As shown in FIG. 64A and FIG. 64B, the QFN packaging structure in FIG. 64A and FIG. 64B is similar to the QFN packaging structure in FIG. 32A and FIG. 32B. However, the QFN packaging structure in FIGS. 64A and 67B includes a plurality of outer die pads 1 and a plurality of dies 5. Each of the plurality of dies 5 is attached on the top surface of a corresponding outer die pad 1 by the conductive or non-conductive adhesive material 8. For example, a second outer die pad 1 is arranged in a side-by-side configuration with respect to the first or the original outer die pad 1, and a second die is attached on the top surface of the corresponding second outer die pad 1. Thus, a QFN packaging structure with multiple die pads and a single lead ring may be formed.

Figure 65A:
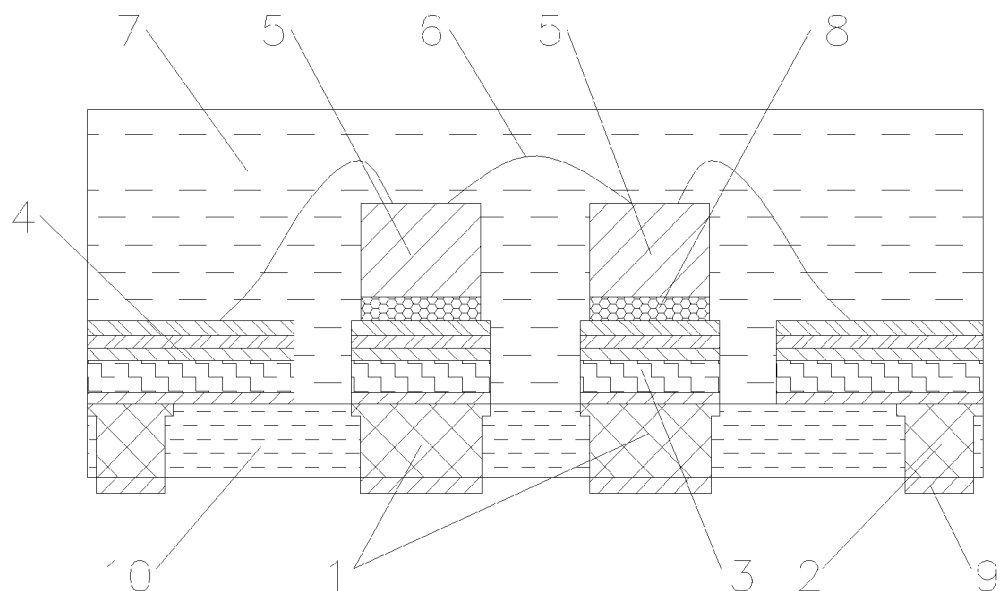
FIG. 65A is a cross-sectional view of another exemplary barrel-plating QFN packaging structure consistent with the disclosed embodiments.
Figure 65B:
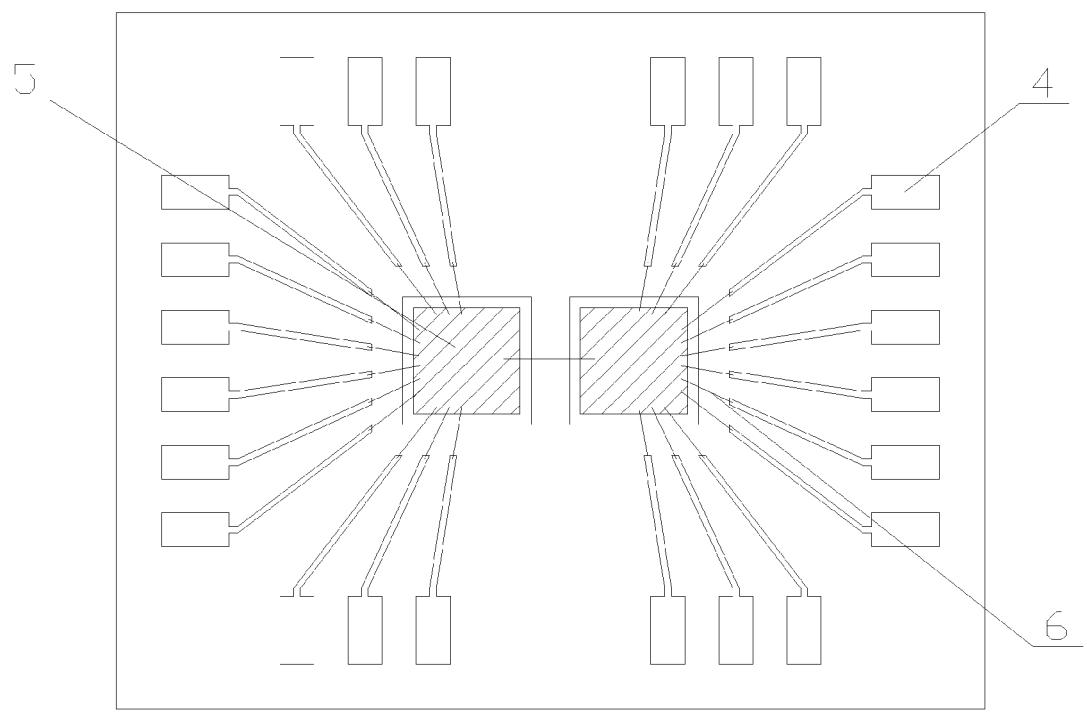
FIG. 65B is a top view of the exemplary barrel-plating QFN packaging structure of FIG. 65A.

FIG. 65A and FIG. 65B illustrate another exemplary barrel-plating QFN packaging structure. FIG. 65A is a cross-sectional view of FIG. 65B.

As shown in FIG. 65A and FIG. 65B, the QFN packaging structure in FIG. 65A and FIG. 65B is similar to the QFN packaging structure in FIG. 33A and FIG. 33B. However, the QFN packaging structure in FIGS. 65A and 68B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads and a single lead ring may be formed.

Figure 66A:
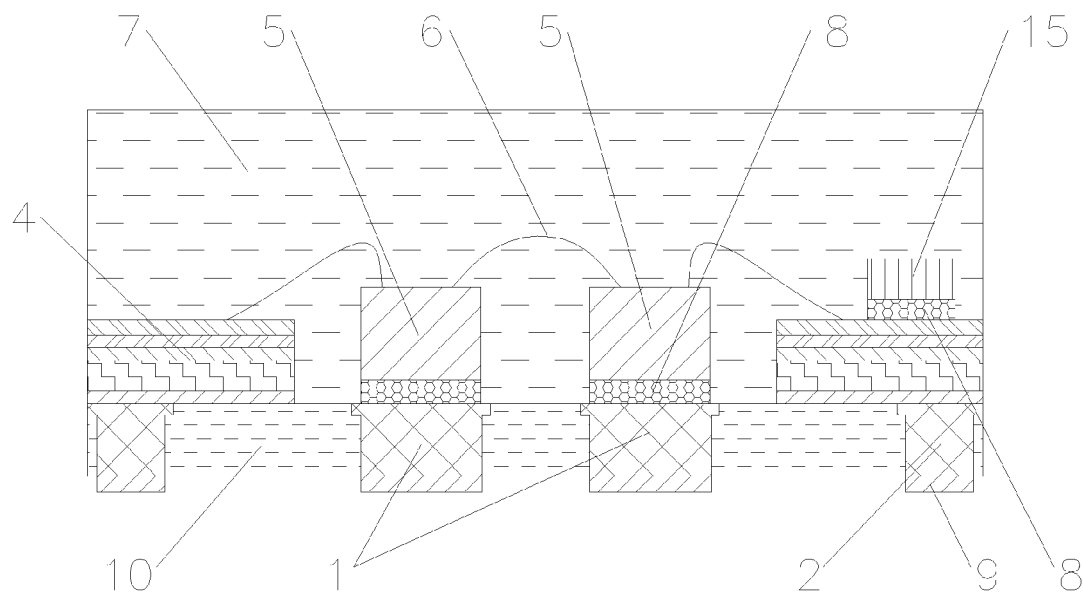
FIG. 66A is a cross-sectional view of another exemplary barrel-plating QFN packaging structure consistent with the disclosed embodiments.
Figure 66B:
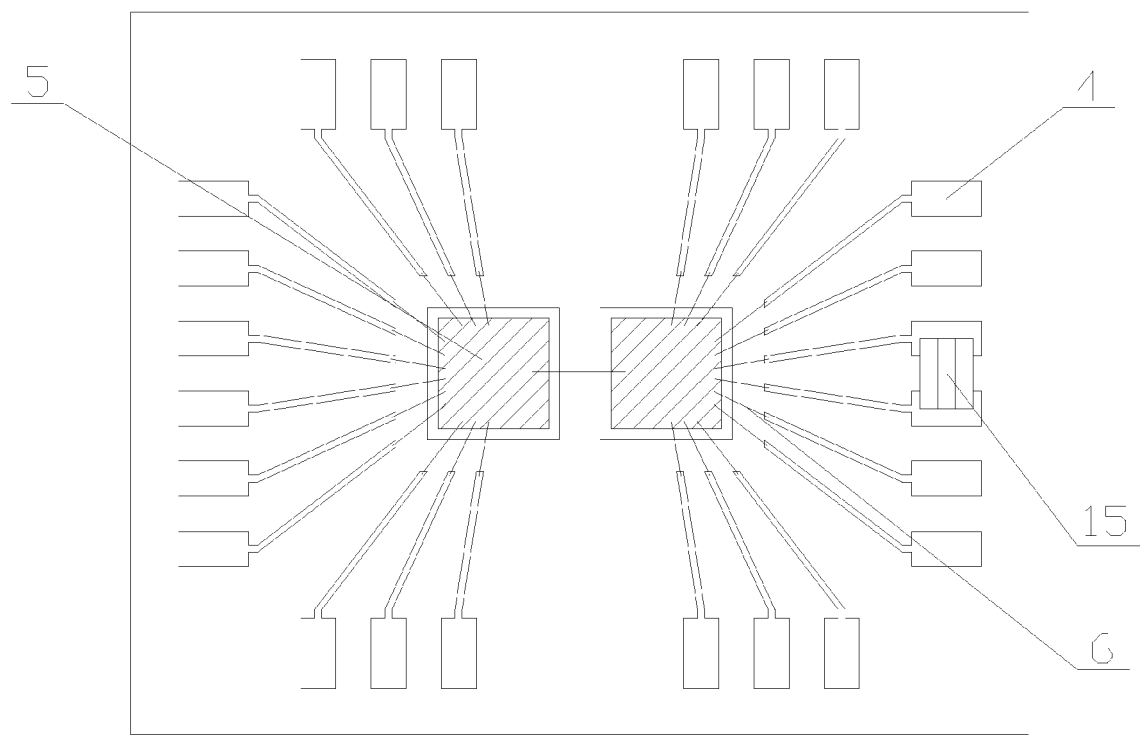
FIG. 66B is a top view of the exemplary barrel-plating QFN packaging structure of FIG. 66A.

FIG. 66A and FIG. 66B illustrate another exemplary barrel-plating QFN packaging structure. FIG. 66A is a cross-sectional view of FIG. 66B.

As shown in FIG. 66A and FIG. 66B, the QFN packaging structure in FIG. 66A and FIG. 66B is similar to the QFN packaging structure in FIG. 34A and FIG. 34B. However, the QFN packaging structure in FIGS. 66A and 69B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads and a single lead ring coupled with passive devices may be formed.

Figure 67A:
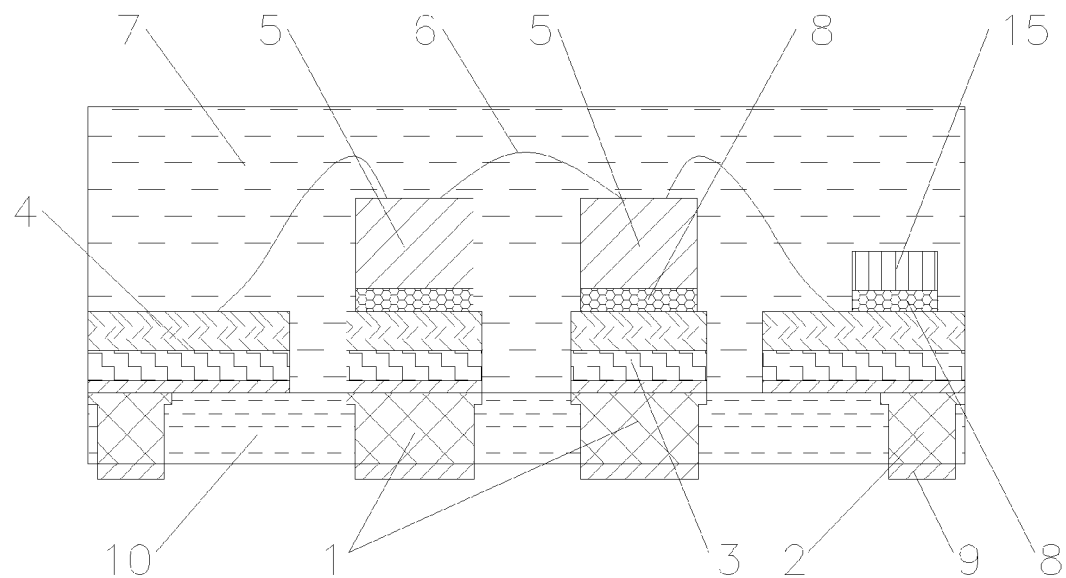
FIG. 67A is a cross-sectional view of another exemplary barrel-plating QFN packaging structure consistent with the disclosed embodiments.
Figure 67B:
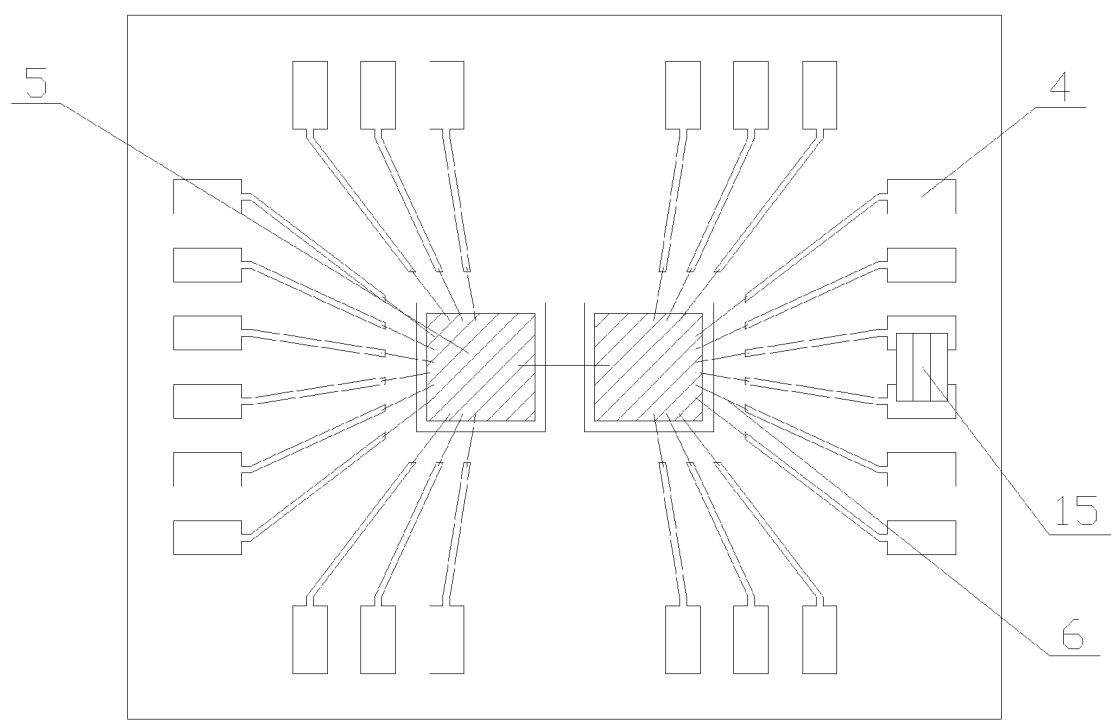
FIG. 67B is a top view of the exemplary barrel-plating QFN packaging structure of FIG. 67A.

FIG. 67A and FIG. 67B illustrate another exemplary barrel-plating QFN packaging structure. FIG. 67A is a cross-sectional view of FIG. 67B.

As shown in FIG. 67A and FIG. 67B, the QFN packaging structure in FIG. 67A and FIG. 67B is similar to the QFN packaging structure in FIG. 35A and FIG. 35B. However, the QFN packaging structure in FIGS. 67A and 70B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads and a single lead ring coupled with passive devices may be formed.

Figure 68A:
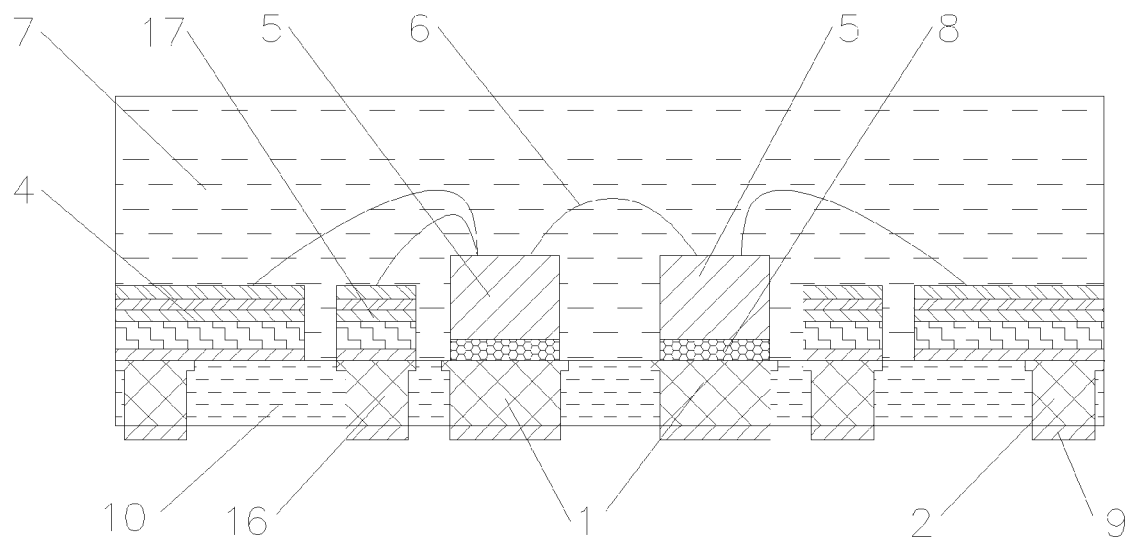
Figure 68B:
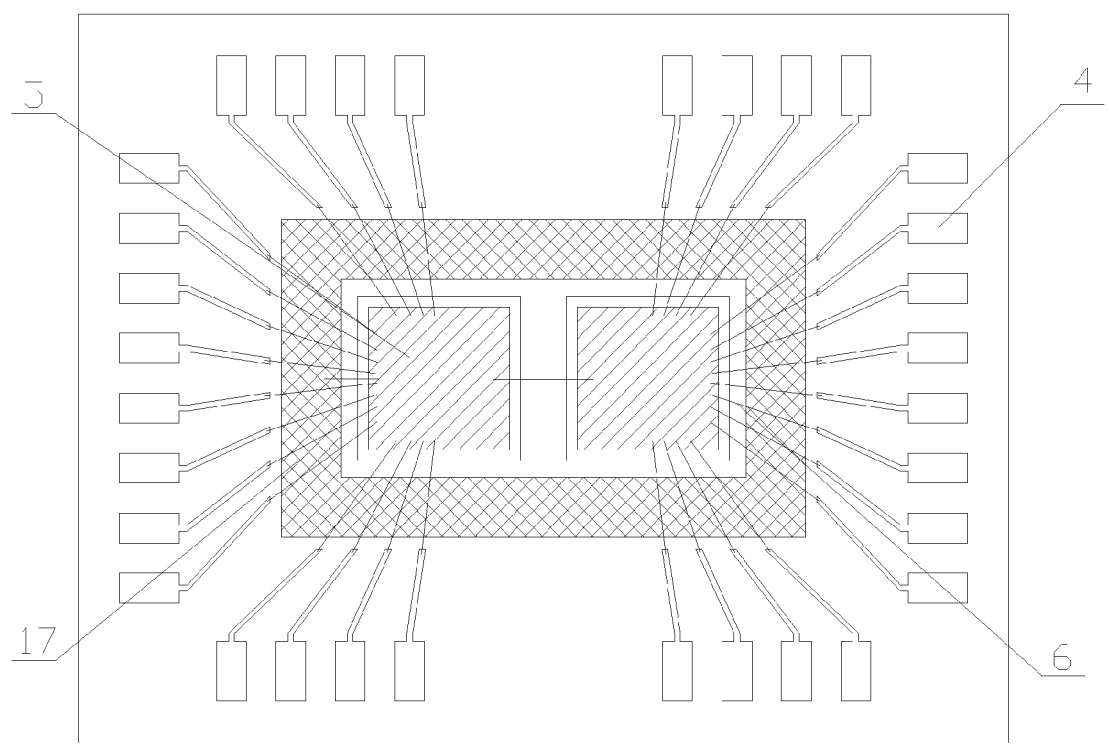

FIG. 68A and FIG. 68B illustrate another exemplary barrel-plating QFN packaging structure. FIG. 68A is a cross-sectional view of FIG. 68B.

As shown in FIG. 68A and FIG. 68B, the QFN packaging structure in FIG. 68A and FIG. 68B is similar to the QFN packaging structure in FIG. 36A and FIG. 36B. However, the QFN packaging structure in FIGS. 68A and 71B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads, a single lead ring, and electrostatic discharge rings may be formed.

Figure 69A:
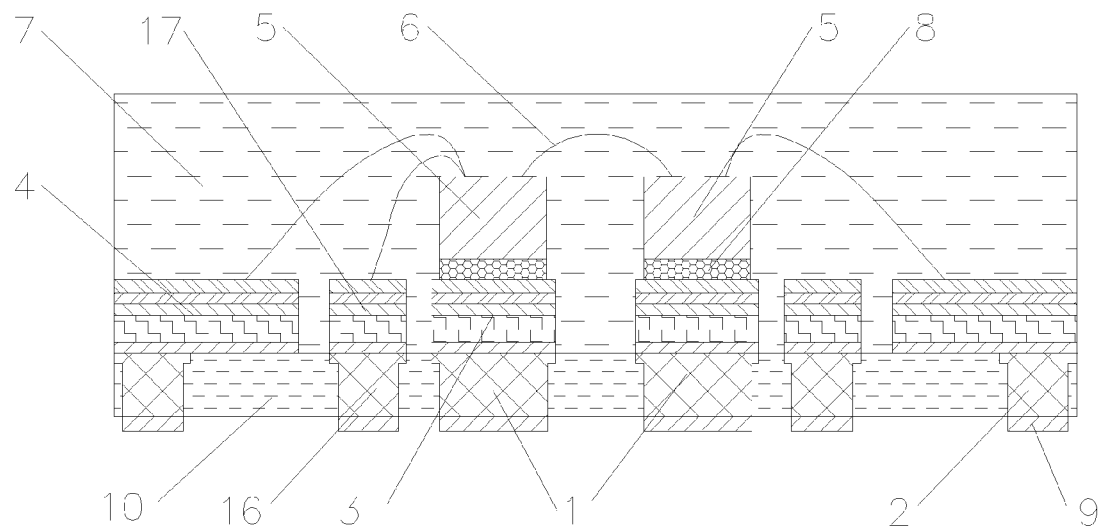
Figure 69B:
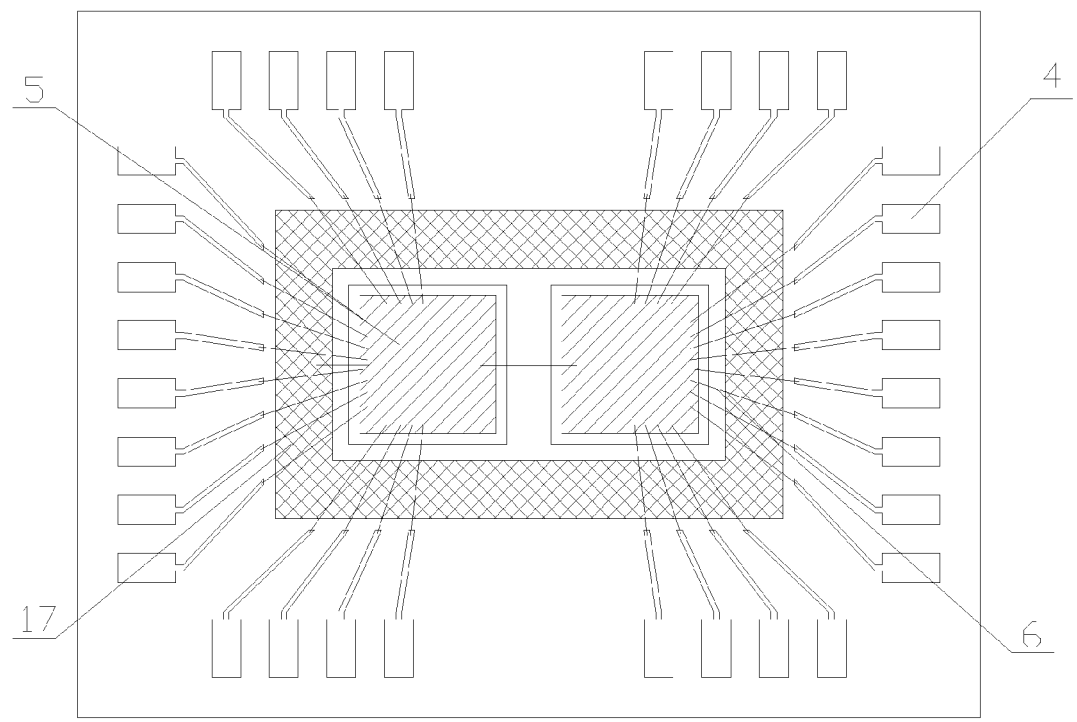

FIG. 69A and FIG. 69B illustrate another exemplary barrel-plating QFN packaging structure. FIG. 69A is a cross-sectional view of FIG. 69B.

As shown in FIG. 69A and FIG. 69B, the QFN packaging structure in FIG. 69A and FIG. 69B is similar to the QFN packaging structure in FIG. 37A and FIG. 37B. However, the QFN packaging structure in FIGS. 69A and 72B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads, a single lead ring, and electrostatic discharge rings may be formed.

Figure 70A:
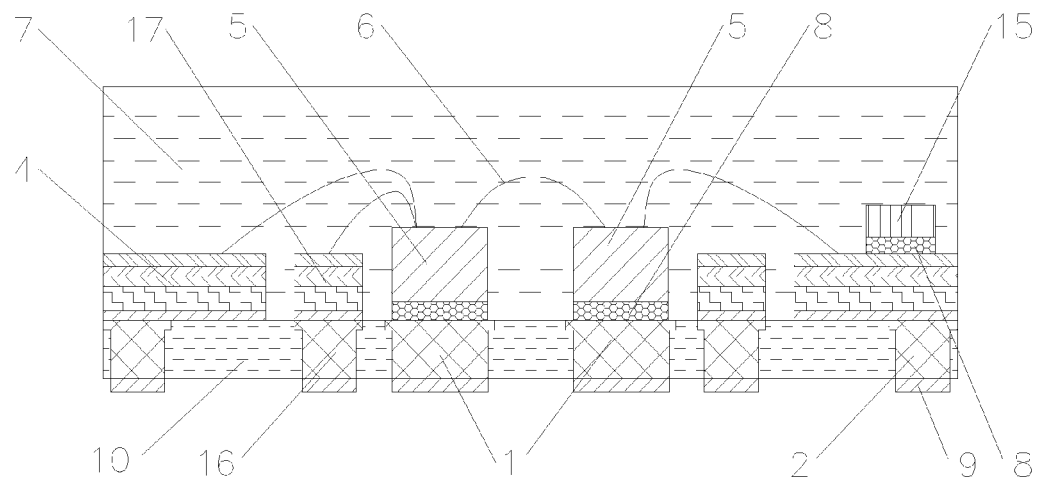
Figure 70B:
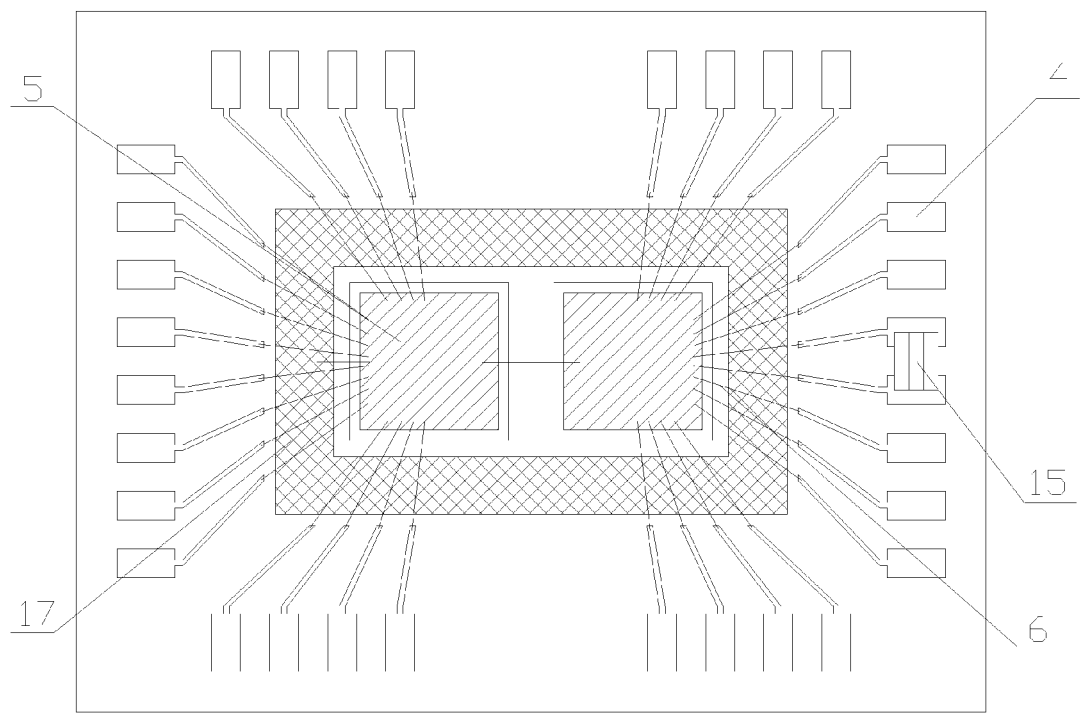

FIG. 70A and FIG. 70B illustrate another exemplary barrel-plating QFN packaging structure. FIG. 70A is a cross-sectional view of FIG. 70B.

As shown in FIG. 70A and FIG. 70B, the QFN packaging structure in FIG. 70A and FIG. 70B is similar to the QFN packaging structure in FIG. 38A and FIG. 38B. However, the QFN packaging structure in FIGS. 70A and 73B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads, a single lead ring coupled with passive device, and electrostatic discharge rings may be formed.

Figure 71A:
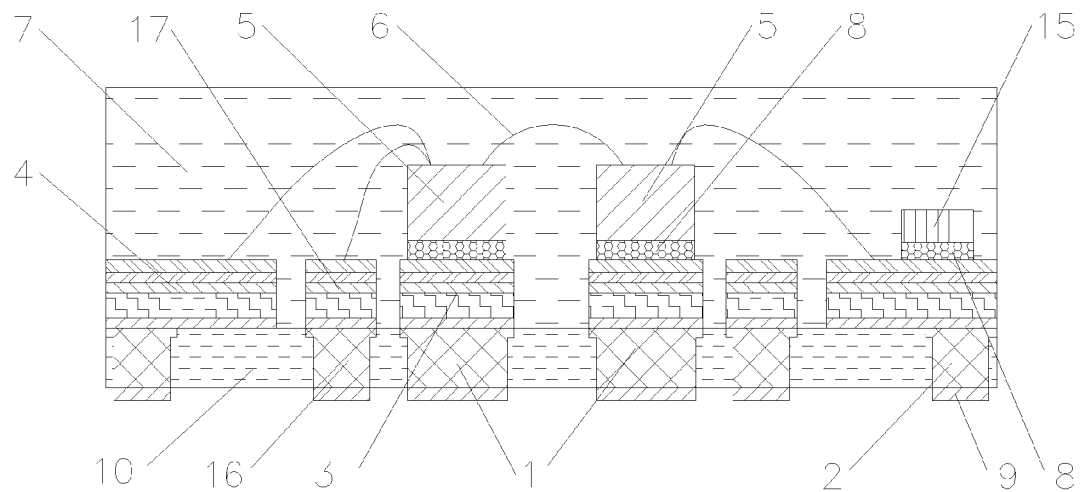
Figure 71B:
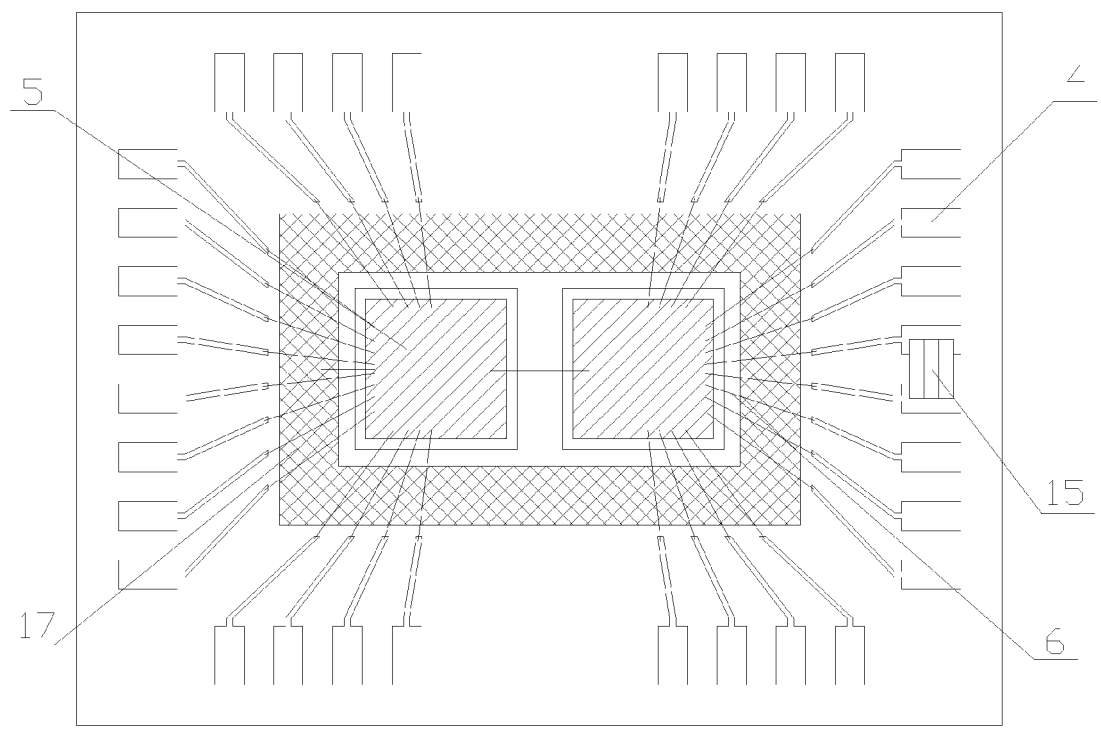

FIG. 71A and FIG. 71B illustrate another exemplary barrel-plating QFN packaging structure. FIG. 71A is a cross-sectional view of FIG. 71B.

As shown in FIG. 71A and FIG. 71B, the QFN packaging structure in FIG. 71A and FIG. 71B is similar to the QFN packaging structure in FIG. 39A and FIG. 39B. However, the QFN packaging structure in FIGS. 71A and 74B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads, a single lead ring coupled with passive devices, and electrostatic discharge rings may be formed.

Figure 72A:
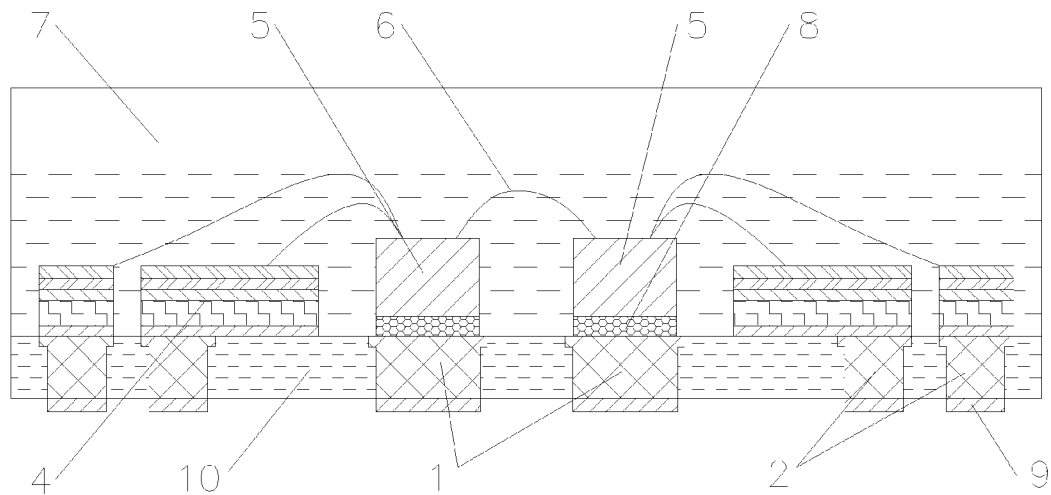
Figure 72B:
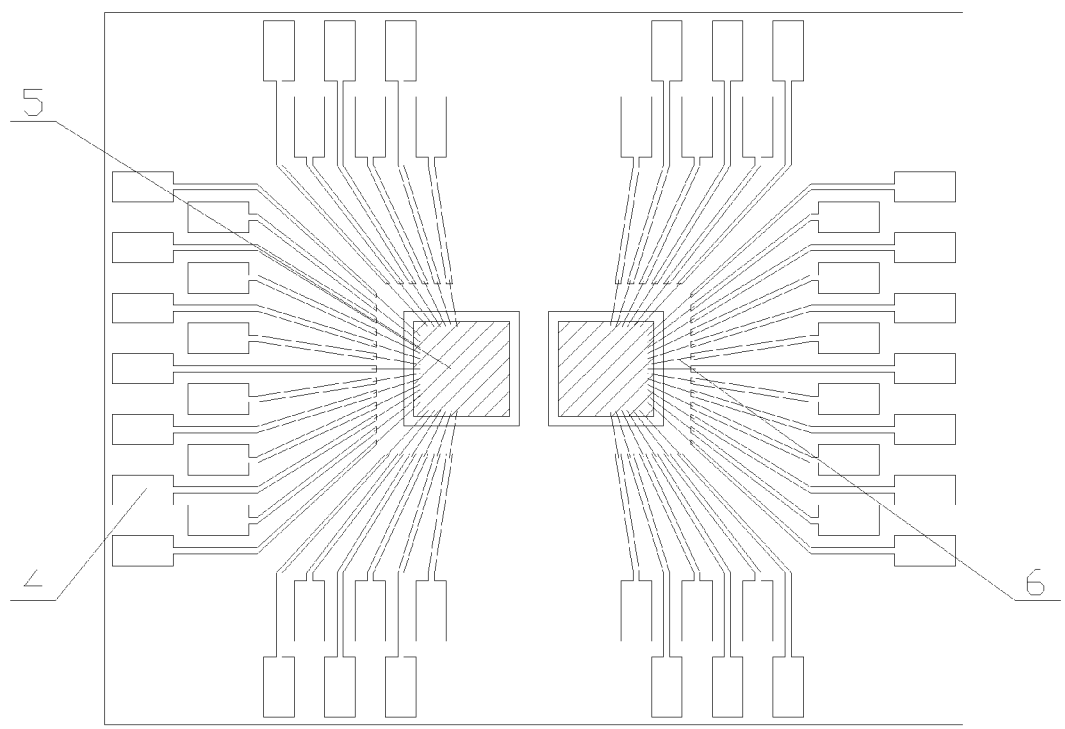

FIG. 72A and FIG. 72B illustrate another exemplary barrel-plating QFN packaging structure. FIG. 72A is a cross-sectional view of FIG. 72B.

As shown in FIG. 72A and FIG. 72B, the QFN packaging structure in FIG. 72A and FIG. 72B is similar to the QFN packaging structure in FIG. 40A and FIG. 40B. However, the QFN packaging structure in FIGS. 72A and 75B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads and multiple lead rings may be formed.

Figure 73A:
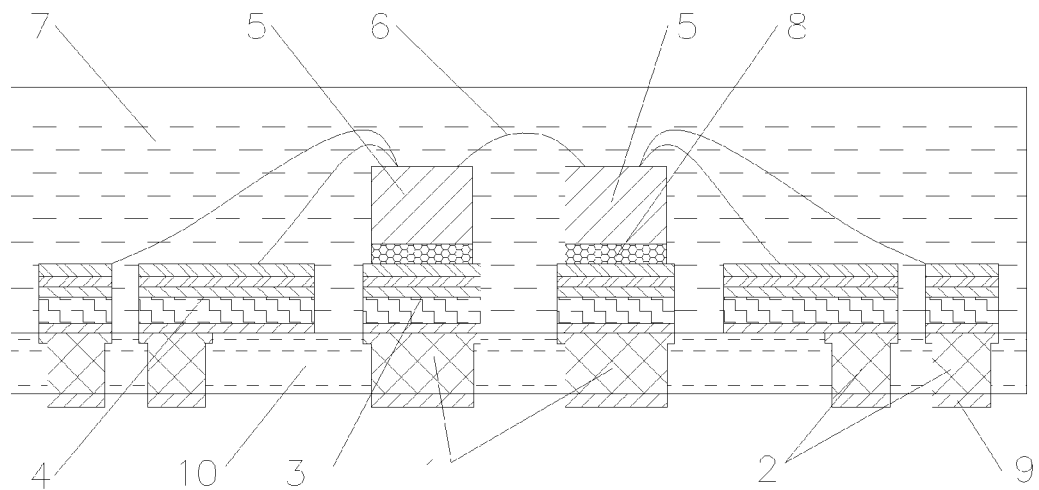
Figure 73B:
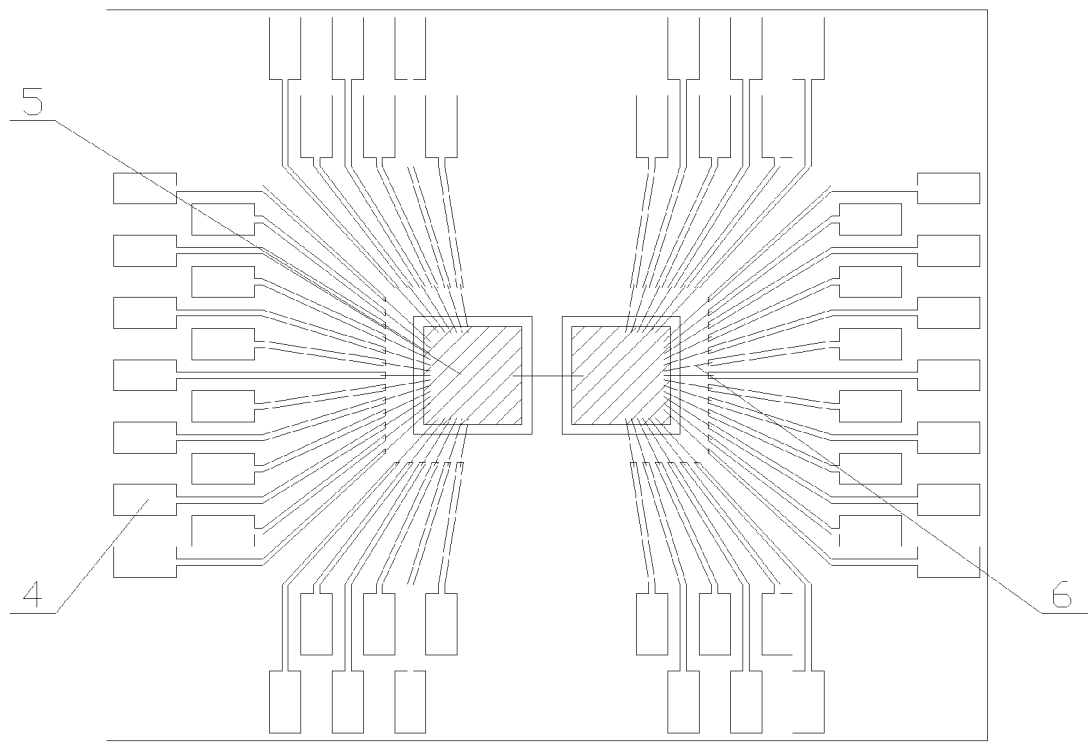

FIG. 73A and FIG. 73B illustrate another exemplary barrel-plating QFN packaging structure. FIG. 73A is a cross-sectional view of FIG. 73B.

As shown in FIG. 73A and FIG. 73B, the QFN packaging structure in FIG. 73A and FIG. 73B is similar to the QFN packaging structure in FIG. 41A and FIG. 41B. However, the QFN packaging structure in FIGS. 73A and 76B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads and multiple lead rings may be formed.

FIG. 74A and FIG. 74B illustrate another exemplary barrel-plating QFN packaging structure. FIG. 74A is a cross-sectional view of FIG. 74B.

As shown in FIG. 74A and FIG. 74B, the QFN packaging structure in FIG. 74A and FIG. 74B is similar to the QFN packaging structure in FIG. 42A and FIG. 42B. However, the QFN packaging structure in FIGS. 74A and 77B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads and multiple lead rings coupled with passive devices may be formed.

FIG. 75A and FIG. 75B illustrate another exemplary barrel-plating QFN packaging structure. FIG. 75A is a cross-sectional view of FIG. 75B.

As shown in FIG. 75A and FIG. 75B, the QFN packaging structure in FIG. 75A and FIG. 75B is similar to the QFN packaging structure in FIG. 43A and FIG. 43B. However, the QFN packaging structure in FIGS. 75A and 78B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads and multiple lead rings coupled with passive devices may be formed.

FIG. 76A and FIG. 76B illustrate another exemplary barrel-plating QFN packaging structure. FIG. 76A is a cross-sectional view of FIG. 76B.

As shown in FIG. 76A and FIG. 76B, the QFN packaging structure in FIG. 76A and FIG. 76B is similar to the QFN packaging structure in FIG. 44A and FIG. 44B. However, the QFN packaging structure in FIGS. 76A and 79B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads, multiple lead rings, and electrostatic discharge rings may be formed.

FIG. 77A and FIG. 77B illustrate another exemplary barrel-plating QFN packaging structure. FIG. 77A is a cross-sectional view of FIG. 77B.

As shown in FIG. 77A and FIG. 77B, the QFN packaging structure in FIG. 77A and FIG. 77B is similar to the QFN packaging structure in FIG. 45A and FIG. 45B. However, the QFN packaging structure in FIGS. 77A and 80B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads, multiple lead rings, and electrostatic discharge rings may be formed.

FIG. 78A and FIG. 78B illustrate another exemplary barrel-plating QFN packaging structure. FIG. 78A is a cross-sectional view of FIG. 78B.

As shown in FIG. 78A and FIG. 78B, the QFN packaging structure in FIG. 78A and FIG. 78B is similar to the QFN packaging structure in FIG. 46A and FIG. 46B. However, the QFN packaging structure in FIGS. 78A and 71B includes a plurality of outer die pads 1 and a plurality of dies 5. Each of the plurality of dies 5 is attached on the top surface of a corresponding outer die pad 1 by the conductive or non-conductive adhesive material 8. Thus, a QFN packaging structure with multiple die pads, multiple lead rings coupled with passive devices, and electrostatic discharge ring may be formed.

FIG. 79A and FIG. 79B illustrate another exemplary barrel-plating QFN packaging structure. FIG. 79A is a cross-sectional view of FIG. 79B.

As shown in FIG. 79A and FIG. 79B, the QFN packaging structure in FIG. 79A and FIG. 79B is similar to the QFN packaging structure in FIG. 47A and FIG. 47B. However, the QFN packaging structure in FIGS. 79A and 82B includes a plurality of outer die pads 1. Each of the plurality of inner die pads 3 is formed on the top surface of a corresponding outer die pad 1 by the multi-layer plating process. Thus, a QFN packaging structure with multiple outer and inner die pads, multiple lead rings coupled with passive devices, and electrostatic discharge rings may be formed.

By using the disclosed methods, processes, and devices, various advantageous applications may be implemented. For example, using the disclosed processes and devices, separate etching processes on both sides of the metal substrate can be avoided, and the process cost, time, personnel, power, and materials can be reduced. At the same time, the amount of potential environment-harmful substances generated in the etching processes can also be reduced. Further, because of the use of the thin-line plating method on the top surface of the substrate, the minimum width of the inner leads may be approximately 25 µm, and the lead pitch of the inner leads may be as small as approximately 25 µm. Thus, the lead density in the lead frame can be significantly increased. Furthermore, because the I/O pads are etched after the second metal layer is formed by the plating process, the width and/or lead pitch of the I/O pads can also be significantly reduced. For example, the I/O pads may have a pad width of approximately 25 µm, and the lead pitch of the I/O pads may also be approximately 25 µm.

By using the disclosed processes and devices, only lead frame is involved in the die attaching process and wire bonding process. Thus, the lead frame may be tolerant substantially high temperature, such as in a range of approximately 380-420 Celsius degrees, without warping.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing barrel-plating quad flat no-lead (QFN) packaging structure, comprising:
   providing a metal substrate for a plurality of QFN components;
   forming a first photoresist film on a top surface of the metal substrate;
   forming a plating pattern in the first photoresist film using photolithography;
   forming a first metal layer comprising a plurality of inner leads in each one of the plurality of QFN components by a multi-layer electrical plating process using the plating pattern in the first photoresist film as a mask, such that a lead pitch of the plurality of inner leads is significantly reduced;
   attaching at least one die in a predetermined region on the top surface of the metal substrate for each one of the plurality of QFN components;
   connecting the at least one die and the plurality of inner leads using metal wires by a wire bonding process in each one of the plurality of QFN components;
   sealing the at least one die, the plurality of inner leads, and the metal wires in each one of the plurality of QFN components with a molding compound;
   etching a back surface of the metal substrate to form a plurality of I/O pads in each one of the plurality of QFN components corresponding to the plurality of inner leads;
   filling a sealant in etched areas at the back surface of the metal substrate;
   separating the plurality of QFN components into individual QFN components by a package sawing process; and forming a second metal layer on a back surface of I/O pads in the individual QFN components by a barrel plating process.

2. The method of claim 1, wherein
forming the first photoresist film further comprises forming a second photoresist film on the back surface of the metal substrate to protect the metal substrate during the multi-layer electrical plating process; and
forming the first metal layer further comprises removing the first photoresist film and the second photoresist film.

3. The method of claim 1, wherein etching the back surface of the metal substrate further comprises:
forming a third photoresist film on the back surface of the metal substrate;
forming a fourth photoresist film on the top surface of the metal substrate including the encapsulation material to protect the metal substrate from the etching process;
forming an etching pattern in the third photoresist film using photolithography;
etching the metal substrate using the etching pattern in the third photoresist film on the back surface of the metal substrate as a mask; and
removing the third photoresist film and the fourth photoresist film.

4. The method of claim 1, further comprising forming one or more inner die pads on the top surface of the metal substrate corresponding to the predetermined region by the multi-layer electrical plating process, wherein the at least one die is attached to the one or more inner die pads by an adhesive material.

5. The method of claim 1, wherein:
the plurality of I/O pads is arranged in a single-ring configuration; and
the plurality of inner leads is arranged in a corresponding single-ring configuration.

6. The method of claim 1, wherein:
the plurality I/O pads is arranged in a multi-ring configuration; and
the plurality of inner leads is arranged in a corresponding multi-ring configuration.

7. The method of claim 1, further comprising coupling one or more passive devices between the plurality of inner leads by an adhesive material.

8. The method of claim 1, further comprising:
forming an outer electrostatic discharge ring on the metal substrate between the predetermined region and the plurality of I/O pads;
forming an inner electrostatic discharge ring at a top surface of the outer electrostatic discharge ring; and
connecting the inner electrostatic discharge ring and the at least one die.

9. The method of claim 2, wherein attaching the at least one die further comprises:
forming at least one outer die pad in the etching process corresponding to the predetermined area and the at least one die; and
attaching the at least one die on a top surface of the corresponding outer die pad via an adhesive material.

10. The method of claim 5, wherein:
attaching the at least one die further comprises forming at least one outer die pad in the etching process corresponding to the predetermined area and the at least one die; and
an inner die pad is formed a top surface of the corresponding outer die pad in the multi-layer electrical plating process.

11. A barrel-plating quad flat no-lead (QFN) packaging structure, comprising:
a metal substrate;
a first die coupled to a top surface of the metal substrate;
a plurality of I/O pads formed on the metal substrate;
a first metal layer, the first metal layer comprising a plurality of inner leads corresponding to the plurality of I/O pads and extending to a proximity of the first die; and the first metal layer being formed on the metal substrate by a multi-layer electrical plating process such that a lead pitch of the plurality of inner leads is significantly reduced;
metal wires, the metal wires connecting the first die and the plurality of inner leads;
a second metal layer, the second metal layer being formed on a back surface of the plurality of I/O pads by a barrel plating process; and
a sealant, the sealant being filled in peripheral areas of the plurality of I/O pads and areas between the plurality of I/O pads at the back surface of the metal substrate,
wherein
the first die, the plurality of inner leads, and the metal wires are sealed with a molding compound.

12. The barrel-plating QFN packaging structure of claim 11, wherein:
a first outer die pad is formed at a backside of the metal substrate; and
the first die is attached to a top surface of the first outer die pad by an adhesive material.

13. The barrel-plating QFN packaging structure of claim 11, wherein:
an inner die pad is formed by the multi-layer electrical plating process; and
the first die is attached to a top surface of the inner die pad by an adhesive material.

14. The barrel-plating QFN packaging structure of claim 11, wherein:
the plurality of I/O pads is arranged in a single-ring configuration; and
the plurality of inner leads is arranged in a corresponding single-ring configuration.

15. The barrel-plating QFN packaging structure of claim 11, wherein:
the plurality I/O pads is arranged in a multi-ring configuration; and
the plurality of inner leads is arranged in a corresponding multi-ring configuration.

16. The barrel-plating QFN packaging structure of claim 11, further comprising one or more passive devices coupled between leads of the plurality of inner leads by an adhesive material.

17. The barrel-plating QFN packaging structure of claim 12, further comprising:
an outer electrostatic discharge ring formed on the metal substrate between the first outer die pad and the plurality of I/O pads; and
an inner electrostatic discharge ring formed at a top surface of the outer electrostatic discharge ring and being connected to the first die.

18. The barrel-plating QFN packaging structure of claim 12, further comprising:
a second outer die pad formed in a side-by-side configuration with respect to the first outer die pad; and
a second die coupled to a top surface of the second outer die pad,
wherein
the first die and the second die are connected with a metal wire.

* * * * *